(12) United States Patent
Hirota

(10) Patent No.: US 8,698,932 B2
(45) Date of Patent: Apr. 15, 2014

(54) SOLID-STATE IMAGE PICKUP APPARATUS AND CAMERA

(75) Inventor: Isao Hirota, Kanagawa (JP)

(73) Assignee: Sony Corporation (JP)

( * ) Notice: Subject to any disclaimer, the term of this patent is extended or adjusted under 35 U.S.C. 154(b) by 291 days.

(21) Appl. No.: 13/378,101

(22) PCT Filed: Jun. 4, 2010

(86) PCT No.: PCT/JP2010/059537
§ 371 (c)(1),
(2), (4) Date: Dec. 14, 2011

(87) PCT Pub. No.: WO2010/150638
PCT Pub. Date: Dec. 29, 2010

(65) Prior Publication Data
US 2012/0092536 A1    Apr. 19, 2012

(30) Foreign Application Priority Data
Jun. 22, 2009  (JP) .................. 2009-148120

(51) Int. Cl.
*H04N 5/335* (2011.01)
(52) U.S. Cl.
USPC ........................................ 348/308
(58) Field of Classification Search
USPC ......... 348/294, 296, 300, 302, 308, 309, 310, 348/332; 250/208.1; 257/431, 440, 443, 257/447, 448
See application file for complete search history.

(56) References Cited

U.S. PATENT DOCUMENTS

| 4,453,177 A * | 6/1984 | Berger et al. .................. 348/282 |
| 6,674,094 B2 * | 1/2004 | Sekine ............................. 257/72 |
| 6,867,806 B1 * | 3/2005 | Lee et al. ....................... 348/308 |
| 8,106,983 B2 * | 1/2012 | Hirota et al. .................. 348/308 |
| 2008/0290382 A1 | 11/2008 | Hirota |
| 2009/0153708 A1 | 6/2009 | Hirota et al. |

FOREIGN PATENT DOCUMENTS

| JP | 60-140752 | 7/1985 |
| JP | 64-014959 | 1/1989 |
| JP | 02-304973 | 12/1990 |
| JP | 06-120473 | 4/1994 |
| JP | 2692218 | 9/1997 |
| JP | 2005-244434 | 9/2005 |
| JP | 375773 | 12/2005 |
| JP | 2008-294175 | 12/2008 |
| JP | 6-66446 | 12/2011 |

OTHER PUBLICATIONS

International Search Report dated Jun. 29, 2010.

* cited by examiner

*Primary Examiner* — Aung S Moe
*Assistant Examiner* — Chriss Yoder, III
(74) *Attorney, Agent, or Firm* — Sheridan Ross P.C.

(57) ABSTRACT

A solid-state image pickup apparatus supplies power during a driving for a signal read via a pixel transistor that is adjacent in a Y direction (vertically). In the solid-state image pickup apparatus, for resetting, a drive pulse RsrD is supplied on a drain line connected in the horizontal direction.

19 Claims, 42 Drawing Sheets

FIG. 2
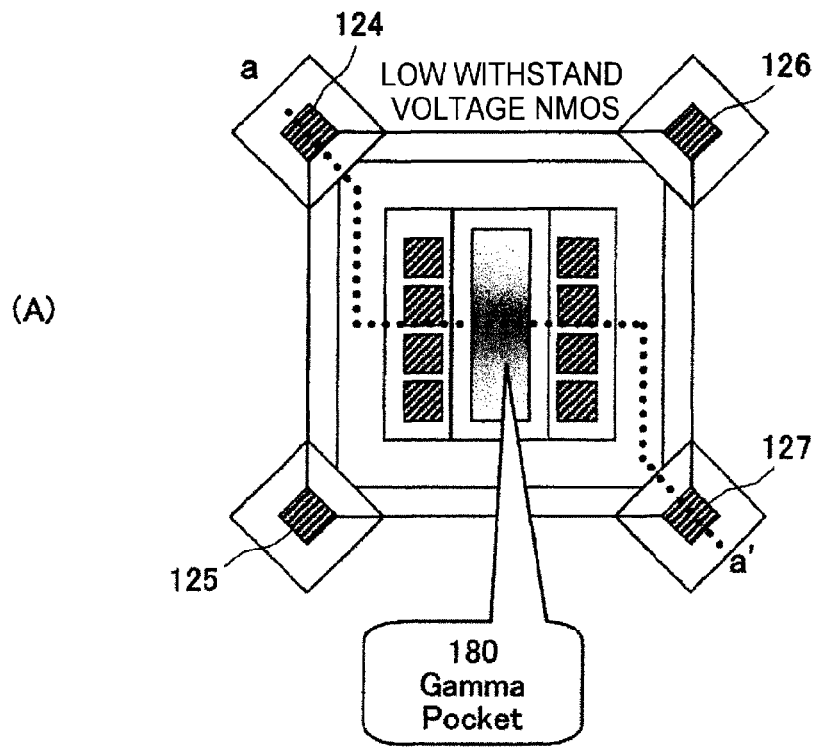
(A)
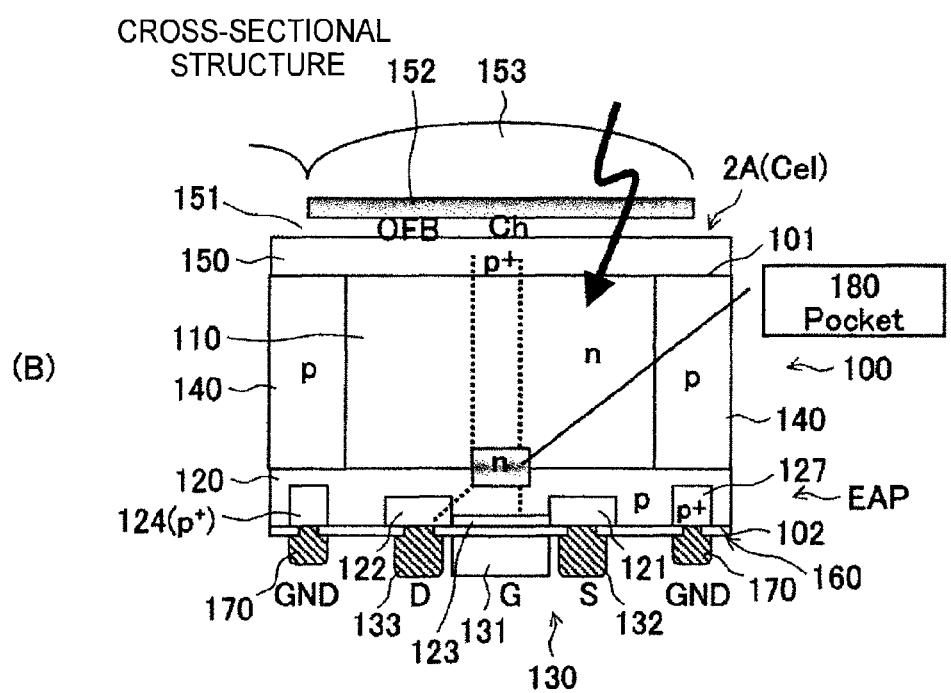
(B)

FIG. 6
Potential Diagram
(Open Source)
■ OVERDRIVE
VGND=0V
VG=1.8V
VD=1.8V
VS=1.8V
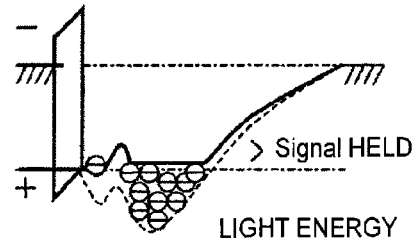
■ GATE READ
VGND=0V
VG=1.0V、
VD=1.8V
VS≒1.6〜1.4V
Output
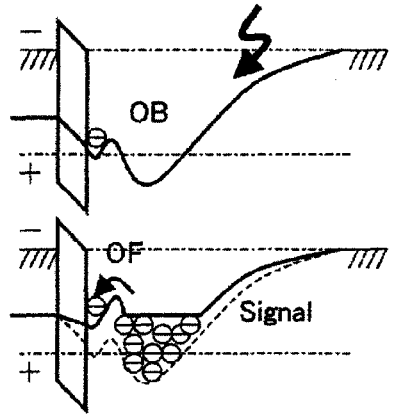
■ GATE ACCUMULATION
(NO SELECTIVE READ)
VGND=0V
VG=0V、
VD=1.8V
VS≦1.2V
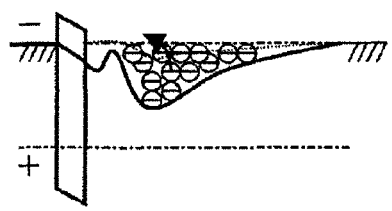
■ GATE ACCUMULATION
(NO RESET)
VGND=0V
VG=0〜-1.0V、
VD=1.8V
VS=Hi-Z or LD
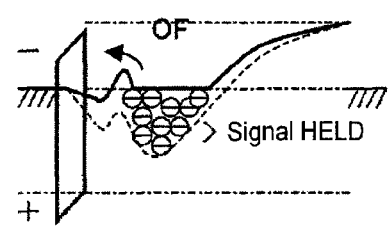
■ LINE RESET
VGND=0V
VG=0〜-1.0V、
VD=3.0V以上
VS=Hi-Z or LD
VD
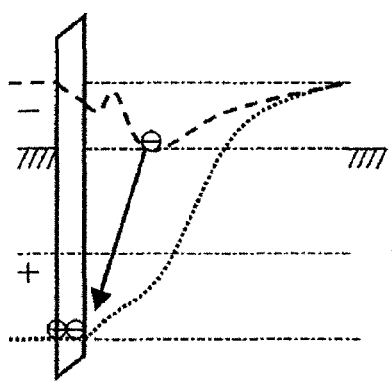

FIG. 13
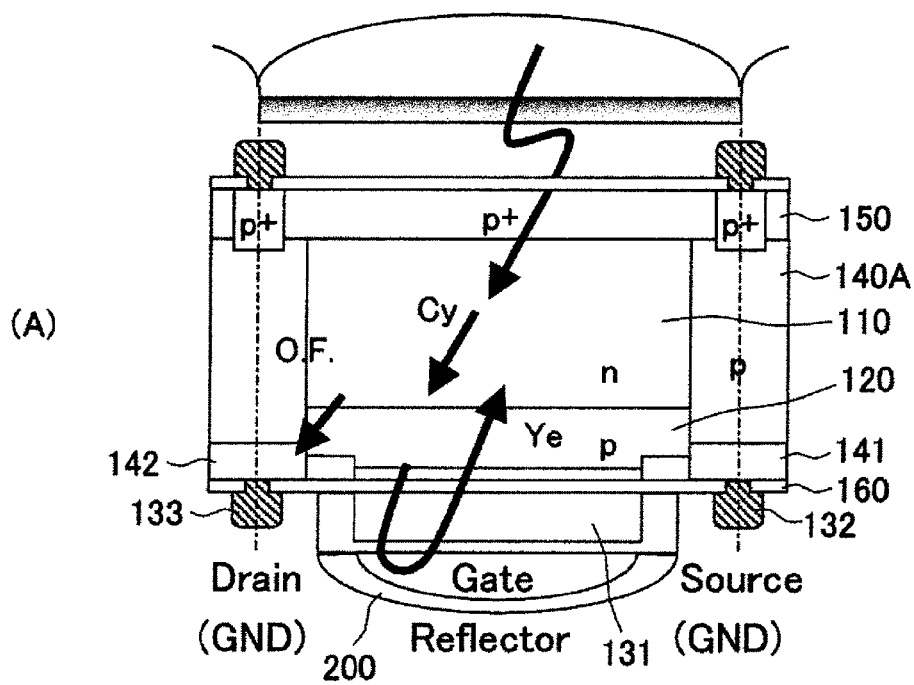
(A)
SAME STRUCTURE CAN SERVE AS COLOR-MIXING PREVENTION LIGHT BLOCKING FILM AND WIRING
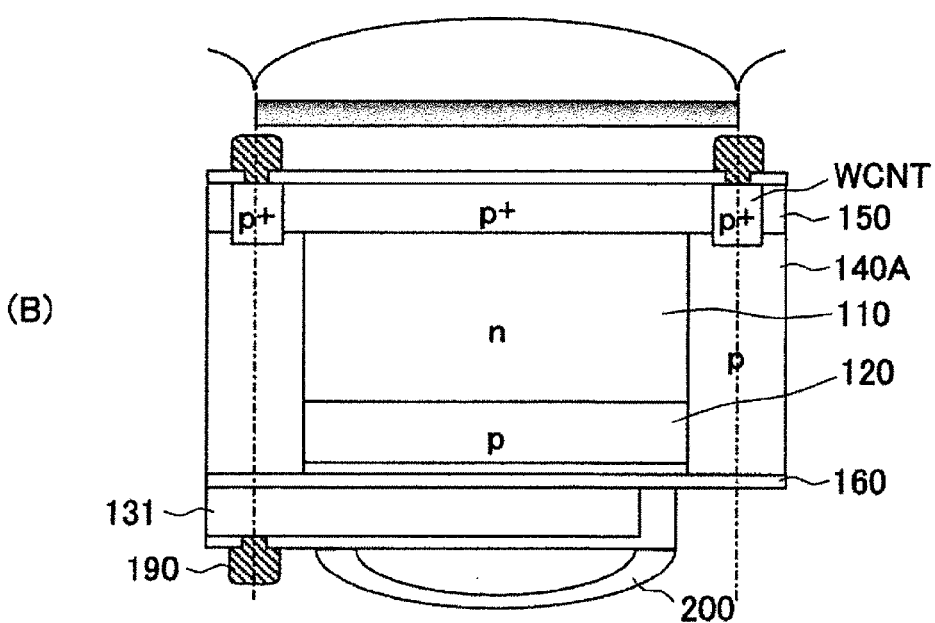
(B)

FIG. 14
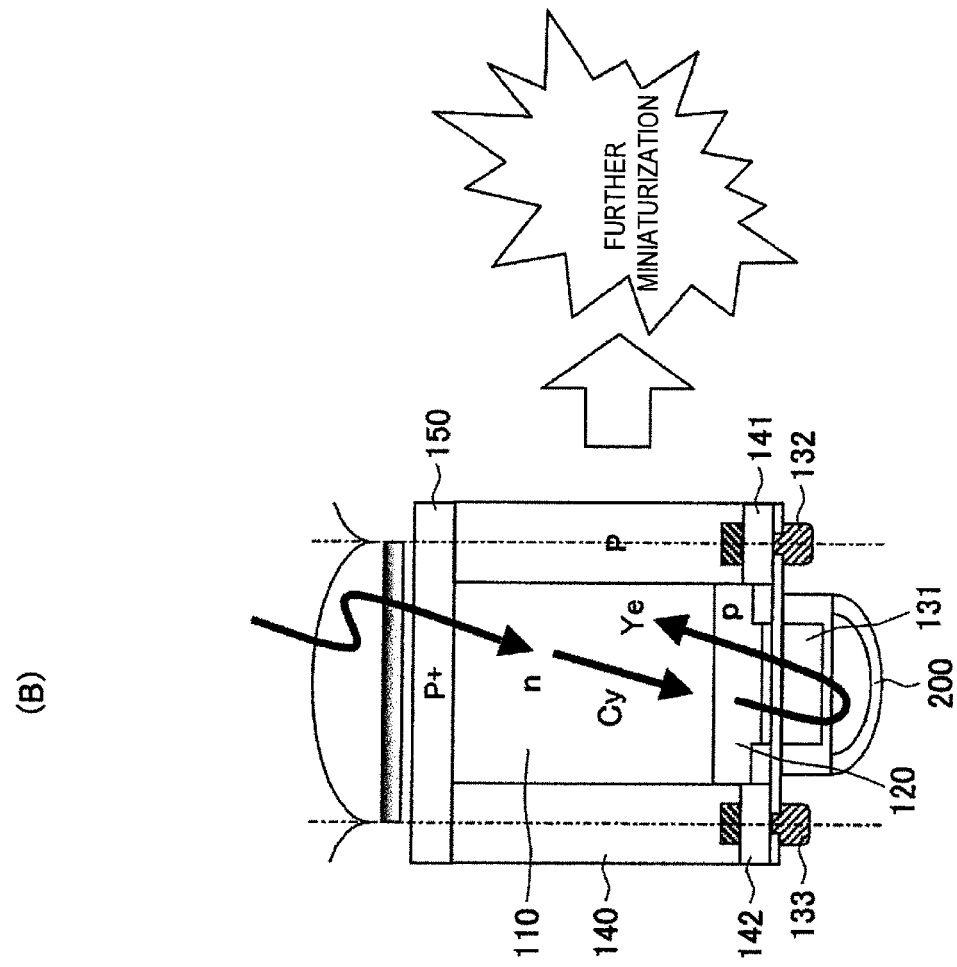
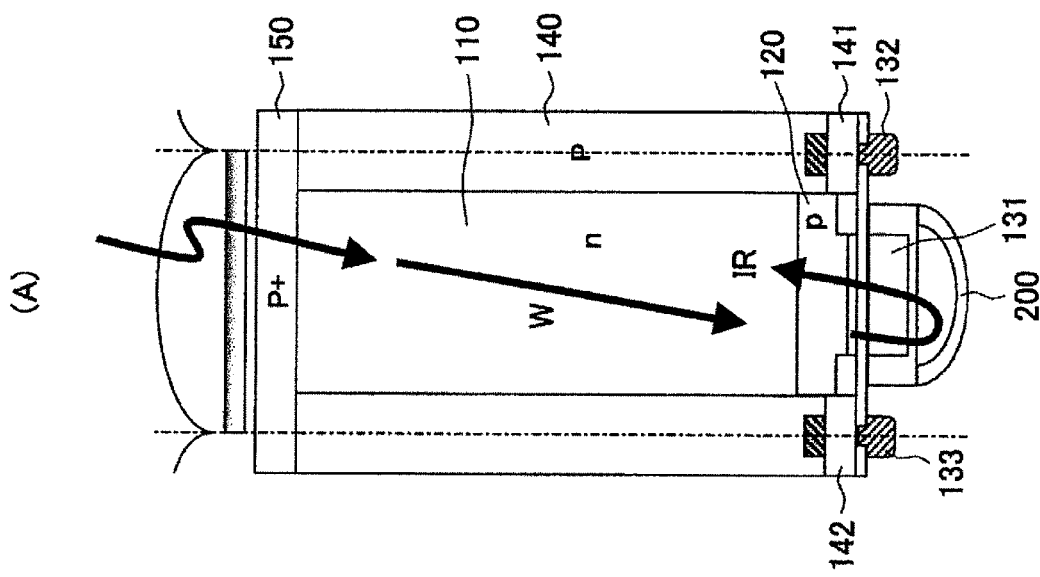

SIGNAL WIRING#2

FIG. 32
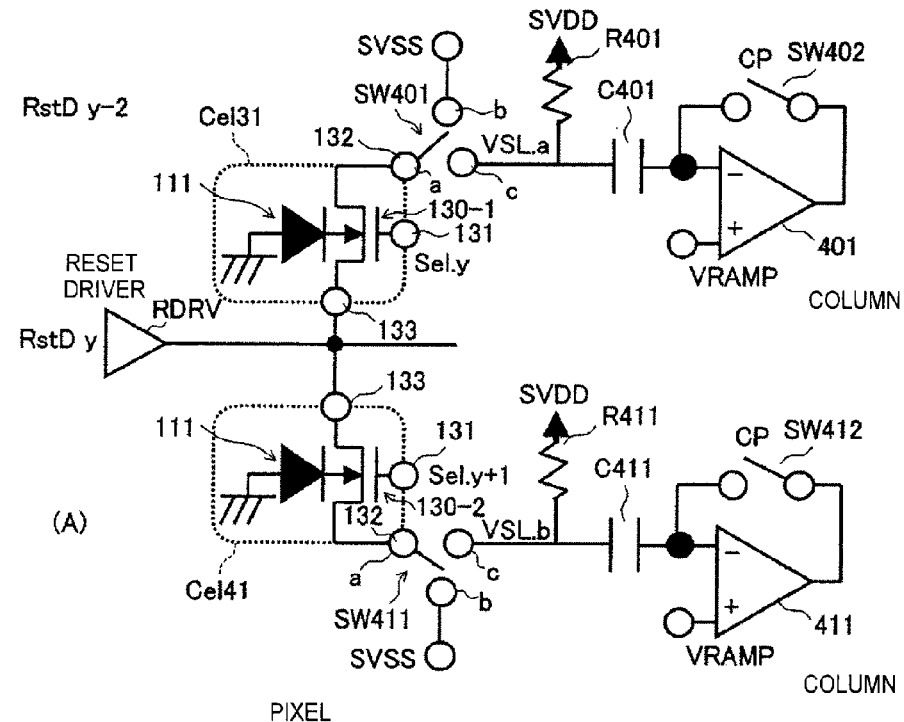
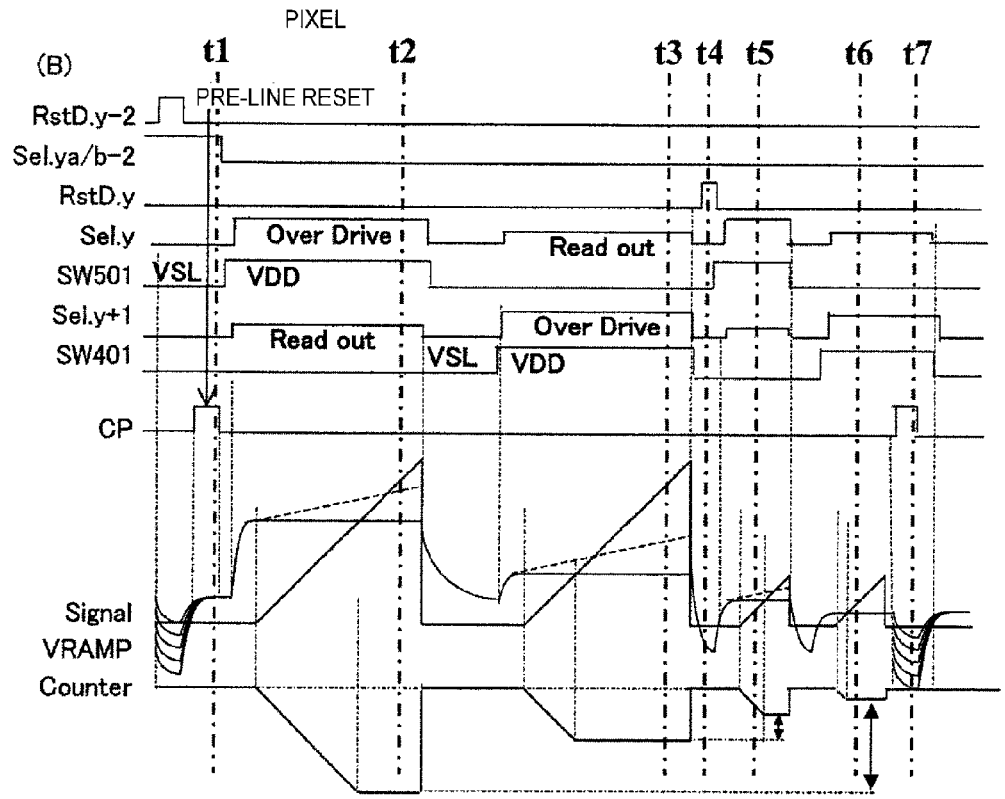

FIG. 33
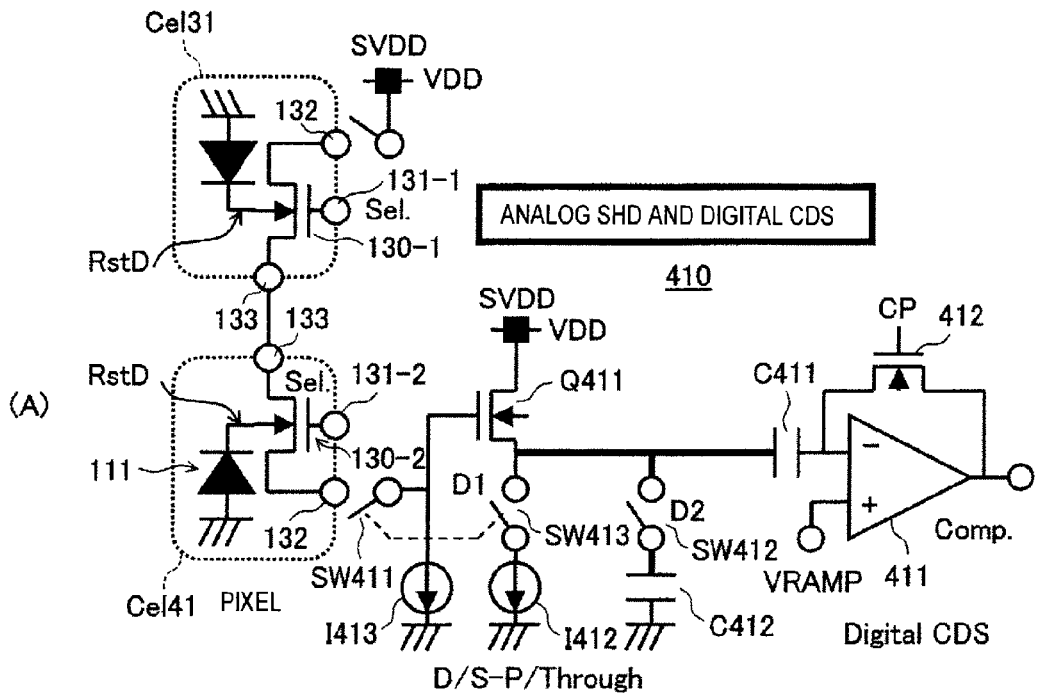
(A)
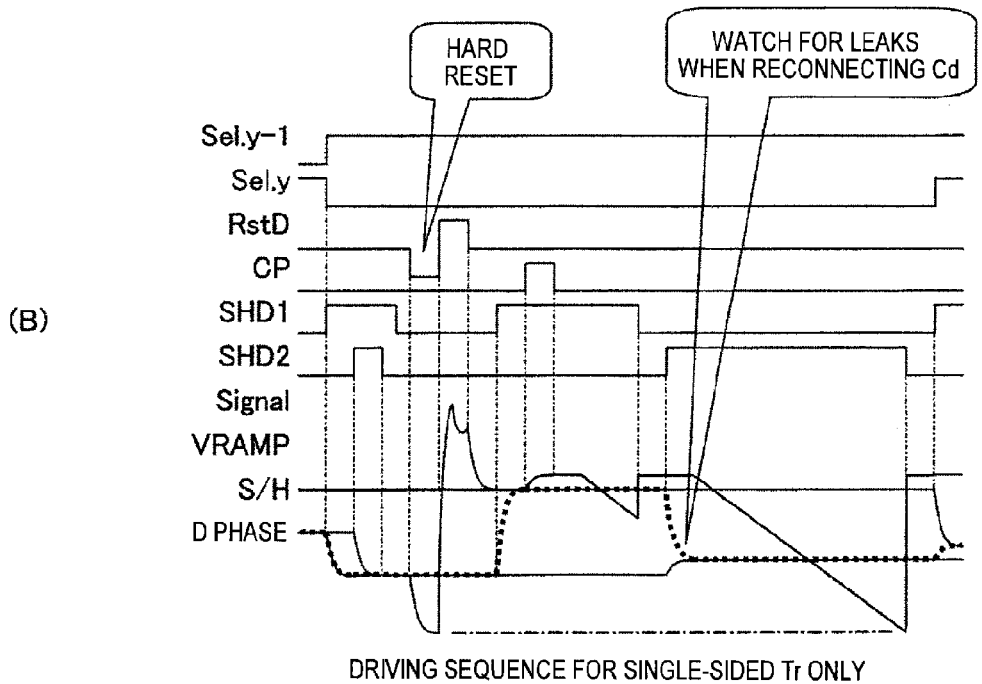
(B)
DRIVING SEQUENCE FOR SINGLE-SIDED Tr ONLY (A) OPERATION CIRCUIT DIAGRAM (B) ■ OPERATION SEQUENCE

DRIVE TIMING

FIG. 38
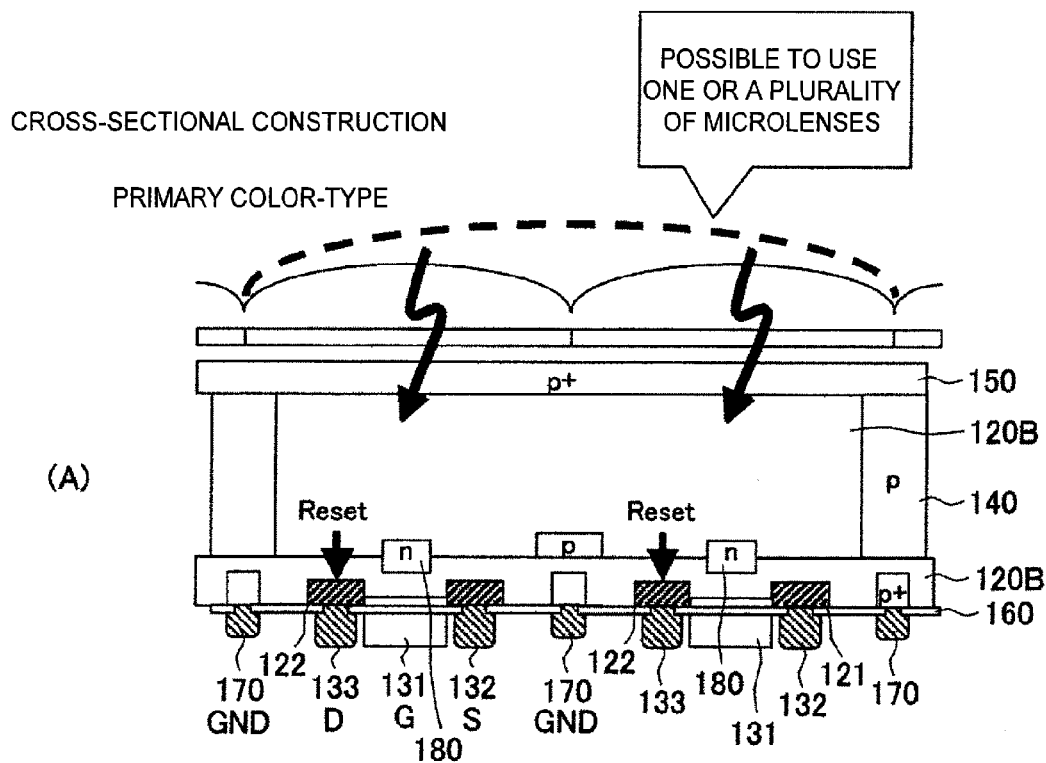
(A) CROSS-SECTIONAL CONSTRUCTION
PRIMARY COLOR-TYPE
POSSIBLE TO USE ONE OR A PLURALITY OF MICROLENSES
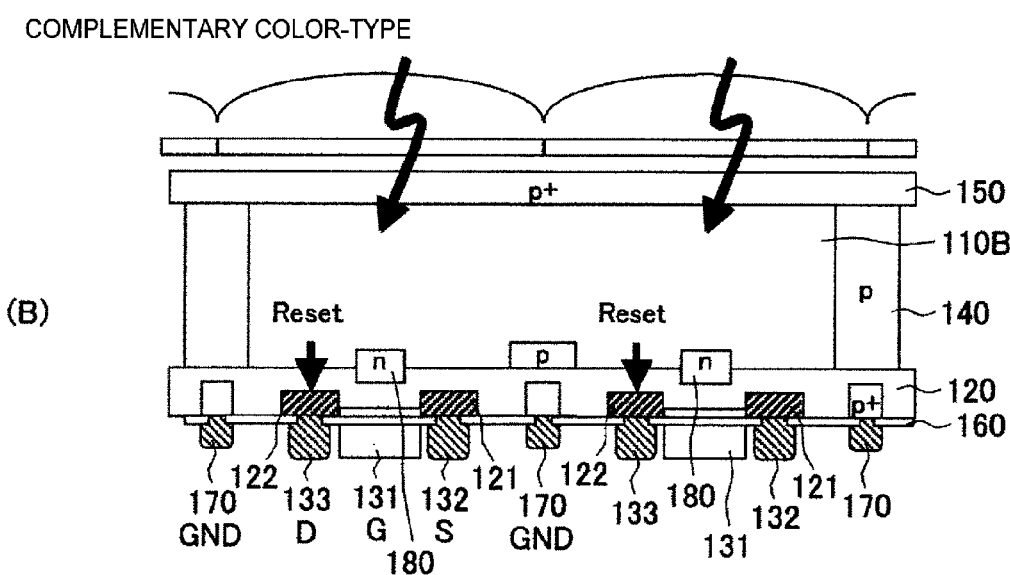
(B) COMPLEMENTARY COLOR-TYPE FIG. 40
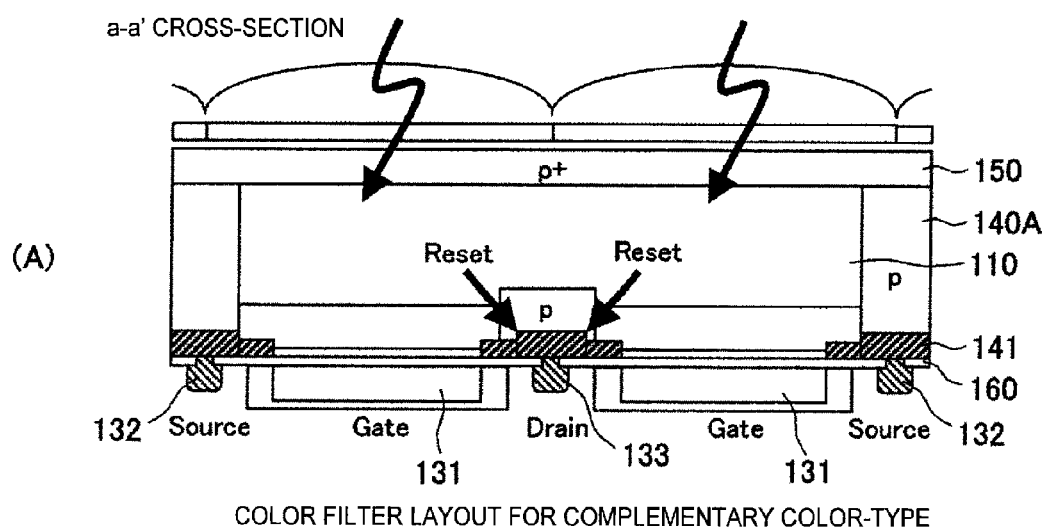
(A) a-a' CROSS-SECTION
COLOR FILTER LAYOUT FOR COMPLEMENTARY COLOR-TYPE
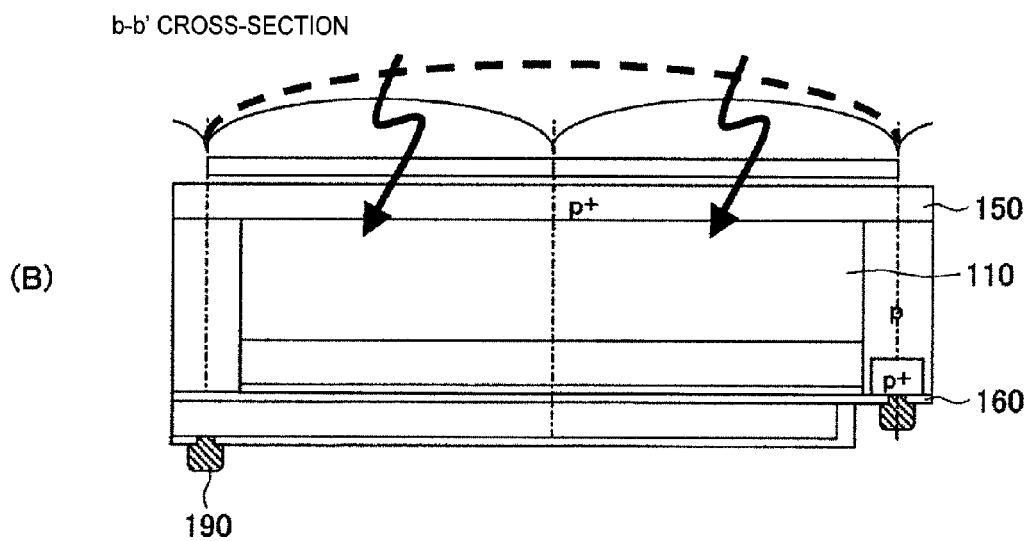
(B) b-b' CROSS-SECTION

500

SOLID-STATE IMAGE PICKUP APPARATUS AND CAMERA

TECHNICAL FIELD

The present invention relates to a solid-state image pickup apparatus and a camera with a photoelectric conversion element.

BACKGROUND ART

It is known that in solid-state image pickup apparatuses, for example, CCD image sensors and CMOS image sensors, crystal defects in a photodiode that is a photoelectric conversion element of a light receiving unit and the interface state density at the interface between the light receiving unit and an insulating film thereupon are sources of dark current.

Out of such, an embedded photodiode construction is effective as a method of suppressing generation of dark current caused by the interface state density.

An embedded photodiode is configured for example by forming an n type semiconductor region and forming a p type semiconductor region (hole accumulation region) for suppressing dark current that is shallow and has a high concentration of dopant on the surface of such n type semiconductor region, that is, near the interface with an insulating film.

As the method of fabricating such embedded photodiode, it is typical to carry out ion implantation of B or $BF_2$ as a p type dopant and then an annealing process to fabricate a p-type semiconductor region near the interface between the n type semiconductor region that constructs the photodiode and the insulating film.

Also, in a CMOS image sensor, the respective pixels are formed so as to include a photodiode and various transistors such as read, reset and amplifier transistors. A signal that has been photoelectrically converted by the photodiode is processed by such transistors. A wiring layer including metal wires on multiple layers is formed on top of the respective pixels. A color filter that restricts the wavelength of light incident on the photodiode and/or an onchip lens that focuses light on the photodiode are formed above the wiring layer.

Device constructions with a variety of characteristics have been proposed as CMOS image sensors.

More specifically, CMD (Charge Modulation Devices; see Patent Literature 1, 2, and 3) that use CCD-like features in their photoelectric conversion element constructions and BCDM (Bulk Charge Modulation Devices; see Patent Literature 4) have been proposed.

In addition, FWA (Floating Well Amplifiers; see Patent Literature 5 and 6) have been proposed. With a FWA, a channel is formed in the surface in accordance with the amount of charge of photoholes accumulated to local maxima, with the source-drain current changing according to the amount of charge at the surface, resulting in the ability to read in accordance with the signal charge.

In addition, a variety of devices have been proposed, such as a threshold modulation image sensor (VMIS: $V^{th}$ Modulation Image Sensor, see Patent Literature 7, 8, 9, and 10) where the light receiving unit and the signal detecting unit are split and disposed adjacently.

Also, the solid-state image pickup element described below was proposed in Patent Literature 11.

This solid-state image pickup element includes a light receiving element that functions so as to carry out photoelectric conversion of incident light, accumulate the signal charge obtained by such photoelectric conversion, and output a signal voltage in accordance with the amount of accumulated signal charge. This light receiving element has a potential distribution whereby it is easy for signal charge to accumulate at the same position when viewed as a plane and flow of a surface channel current is facilitated.

Such CMOS image sensors are frontside illumination solid state image pickup apparatuses where light is fundamentally incident from the front side of the device.

On the other hand, a backside (rear surface) illumination solid state image pickup apparatus that is made thinner by grinding the back side of a silicon substrate on which photodiodes and a variety of transistors have been formed and carries out photoelectric conversion of light incident from the back side of the substrate has been proposed (see Patent Literature 12).

CITATION LIST

Patent Literature

Patent Literature 1: JP 1938092B
Patent Literature 2: JP H6-120473A
Patent Literature 3: JP S60-140752A
Patent Literature 4: JP S64-14959A
Patent Literature 5: JP 2692218B
Patent Literature 6: JP 3752773B
Patent Literature 7: JP H2-304973A
Patent Literature 8: JP 2005-244434A
Patent Literature 9: JP 2935492B
Patent Literature 10: JP 2005-85999A
Patent Literature 11: JP 2003-31785A
Patent Literature 12: JP H10-65138A

SUMMARY OF INVENTION

Technical Problem

However, with the frontside illumination CMD and BCMD, FWA, VMIS, and the like described above, since the substrate is used as an overflow, backside (rear surface) illumination is not possible and the reset voltage is high.

With frontside illumination CMD and BCMD, FWA, VMIS, and the like, since the light receiving unit is disposed beside a pickup transistor, there is the disadvantage of a drop in numerical aperture.

In addition, with existing photogate constructions, since light is received through a thin-film gate, there is the disadvantage of a drop in blue sensitivity.

Also, for a case, such as a BCMD, where frontside illumination is used and a photogate MOS transistor is formed on an $n^-$ layer, carrier generation due to irradiation with light occurs near the semiconductor surface. This means that carriers are captured at the trap present at the semiconductor-insulating film interface, and such accumulated carriers are not quickly discharged even when a reset voltage is applied, which is disadvantageous in that it affects the device characteristics.

Also, for a case, such as a VMIS, where frontside illumination is used and a light receiving photodiode region and a signal detection transistor are adjacently disposed, the accumulation of charge generated by reception of light and the modulation operation are not dynamic operations and on a time scale are carried out at separate times, which is disadvantageous for high speed processing.

In the same way, for a case where frontside illumination is used and a light receiving photodiode region and a signal detection transistor are adjacently disposed, a modification such as providing a light blocking film above the signal detection unit is necessary, which is disadvantageous in that the element manufacturing process becomes complex.

Also with a frontside illumination BCMD image sensor, the entire channel region below the photogate electrode is a charge accumulation region. This means that with a frontside illumination BCMD image sensor, the current-voltage characteristic (ID-VDD) is not a saturation characteristic and is instead a triode characteristic, which in source-follower usage has the disadvantage of being difficult to use.

In addition, with the frontside illumination CMOS image sensor described above, there is the disadvantage that light is blocked by wires above the pixels, reducing the sensitivity of each pixel, and if light reflected by such wires becomes incident on adjacent pixel cells, this causes color mixing and the like.

The solid-state image pickup element disclosed in Patent Literature 11 uses a dual layer gate construction to realize one transistor with a single well, but requires special precise work in the element separation region, which is disadvantageous in that the element manufacturing process becomes complex.

Also, since such solid-state image pickup element still uses frontside illumination, there are the problems described above with frontside illumination such as a drop in blue sensitivity and color mixing.

In the backside illumination solid-state image pickup apparatus disclosed in Patent Literature 12, hole accumulation regions are formed on the front surface side and the back surface side of a substrate, but there are limits for the formation of a shallow but strong p type semiconductor region by ion implantation.

This means that if the dopant concentration of a p type semiconductor region is to be raised further to suppress dark current, the p type semiconductor region will become deeper. If the p type semiconductor region becomes deeper, the pn junction of the photodiode will become distant from the transfer gate, resulting in the risk of a drop in read performance via the transfer gate.

The present invention provides a solid-state image pickup apparatus and a camera which are capable of efficiently and rapidly performing a series of operations composed of generation and accumulation of photocarriers, reading of charge, and expulsion of residual charge (resetting), which do not suffer from deterioration in sensitivity for blue light, prevent carriers produced by light from being trapped at silicon interfaces, and allow higher sensitivity and pixel miniaturization, while also achieving sufficient drive performance.

Solution to Problem

According to the first aspect of the present invention, there is provided a solid-state image pickup apparatus including: a pixel unit which is formed on a substrate having a first substrate surface side on which light is incident and a second substrate surface side on which elements are formed and in which a plurality of pixel cells, which are separated by an element separation layer from adjacent pixel groups that have one pixel cell or a plurality of pixel cells as units, are disposed in a matrix; a plurality of first driving lines disposed corresponding to row arrays of the pixel cells; a second driving line that is shared between pixel cells on two adjacent rows; a signal line disposed corresponding to a column array of the pixel cells and divided into a first signal line and a second signal line; a signal read processing system processing a read signal of the pixel cells that have been read on the signal line; and a switching unit connecting the first signal line and the second signal line to a power source or the signal read processing system, wherein the pixel cells receive light from the first substrate surface side, include a photoelectric conversion function for the received light and a charge accumulation function, and have a transistor that detects accumulated charge by way of the charge accumulation function and has a threshold modulation function formed therein, the transistor includes a function as a read transistor, a function as a reset transistor, and a function as a select transistor, and has a source, a drain, and a gate electrode formed on a channel forming region between the source and the drain, the drain or the source is shared between two pixel cells that are adjacent in the row direction of the pixel cells, the source or the drain of one of the pixel cells is connected to the first signal line, and the source or the drain of another of the pixel cells is connected to the second signal line, the gate electrodes of the transistors of the pixel cells connected to the corresponding first driving lines, and the shared drain or source of two pixel cells that are adjacent in the row direction is connected to a corresponding second driving line.

According to the second aspect of the present invention, there is provided a camera including: a solid-state image pickup apparatus receiving light from a first substrate surface side of a substrate; an optical system guiding incident light onto the first substrate surface side of the solid-state image pickup apparatus; and a signal processing circuit processing an output signal of the solid-state image pickup apparatus, wherein the solid-state image pickup apparatus includes: a pixel unit which is formed on the substrate having the first substrate surface side on which light is incident and a second substrate surface side on which elements are formed and in which a plurality of pixel cells, which are separated by an element separation layer from adjacent pixel groups that have one pixel cell or a plurality of pixel cells as units, are disposed in a matrix; a plurality of first driving lines disposed corresponding to row arrays of the pixel cells; a second driving line that is shared between pixel cells on two adjacent rows; a signal line disposed corresponding to a column array of the pixel cells and divided into a first signal line and a second signal line; a signal read processing system processing a read signal of the pixel cells that have been read on the signal line; and a switching unit connecting the first signal line and the second signal line to a power source or the signal read processing system, wherein the pixel cells receive light from the first substrate surface side, include a photoelectric conversion function for the received light and a charge accumulation function, and have a transistor that detects accumulated charge by way of the charge accumulation function and has a threshold modulation function formed therein, the transistor includes a function as a read transistor, a function as a reset transistor, and a function as a select transistor, and has a source, a drain, and a gate electrode formed on a channel forming region between the source and the drain, the drain or the source is shared between two pixel cells that are adjacent in the row direction of the pixel cells, the source or the drain of one of the pixel cells is connected to the first signal line, and the source or the drain of another of the pixel cells is connected to the second signal line, the gate electrodes of the transistors of the pixel cells connected to the corresponding first driving lines, and the shared drain or source of two pixel cells that are adjacent in the row direction is connected to a corresponding second driving line.

Advantageous Effects of Invention

According to the present invention, it is possible to efficiently and rapidly perform a series of operations composed of generation and accumulation of photocarriers, reading of charge, and expulsion of residual charge (resetting).

Also, there is no deterioration in sensitivity for blue light, the effects of carriers produced by light that are trapped at silicon interfaces are prevented, and higher sensitivity and pixel miniaturization are possible.

It is also possible to prevent the driving performance from becoming insufficient when the number of pixels is increased, and obtain a sufficient driving performance.

BRIEF DESCRIPTION OF DRAWINGS

FIG. 2 is a diagram showing the fundamental construction of a pixel unit of the solid-state image pickup apparatus according to the embodiment.

FIG. 6 is a diagram showing changes in potential relative to electrons inside a semiconductor substrate in a direction perpendicular to a semiconductor substrate surface in various regions that accompany changes in a potential state of the apparatus shown in FIG. 2.

FIG. 13 is simplified cross-sectional views along a line a-a' and a line b-b' in FIG. 12.

FIG. 14 is a diagram showing an example where a reflector is provided on pixel cells of different film thicknesses.

FIG. 32 is a diagram showing the fundamental concept of a pre-line set in the case of a source-grounded configuration.

FIG. 33 is a diagram schematically showing a signal processing system compatible with a hard reset function according to the present embodiment.

FIG. 38 is a cross-sectional view showing an example configuration where a plurality of pixels are disposed in an array and the element is separated in units of a plurality of pixels to produce one output signal.

FIG. 40 is simplified cross-sectional views along a line a-a' and a line b-b' in FIG. 37.

DESCRIPTION OF EMBODIMENTS

Hereinafter, preferred embodiments of the present invention will be described in detail with reference to the appended drawings.

Note that the following description is given in the order indicated below.
1. Overall Configuration of Solid-State Image Pickup Apparatus
2. Device Construction
3. Reflector Configuration
4. Example Pixel Cell Array of Shared Contact Pixel Unit
5. Camera.

1. Overall Configuration of Solid-State Image Pickup Apparatus

Figure 1:
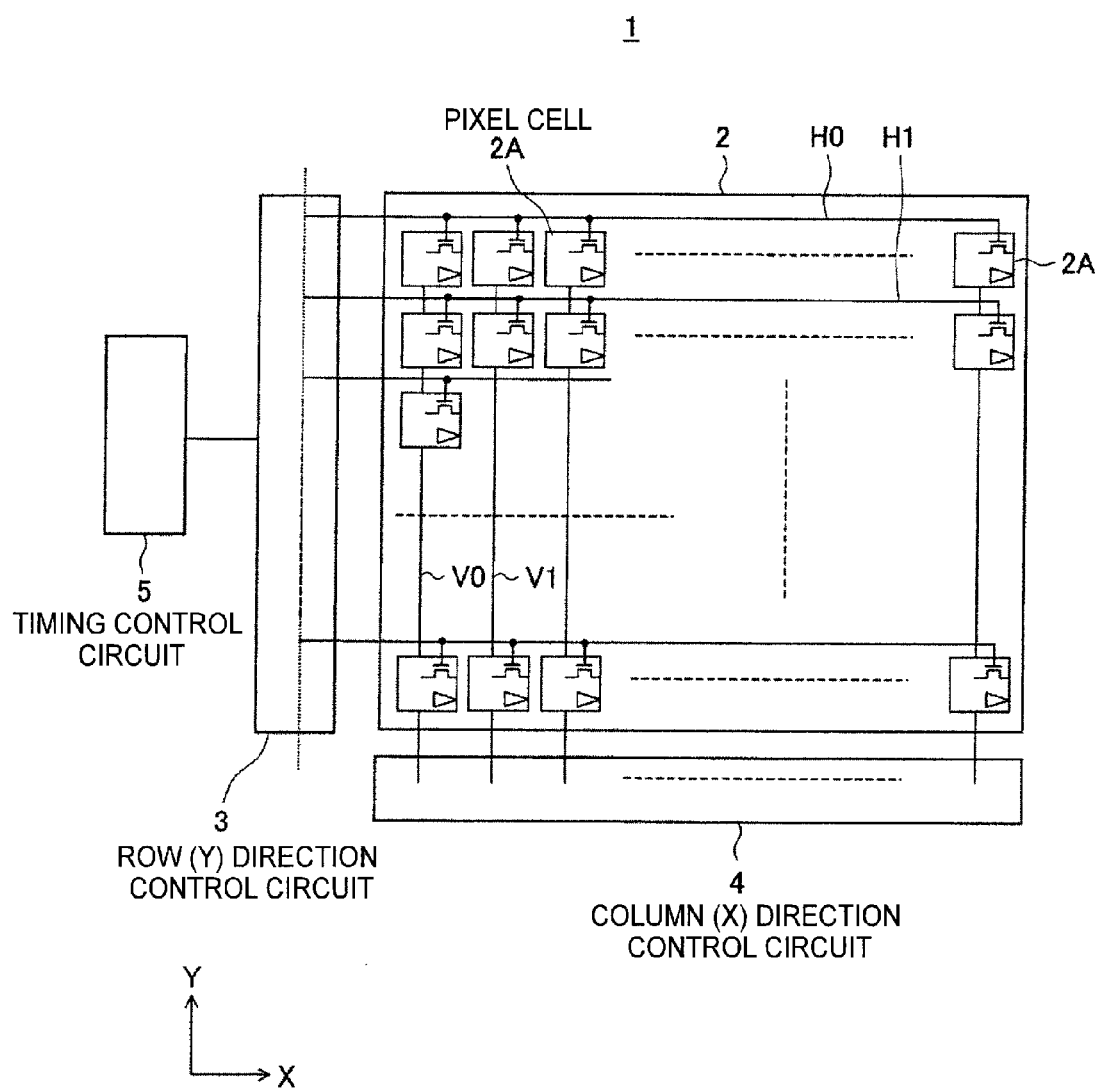
FIG. 1 is a block diagram showing the overall configuration of a solid-state image pickup apparatus according to a present embodiment.

FIG. 1 is a block diagram showing the overall configuration of a solid-state image pickup apparatus according to the present embodiment.

As shown in FIG. 1, the present solid-state image pickup apparatus 1 includes a pixel unit 2 as a sensing unit, a row direction (Y direction) control circuit 3, a column direction (X direction) control circuit 4, and a timing control circuit 5.

As described in detail later, the pixel unit 2 has a plurality of pixel cells 2A disposed for example in a matrix (i.e., in rows and columns).

The pixel cells 2A of the pixel unit 2 according to the present embodiment are configured as a threshold modulation (CMD) image sensor that uses backside (rear surface) illumination and has a double-well construction.

The pixel unit 2 according to the present embodiment uses a double well construction, and the accumulated charge and the channel current are the same carriers.

The pixel unit 2 has a single-transistor architecture (construction) where the functions of a read transistor, a reset transistor, and a selection transistor share a single transistor.

In addition, in the pixel unit 2, in the pixel array, the pixel cells 2A laid out on the same row are connected to a shared row line H0, H1, ... and the pixel cells 2A laid out in the same column are connected to a shared column line V0, V1, ....

In the solid-state image pickup apparatus 1, to successively read the signals of the pixel unit 2, the timing control circuit 5 that generates an internal clock, the row direction (Y direction) control circuit 3 that controls row addresses and row scanning, and the column direction (X direction) control circuit 4 that controls column addresses and column scanning) are disposed.

The row direction (Y direction) control circuit 3 receives timing control pulses of the timing control circuit 5 and drives a specified row line H0, H1, ....

The column direction (X direction) control circuit 4 receives timing control pulses of the timing control circuit 5, receives a signal read out to a specified column line V0, V1, ..., and carries out specified processing.

The specified processing referred to here includes a CDS (Correlated Double Sampling) process, an analog-digital conversion process, and the like.

The configuration and functions related to the signal read process from the pixel cells 2A by the column direction (X direction) control circuit 4 will be described in detail later.

2. Device Construction

A specific device construction of the pixel unit of the solid-state image pickup apparatus according to the present embodiment will now be described.

FIGS. 2(A) and 2(B) are views showing the fundamental construction of the pixel unit of the solid-state image pickup apparatus according to the present embodiment, with FIG. 2(A) being a plan view and FIG. 2(B) being a simplified cross-sectional view along a line a-a' in FIG. 2(A).

As shown in FIG. 2, the solid-state image pickup apparatus 1 is formed as a backside (rear surface) illumination device where light is incident from a first substrate surface 101 side (backside) of a substrate 100 and an element region portion (EAP) where MOS-type transistors are formed is formed on a second substrate surface 102 side (front side). The substrate 100 is formed by a silicon substrate.

To allow irradiation with light from the back side, the substrate 100 is formed by making a silicon wafer into a thin film. The thickness of the substrate 100 depends on the type of solid-state image pickup apparatus 1, but as examples is 2 to 6 μm for a visible light device and 6 to 10 μm for a near infrared light device In this way, the substrate 100 has a first substrate surface 101 side where light is incident and a second substrate surface 102 side where elements are formed, and has a plurality of the pixel cells Cel (2A) formed so as to be separated from adjacent cells by an element separation layer.

In the present embodiment, the substrate 100 has the plurality of pixel cells 2A (Cel) separated by the element separation layer from adjacent pixel groups in units of single pixel cells or a plurality of pixel cells.

Each pixel cell Cel includes a first conductivity-type well (hereinafter simply "first well") 110 formed on the first substrate surface 101 side and a second conductivity-type well (hereinafter simply "second well") 120 formed closer to the second substrate surface 102 side than the first well 110.

In the present embodiment, the first conductivity type is n type and the second conductivity type is p type.

The n type first well 110 functions as a light receiving unit that receives light from the first substrate surface 101 side and also has a photoelectric conversion function and a charge accumulation function for the received light.

In the second well 120, a MOS-type transistor 130 that detects the accumulated charge at the light receiving unit of the first well 110 and has a threshold modulation function is formed.

A p type element separation layer (conductive layer) 140 that is the second conductivity type which is opposite to the first conductivity type (in the present embodiment, n type) is formed at the side walls of the first well 110 so as to surround them and a p$^+$ layer 150 is formed at the first substrate surface 101 that is the incident surface of the substrate 100.

An insulating film and/or a protective film 151 made of silicon oxide, for example, is/are formed on the incident surface side of the p$^+$ layer 150. A color filter 152 that transmits only light of a desired wavelength region is formed above the protective film 151. Also, a microlens 153 that focuses the incident light onto the light receiving unit of the first well 110 is formed above the color filter 152.

A source region 121 and a drain region 122 that are composed of an n$^+$ layer are formed a specified gap apart in a central portion of the p-type second well 120. A channel forming region 123 is formed between the source region 121 and the drain region 122.

Well (substrate) contact regions 124, 125, 126, and 127 composed of a p+ layer are formed at regions (end portion side regions) of the second well 120 that do not coincide with the first well 110.

In addition, an insulating film 160 of silicon oxide or the like is selectively formed by a specified process on the surface of the second substrate surface 102 of the substrate 100 where the source region 121, the drain region 122, and the well contact regions 124 to 127 are formed.

Also, on the second substrate surface 102 side of the substrate 100, a gate electrode 131 of a transistor 130 is formed above the channel forming region 123 between the source region 121 and the drain region 122 with the insulating film 160 in between.

An opening is formed in part of the insulating film 160 above the source region 121 and a source electrode 132 of the transistor 130 that is connected to the source region 121 is formed.

In the same way, an opening is formed in part of the insulating film 160 above the drain region 122 and a drain electrode 133 of the transistor 130 that is connected to the drain region 122 is formed.

In addition, openings are formed in parts of the insulating film above the well contact regions 124 to 127 to form well contact electrodes 170 that are connected to the well contact regions 124 to 127. For example, the level of the well contact electrodes 170 is set at ground potential GND (0V) or −1.2V or the like.

With the configuration described above, the transistor 130 is formed as an insulated gate-type field effect transistor (referred to as a MOS transistor).

The transistor 130 includes the source region 121, the drain region 122, and the channel forming region 123 formed in the second well 120 on the second substrate surface 102 side and the gate electrode 131, the source electrode 132, and the drain electrode 133 that are formed on the surface side of the second substrate surface 102.

Note that in FIG. 2, "S" indicates the source of the transistor 130, "D" indicates the drain of the transistor 130, and "G" indicates the gate of the transistor 130, respectively.

In this way, the respective pixel cells Cel (2A) of the present embodiment are configured as threshold modulation (CMD) type image sensors that use backside (rear surface) illumination and have a double well construction.

Figure 3:
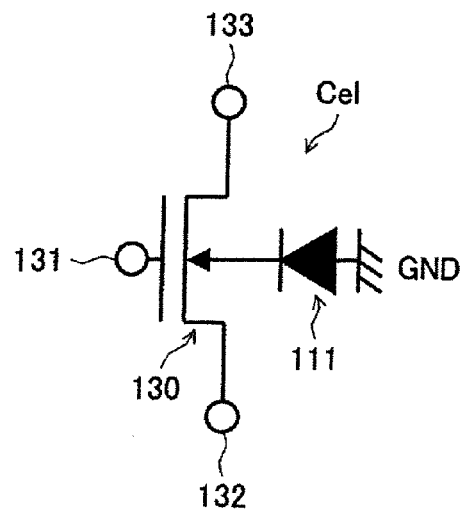
FIG. 3 is a diagram showing an equivalent circuit of a pixel cell according to the present embodiment.

FIG. 3 is a diagram showing an equivalent circuit for a pixel cell according to the present embodiment.

As shown in FIG. 3, each pixel cell 2A (Cel) is configured by a photoelectric conversion and charge accumulation element unit 111 formed by the first well 110 and a single transistor 130 formed by the second well 120 and electrodes on the second substrate surface 120 side.

In this way, the pixel cell Cel according to the present embodiment uses backside illumination and has a double-well structure, with charge accumulation and the channel current using the same carriers.

Also, the pixel cell Cel has a single-transistor architecture (construction) where the functions of a read transistor, a reset transistor, and a selection transistor share one transistor.

That is, in the present embodiment, backside illumination and a double-well construction are used, and a single-well modulation technique is not used. The reasons for this are given below.

When a single-well modulation technique is used, to improve linearity, pocket implantation is necessary, which reduces the accumulation area and prevents the saturation charge Qs from being reached when pixels are miniaturized.

With a single well construction, even if the degree of modulation and conversion efficiency are high, the structure is easily affected by defects which cause widespread occurrence of fluctuations in linearity ("cat leg") between pixels, with such problem being difficult to correct.

Also, since pinning is removed during a read, there is poor compatibility with column digital CDS. With analog CDS, there is an increase in area for the same capacitance, which makes miniaturization difficult.

When combined with backside illumination, since a reset transistor is required, this results in a two-transistor configuration, which is disadvantageous from the viewpoint of miniaturization.

On the other hand, with the present embodiment, by using backside illumination and a double-well construction, the same carriers are used for charge accumulation and the channel current, so that separate carriers are sufficient for element separation.

As a result, in the present embodiment, there is no need for the transistor construction to be a ring and it is possible to use the same a one-way construction of a drain (D)-gate (G)-source (S) as a normal transistor.

Also, in the present embodiment, a construction is used where the signal carriers are discharged to the drain of the transistor 130.

By doing so, a lateral reset construction where the read (pickup transistor), reset transistor, and selection transistor share a single transistor is entirely realized by one transistor.

That is, since the pixel cell construction according to the present embodiment is not a dual-layer gate construction and can use a single-layer gate construction, special precise work in the element separation region is unnecessary.

Also, since it is possible to share the drain, to share the source, and/or to share the gate with adjacent pixel cells, there is a great increase in layout efficiency, which enables pixels to be miniaturized.

Also, since a lateral reset via the drain of the transistor is used, by using a horizontal wire as the drain and providing separate wires in units of shared pixels, columns can be shared and the column circuit can be shrunk.

Also, since empty space can be produced above the gate of the transistor, it is possible to provide a reflector construction that uses the metal or the like of wires in such space. As a result, it is possible to reflect light that has passed through the silicon (Si) substrate and subject such light once again to photoelectric conversion in the silicon to increase the sensitivity for near infrared light, for example.

Also, with an existing construction, since the gate is set at off when light is being received and the surface of a silicon (Si) substrate is pinned to cause the dark current generated at the interface to recombine with holes, there has been the problem of the component that has not completely recombined causing inconsistencies in dark current and white point defects.

On the other hand, with the present construction, due to the use of double wells, dark current electrons generated at the Si surface can be discharged from the channel to the drain, giving the advantage that dark current and white points that occur at interfaces can be completely shut out.

As a result, since dark current and white points do not pose a problem even if the gate is on during a column read, non-destructive reads of signals are possible.

An array construction that realizes increased pixel density, a configuration equipped with a reflector, the configuration and functions of a signal read processing system, and a non-destructive read process for signals will be described in detail later.

The operation of a pixel cell with the configuration described above will now be described.

Light is incident inside the pixel cell from the first substrate surface (backside) 101 that is the rear surface side, and mainly due to the photoelectric effect inside the n-type first well 110 inside the pixel cell, electron/hole pairs are generated, with the generated holes passing through the p-type element separation layer 140 that forms the interface between cells and being discharged to the outside.

Only the electrons are accumulated in the n-type first well 110, and are accumulated inside a potential well formed near the semiconductor surface of the gate region between the source and drain of the transistor 130 as a MOS transistor. After this, a signal for the accumulated charge is amplified and detected via the transistor 130, the accumulated charge is appropriately discharged, and control over color mixing and the saturation charge amount is carried out.

Also, the thickness of the semiconductor layer of the sensor of the solid-state image pickup apparatus 1 is around 2 to 10 µm, which is thick enough to achieve sufficient quantum efficiency for the photoelectric conversion in the wavelength range of light.

On the other hand, for a frontside illumination device, it is normally necessary to keep the semiconductor substrate at a thickness (up to several hundred µm) that prevents breakage of the element, which means that the leak current between the source and drain through the element substrate is not negligible and can be problematic.

On the other hand, with the present embodiment, since the element thickness is sufficiently thin, it is possible to reduce the leak current through the substrate and also avoid such problem.

This completes the description of the configuration and functions of the solid-state image pickup apparatus 1 according to the present embodiment.

The solid-state image pickup apparatus 1 according to the present embodiment will now be considered below in more detail.

Figure 4:
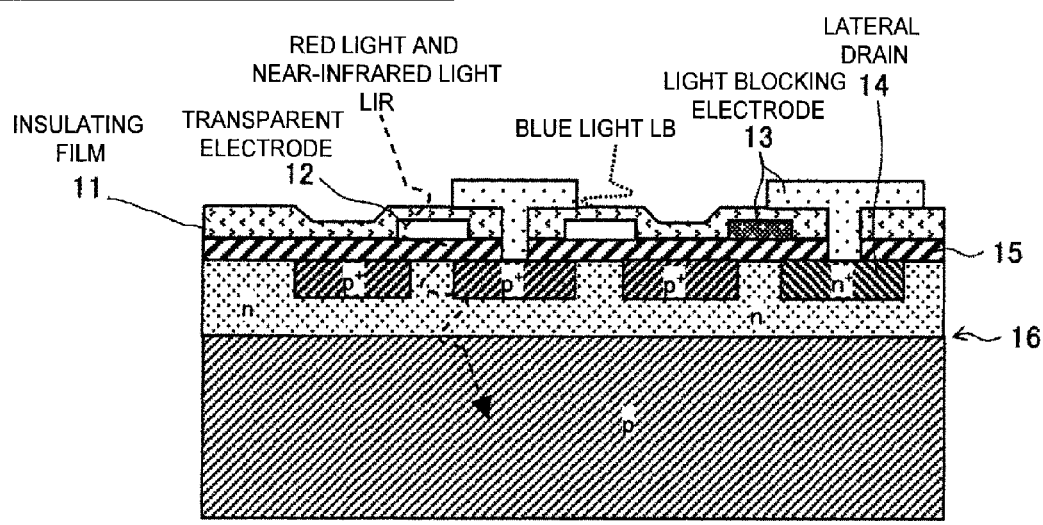
FIG. 4 is a diagram showing the relationship between the wavelength of incident light and the position of a transistor for a frontside illumination BMCD.

FIG. 4 is a diagram showing the relationship between the wavelength of the incident light and the layout of a transistor for the case of a frontside illumination BMCD.

In the frontside illumination BMCD 10 in FIG. 4, an insulation film 11, a transparent electrode 12, a light blocking electrode 13 and the like are formed on the substrate front side. Also, reference numeral 14 indicates a lateral drain, 15 a gate insulating film, and 16 a silicon substrate.

For the case of frontside illumination in FIG. 4, light enters from the side where the transistor is installed. In this case, a construction is used where the lateral drain region 14 is covered by the light blocking electrode 13 and from openings in other parts, light passes through the insulation film 11 and the transparent electrode 12, the gate insulating film 15, and the like and penetrates inside the silicon substrate 16.

Although red light and near infrared light LIR with a long wavelength penetrate comparatively deeply from the surface of the silicon, photoelectric conversion is carried out at a location where blue light LB and near ultraviolet light do not penetrate as deep. Also, when light of a short wavelength passes through the multilayer insulating film at the surface, it is easy for energy losses to occur due to scattering, absorption, and reflection at the layer interfaces.

On the other hand, with backside illumination according to the present embodiment in FIG. 2, a construction is used where light penetrates inside the silicon substrate 100 from the side where the transistor 130 is not disposed, and although much of the long wavelength light reaches the vicinity of the transistor, only a small amount of the light of a short wavelength reaches there.

To maximize the quantum efficiency including the wavelengths of the incident light, various proposals have been made regarding what should be done to the diffusion layer between the source and drain and the well layer.

However, there has been little discussion about the possibility of how light that passes through the silicon oxide film (insulating film) may affect the transistor characteristics. The present embodiment touches on this subject, and though qualitative, makes the mechanisms involved somewhat clearer.

Figure 5:
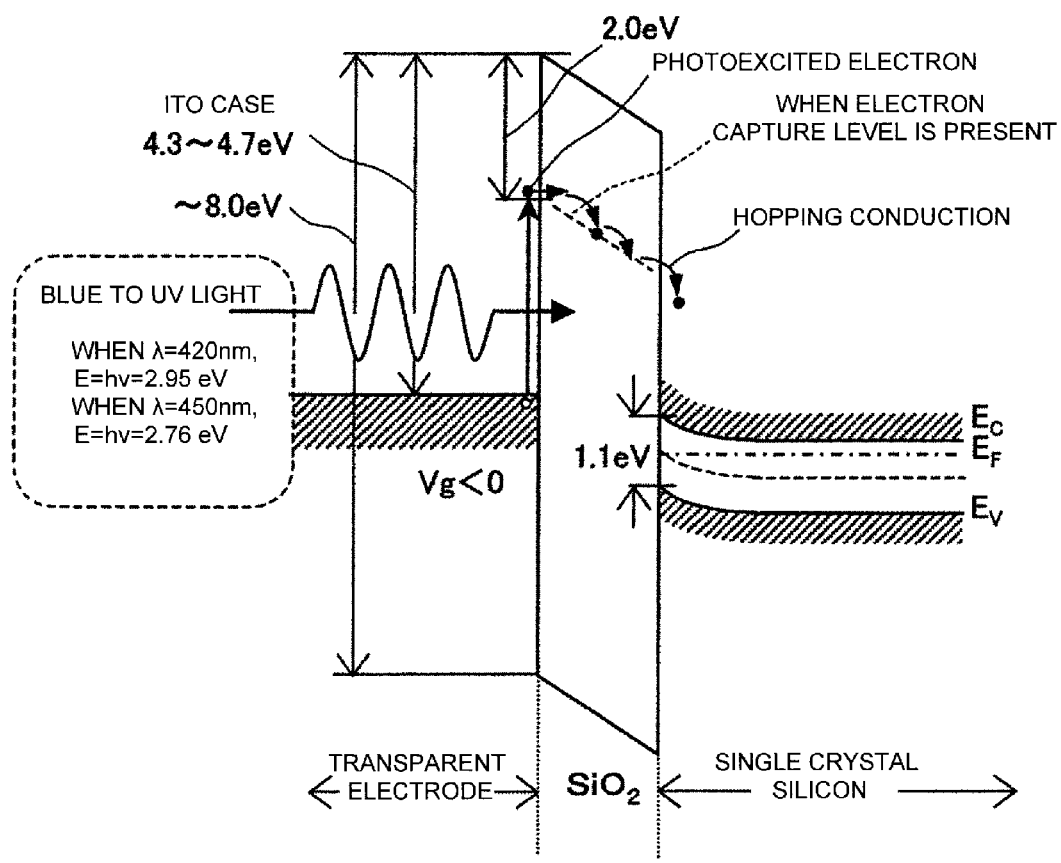
FIG. 5 is a diagram showing an overview of energy band states formed by a transparent electrode/gate silicon oxide film/single crystal silicon with frontside illumination.

FIG. 5 is a diagram showing an overview of the energy band states formed by a transparent electrode/gate silicon oxide film ($SiO_2$)/single-crystal silicon for the case where frontside illumination is used.

The properties of a gate oxide film greatly change according to the manufacturing method and processing, and when hardly controlled, traps that capture electrons and/or holes remain in an oxide film. In the drawing, the case where traps that capture electrons at the 2.0 eV position are present below the conduction band of the silicon oxide film is shown.

In the case of a thermally-oxidized silicon film, the band gap is around 8.0 eV, and when ITO is used as the transparent electrode, the work function is around 4.3 to 4.7 eV. This means that the Fermi level of the transparent electrode is positioned a little lower than the middle of the energy gap of the thermally-oxidized film.

Now, if we focus on the blue light component, with a wavelength of $\lambda=450$ nm for example, out of the incident light, according to Einstein's photon equation $E=h\nu$, this corresponds to $E=2.76$ eV. As shown in the diagram, the energy is substantially equal to the position of the energy level of the electron traps in the oxide film measured from the Fermi level of the transparent electrode.

At this time, when a relatively large negative voltage is applied to the transparent gate electrode compared to the silicon substrate, the electrons that fly off the metal surface (transparent electrode) due to the photoelectric effect become excited in the oxide film and captured in the traps.

The electrons captured in the traps are re-radiated by the electric field and flow into the conduction band of the single crystal silicon due to hopping conduction to produce a weak conduction state between the transparent gate electrode and the silicon, thereby causing fluctuation in the transistor characteristics and the signal level.

With backside illumination in the present embodiment, since most of the energy of high-energy light with a short wavelength is consumed in photocarrier generation inside the silicon substrate before the transistor region is reached, there is a major characteristic that the same drawback as frontside illumination is not present.

FIG. 6 is a series of diagrams showing changes in potential relative to electrons inside the semiconductor substrate in a direction perpendicular to the semiconductor substrate surface in various regions in accordance with changes in the potential state of the apparatus shown in FIG. 2.

In all of the states, the voltage VGND of the well contact electrodes 170 is set at 0V.

(i) Gate Read

If the gate voltage VG of the transistor 130 is set at 1.0V and the drain voltage VD at 1.8V, the source voltage VS is around 1.6V to 1.4V, there is a reduction in accumulated charge (electrons), and the channel electron current that flows from the source to the drain is modulated by a corresponding amount and so reduces. By measuring such change in current, the change in the amount of charge of the accumulated electrons can be known.

(ii) Gate Accumulation (Non-Read State)

If the gate voltage VG of the transistor 130 is set at 0V and the drain voltage VD at 1.8V, the source voltage VS is 1.2C or below and electrons are accumulated inside a potential well formed in the vicinity of the semiconductor substrate in the gate region between the source and the drain of the transistor 130.

(iii) Gate Accumulation (Non-Reset State, Hard Reset)

If the gate voltage VG of the transistor 130 is set at 0V to −1.0V and the drain voltage VD at 1.8V, a state is produced where the source voltage VS is a high impedance Hi-Z or LD and the accumulated electrons overflow (OF). That is the pixel cell Cel is saturated. At this time, a signal is held.

(iiii) Reset

If the gate voltage VG of the transistor 130 is set at 0V to −1.0V and the drain voltage VD at 3.0V or over, for example at 3.7V, the source voltage VS is a high impedance Hi-Z or LD and the electrons present inside the accumulation well are discharged to the outside via the drain electrode.

In this way, according to the present embodiment, by modulating the drain voltage VD and in some cases also the gate electrode (for the example in FIG. 6, by increasing the potential difference between the drain and gate) as a pixel signal reset, the accumulated signal charge (electrons) is discharged to the drain electrode.

Also, in the present embodiment, a so-called gamma (γ) characteristic is provided to increase the degree of modulation and conversion efficiency in low light conditions.

Also in the present embodiment, the γ characteristic is utilized in a high dynamic range (DR).

Here, the γ characteristic of a pixel cell will be described.

Figure 7:
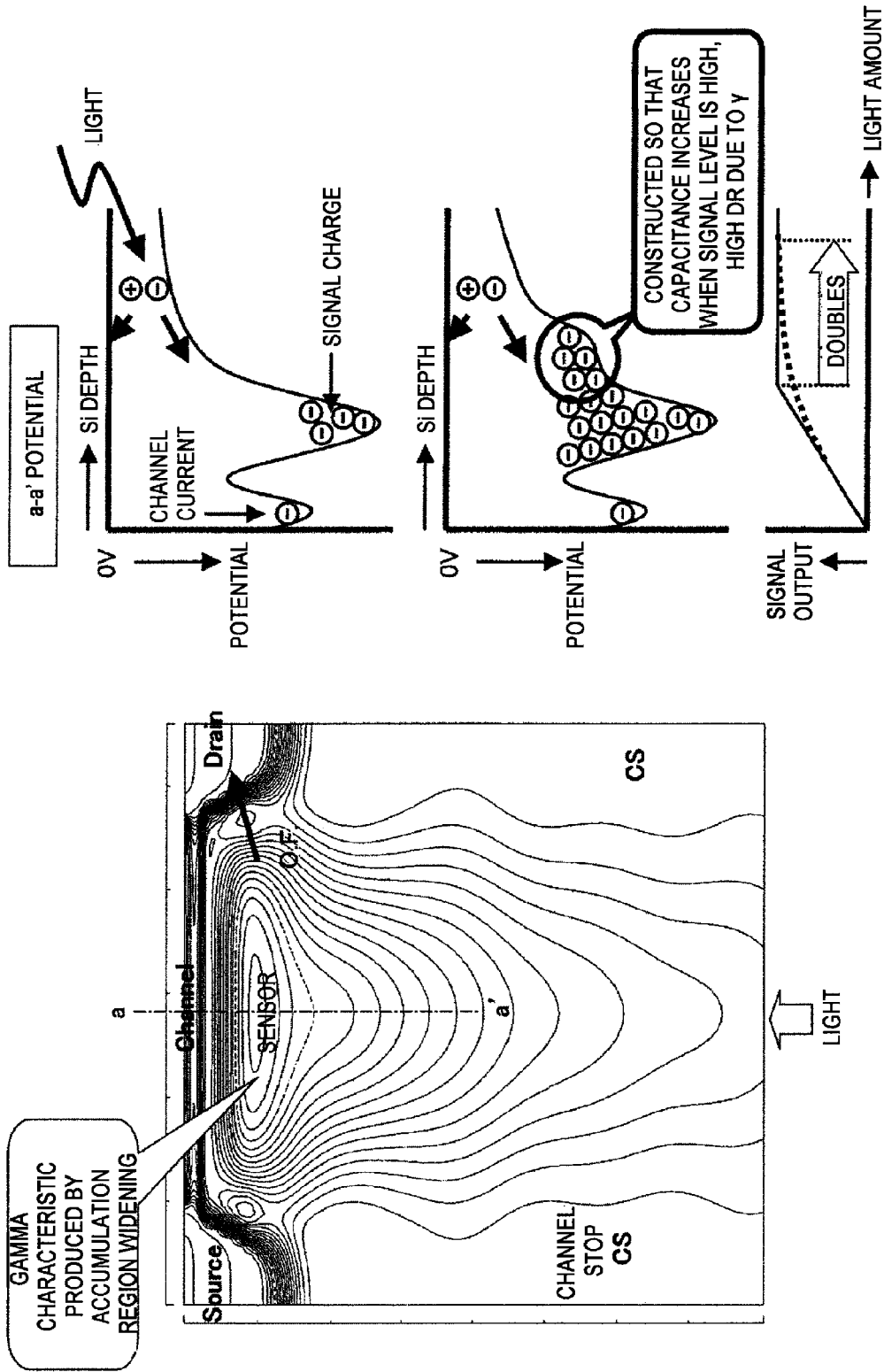
FIG. 7 is a diagram showing an example of a potential distribution along a line a-a' in FIG. 2.

FIG. 7 is a diagram showing one example of the potential distribution on the line a-a' in FIG. 2(A).

As shown in FIG. 7, one characteristic of a double well is that the sensor accumulation region has a broad potential shape. This means that one characteristic of a double well is that the capacity changes according to signal level, and exhibits non-linearity (a γ characteristic).

For a single-well construction, the linearity ("cat leg") is non-linear, and the signal drops when the signal level is low. On the other hand, with a double-well construction, with a γ characteristic where the gain increases when the signal level is low, inverse γ correction is possible, and the gain becomes minus in low light conditions. Since noise is compressed at the same time as the signal, noise reduction is possible.

In this way, with the present embodiment, active use is made of the γ characteristic and as shown in FIG. 2, a deep, n type gamma pocket 180 is provided to accumulate a low level signal.

In such gamma pocket 180, signal carriers and signal current are concentrated at a single point, improving the degree of modulation for a low level signal.

It is also possible to carry out inverse gamma correction at a DSP that carries out signal processing at a later stage to realize overall noise compression.

Also, as shown in FIG. 7, the pixel cell Cel has a construction where the capacity increases when the signal level is high, and uses the γ characteristic to achieve a high dynamic range (DR).

This completes the description of the configuration and functions of a pixel cell according to the present embodiment.

A configuration where the pixel unit 2 includes a reflector, the layout of the pixel cells, and the like are described below.

3. Reflector Configuration

Figure 8:
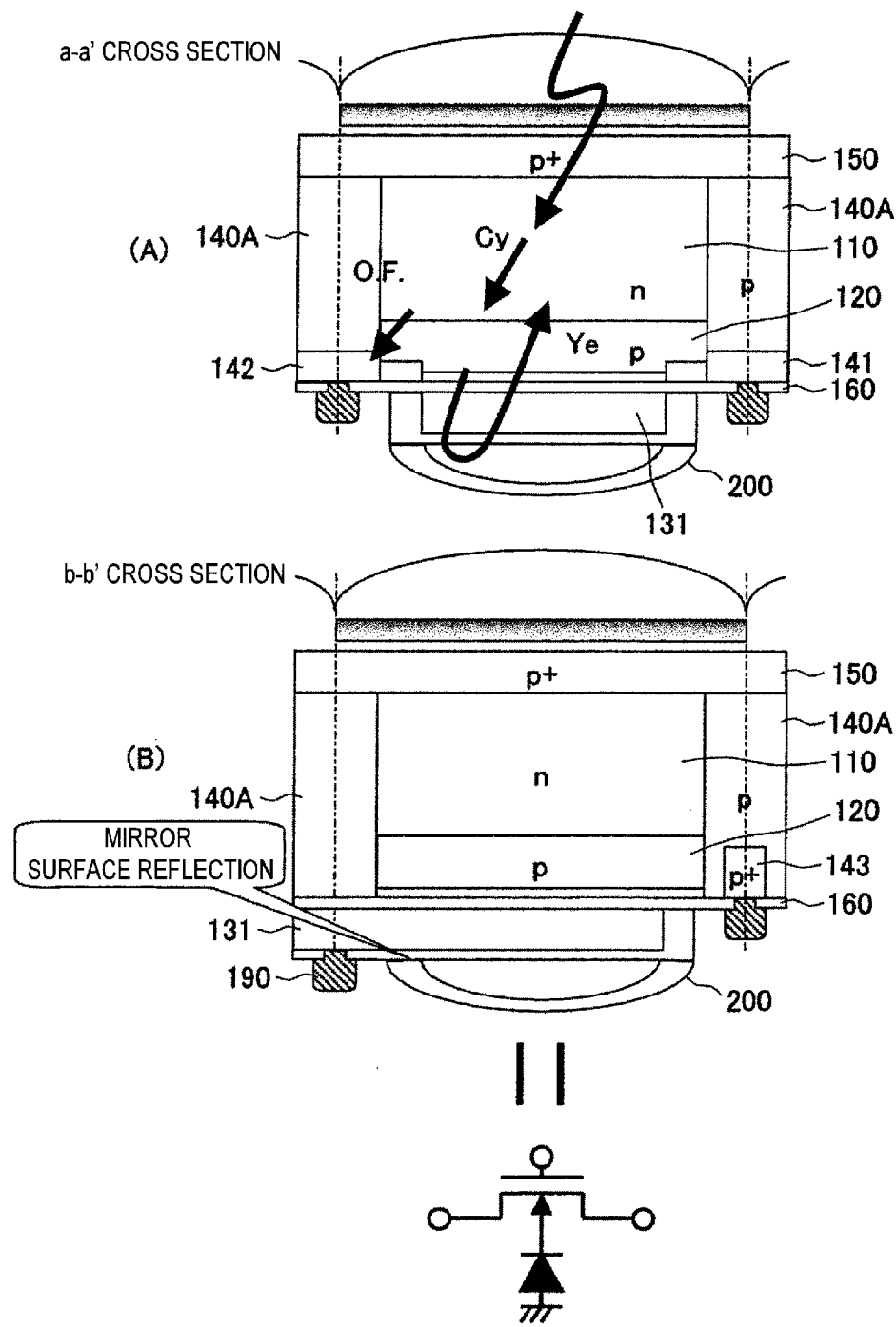
FIG. 8 is a simplified cross-sectional view of a pixel cell including a reflector.

FIGS. 8(A) and (B) are simplified cross-sectional views of a pixel cell including a reflector.

Note that in the pixel unit 2, a plurality of pixel cells Cel are laid out in a matrix. Also, a Bayer array is used.

The pixel cell shown in FIGS. 8(A) and (B) has a p type element separation layer (conductive layer) 140A formed on the side walls of the first well 110 and the second well 120. The pixel cell has a source region 141 and a drain region 142 composed of an $n^+$ layer that forms the transistor 130 formed inside the p type element separation layer 140A. In the pixel cell, a well contact region 143 is formed on the source region 141 side and the drain region 142 side. In this example, the well contact region 143 is formed on the source region side.

A gate contact electrode 190 is formed at a position facing the p type element separation layer 140A.

In addition, a reflector 200 is formed on a front surface side (the side on which light is not incident) of the gate electrode 131 of the pixel cell Cel aside from on the element separation layer 140A.

In the present embodiment, it is possible to increase the layout efficiency by sharing one or a plurality of the drain, the source, the substrate (well) or the gate contacts with an adjacent pixel cell.

That is, the ability to configure a pixel cell from a single transistor makes for a construction where the drain, source, gate and well contacts are disposed in four directions on the element separation and the gate occupies the entire pixel, leading to a dramatic reduction in random noise for the transistor.

For example, the drain contact and the source contact are shared between pixel cells that are adjacent in the Y direction (vertical direction, row direction) out of the X and Y directions, and the gate contact and the well contact are shared between pixel cells that are adjacent in the X direction (horizontal direction, column direction).

In this way, the drain contact, the source contact, the gate contact, and the well (substrate) contact can be laid out in four directions relative to the gate.

Figure 9:
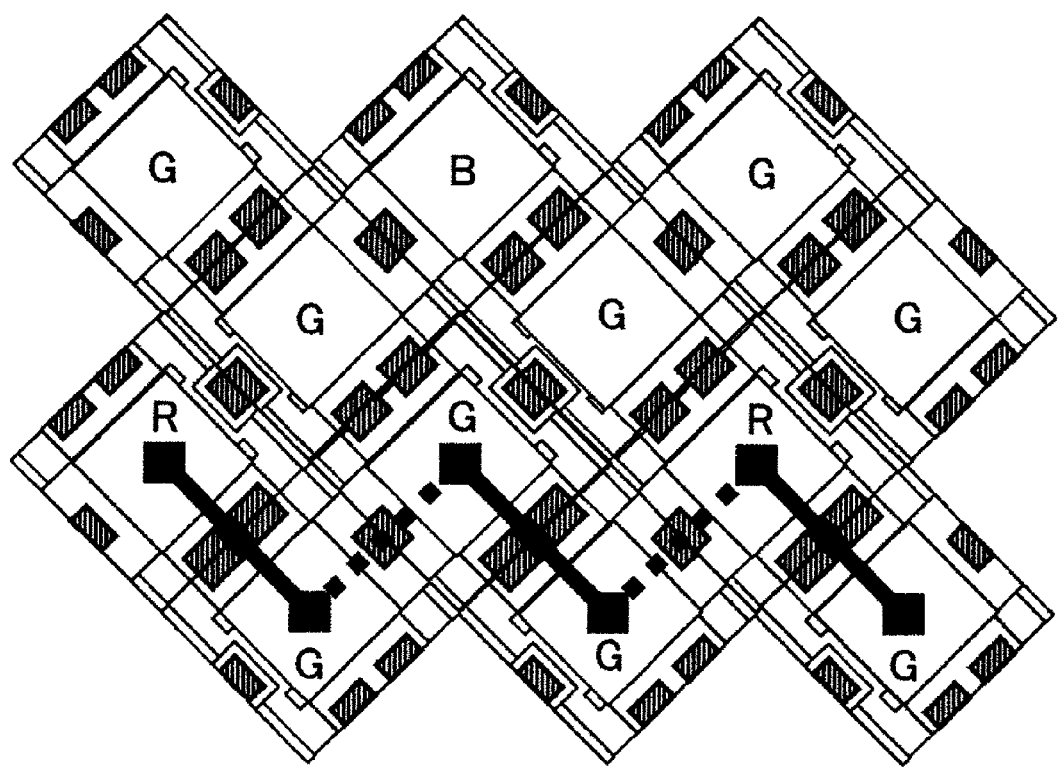
FIG. 9 is a diagram showing a construction in which a square layout of a normal Bayer array has been rotated by 45 degrees.

As a result, in the present embodiment, as shown in FIG. 9, it is possible to use a layout where a so-called zigzag array can also be used.

In the example in FIG. 9, a construction is used where a normal square Bayer array has been disposed having been rotated by 45 degrees.

Figure 10:
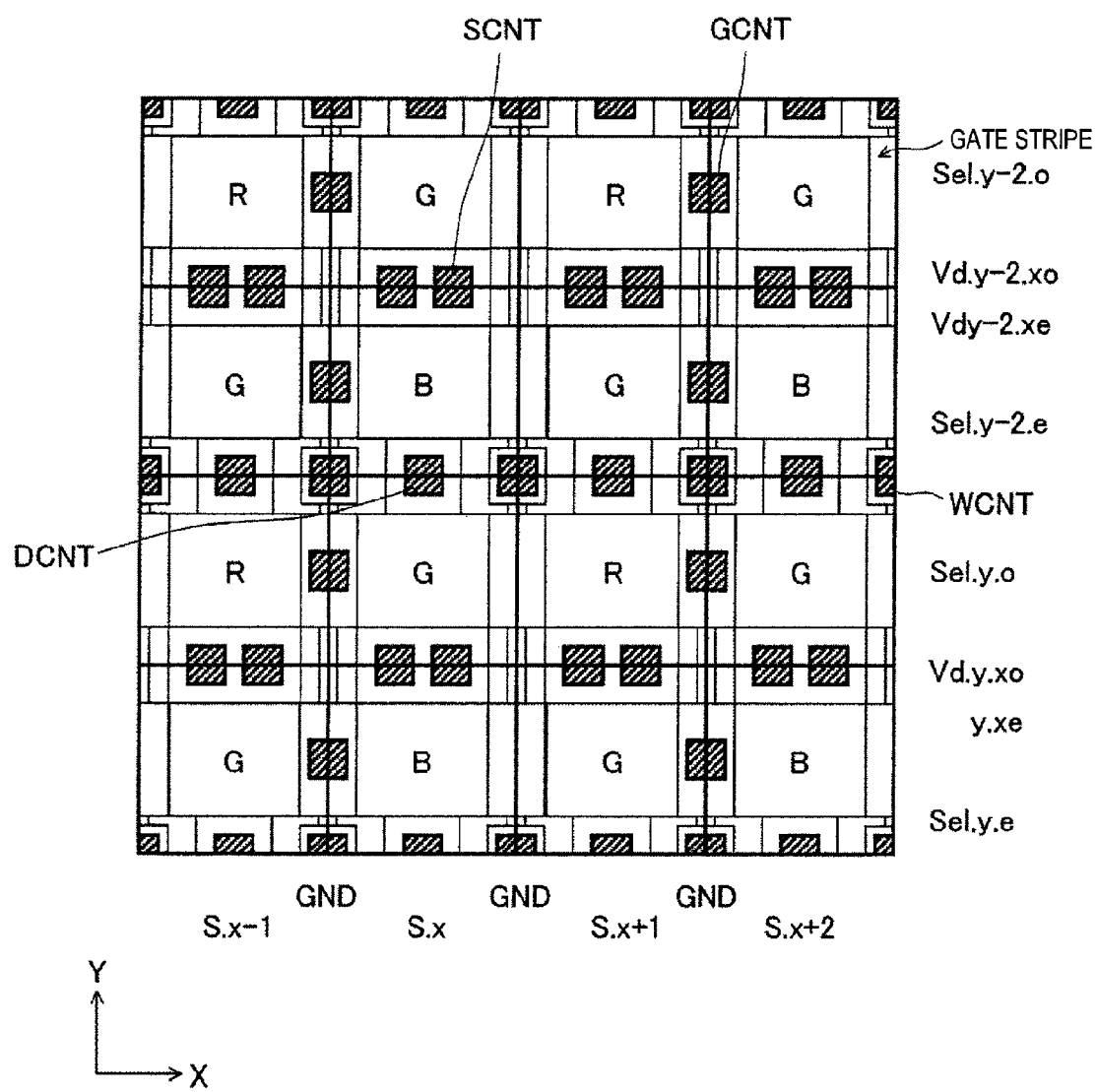
FIG. 10 is a diagram showing an example layout where gates are shared in stripes in an X direction (horizontal direction).

FIG. 10 is a diagram showing an example layout where gates are shared in stripes in the X direction (horizontal direction).

In FIG. 10, the X direction in the perpendicular coordinate system set in the diagram is the horizontal (width, column) direction and the Y direction is the vertical (height, row) direction.

In FIG. 10, SCNT indicates a source contact, DCNT a drain contact, GCNT a gate contact, and WCNT a well contact, respectively.

As shown in FIG. 10, by using a layout where the gates are shared in horizontal stripes and the well (substrate) contacts WCNT are on the source side or the drain side, it is possible to make the reflector 200 easy to make.

In this case, the well (substrate) contacts WCNT may be disposed so as to skip one place in the X (horizontal direction).

Also, it is possible to decide on the drain side or the source side according to the withstand voltage and layout.

When the substrate contacts are on the source side, there is a fall in potential difference giving the advantage that this facilitates increased pixel density.

Figure 11:
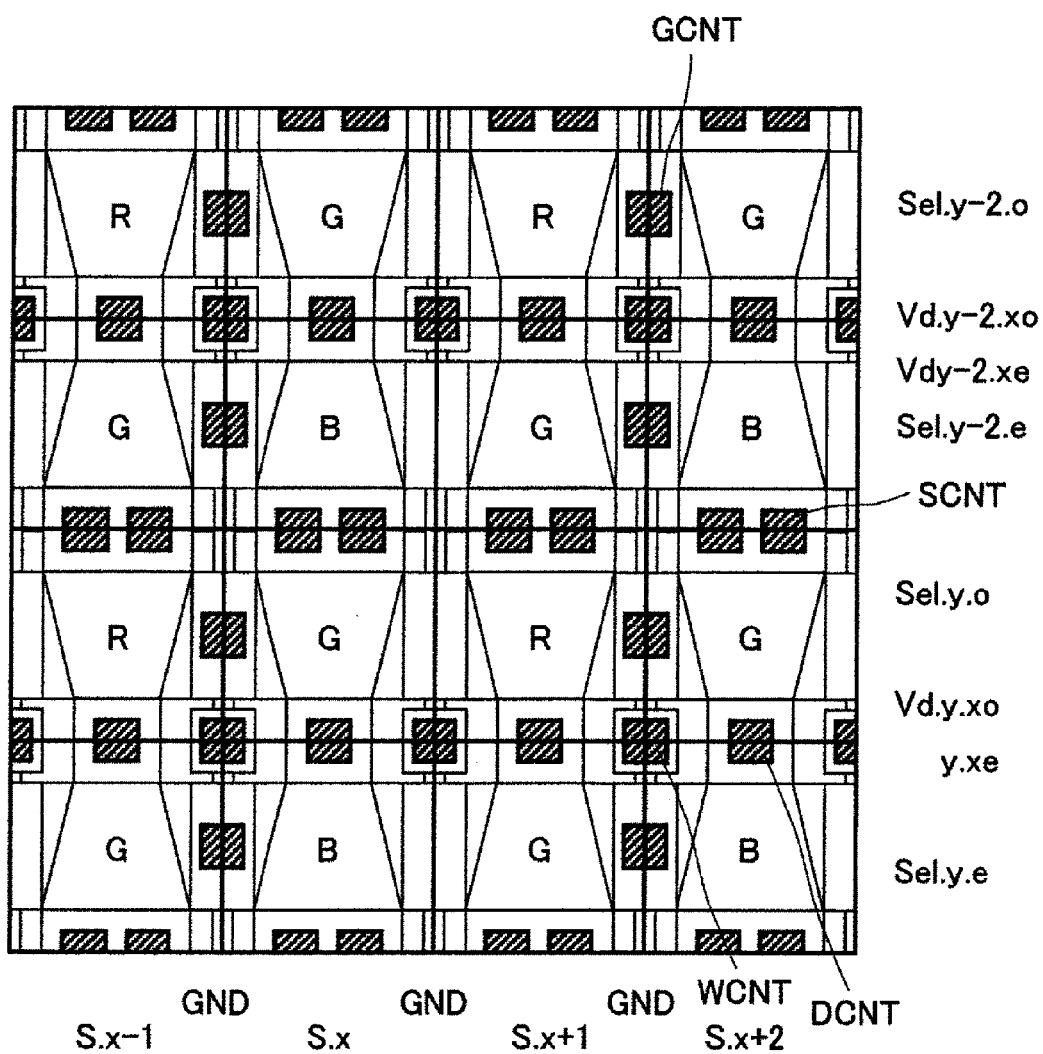
FIG. 11 is a diagram showing an example layout where drain sides have been pinched.

FIG. 11 is a diagram showing an example layout where the drain side is pinched.

When the well (substrate) contacts WCNT are set on the drain side, the drain width required to achieve the withstand voltage is reduced, or "pinched".

In this way, by widening the channel on the source side, the source side is deepened and the part where the signal collects and the part that is easy to modulate will match, thereby obtaining high modulation characteristics.

Figure 12:
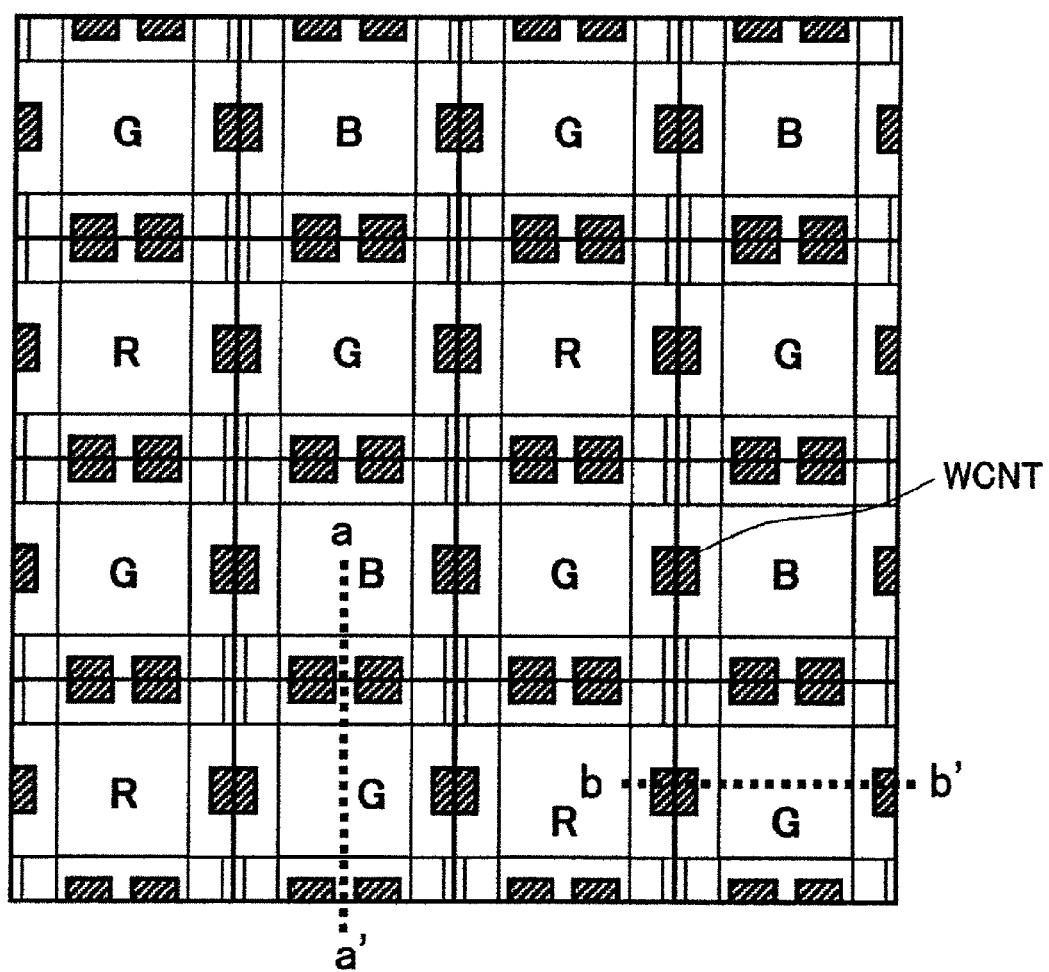
FIG. 12 is a diagram showing another example layout of pixel cells in the pixel unit according to the present embodiment.

FIG. 12 is a diagram showing another example layout of pixel cells in a pixel unit according to the present embodiment. Also, FIG. 13(A) is a simplified cross-sectional view along the line a-a' in FIG. 12 and FIG. 13(B) is a simplified cross-sectional view along the line b-b' in FIG. 12.

In the example layout in FIG. 12, the well (substrate) contacts (WCNT) are not formed on the second substrate surface 102 side of the silicon substrate 100 but are formed on the first substrate surface 101 (rear surface) side. Each gate electrode 131 is formed across an entire pixel cell including the p type element separation layer 140A on the second substrate surface 102 side.

In this case, it is possible to use the same construction as wiring and a light blocking film for preventing color mixing, not shown.

By using such configuration, the wiring of the reflector 200 becomes symmetrical, which is advantageous from the viewpoint of withstand voltage.

Here, the reflector 200 will be described in even more detail.

With the pixel cell Cel according to the present embodiment that uses backside illumination and a double well construction, since it is possible to provide empty space above the gate electrode 131 of the transistor 130, it is possible to form a reflector construction that uses the metal or the like of the wires here.

The light that has passed through the silicon substrate 100 is reflected by the reflector 200 and is subjected to photoelectric conversion once again in the first well 110 of the silicon substrate 100, which makes it possible to raise the sensitivity for near infrared light, for example.

In this case, as shown in FIG. 14(A), the substrate is comparatively thick (around 6 μm to 10 μm) and by using the reflection of near infrared light by the reflector 200, application in a low-light surveillance camera, for example, is possible.

In addition, as shown in FIG. 14(B), if the thickness of the silicon substrate 100 is actively set thinly at a thickness that reflects G to R light, since around half of the substrate thickness is sufficient, it becomes possible to further reduce the pixel size to half, which makes it possible to prevent color mixing.

Normally for visible light, since a silicon substrate needs a thickness of 2 μm to 3 μm, light needs to be received with an incident angle of up to around 25 degrees, and an aspect ratio of 1:2 is the limit, around 1 μm to 1.5 μm was said to be the limit for pixel size.

However, since a silicon substrate of half the thickness at around 1 μm to 1.5 μm is sufficient when the reflector 200 is used as in the present embodiment, it becomes possible to have pixels with a submicron size.

Also, in such case, it is preferable to use an ITO film that has high light transmittance for visible light as the electrodes.

In the present embodiment, the reflector 200 is a metal wire (Al or the like). An example configuration is described later.

Note that although not described in detail, in some cases the reflector is configured of a non-conductive insulating film or the like.

Next, a configuration in which column circuits can be shared to enable downsizing will be described.

In this case, in the matrix (array) arrangement of pixel cells of the pixel unit 2, by dividing the drain contacts in a column into two or more groups, column circuits in the column direction (X direction) control circuit 4 are shared, which enables downsizing.

4. Example Pixel Cell Array of Shared Contact Pixel Unit

FIGS. 15(A), (B) are diagrams showing an example pixel cell array of a shared contact pixel unit, with FIG. 15(A) being a diagram showing an example of a layout of pixel cells and FIG. 15(B) being a diagram showing a pattern layout corresponding to FIG. 15(A).

Figure 15:
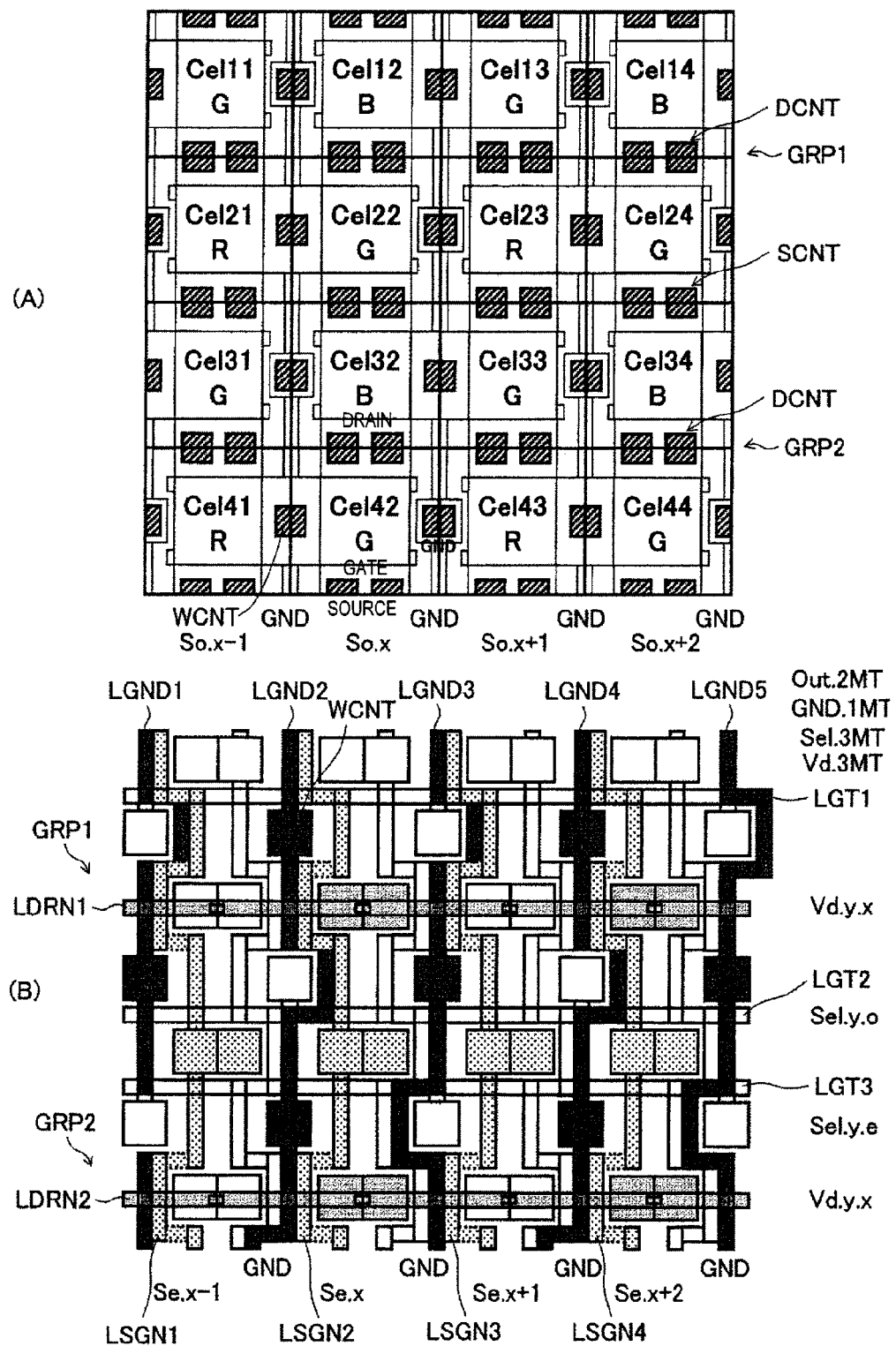
FIG. 15 is a diagram showing an example pixel cell array of a shared contact pixel unit.
Figure 16:
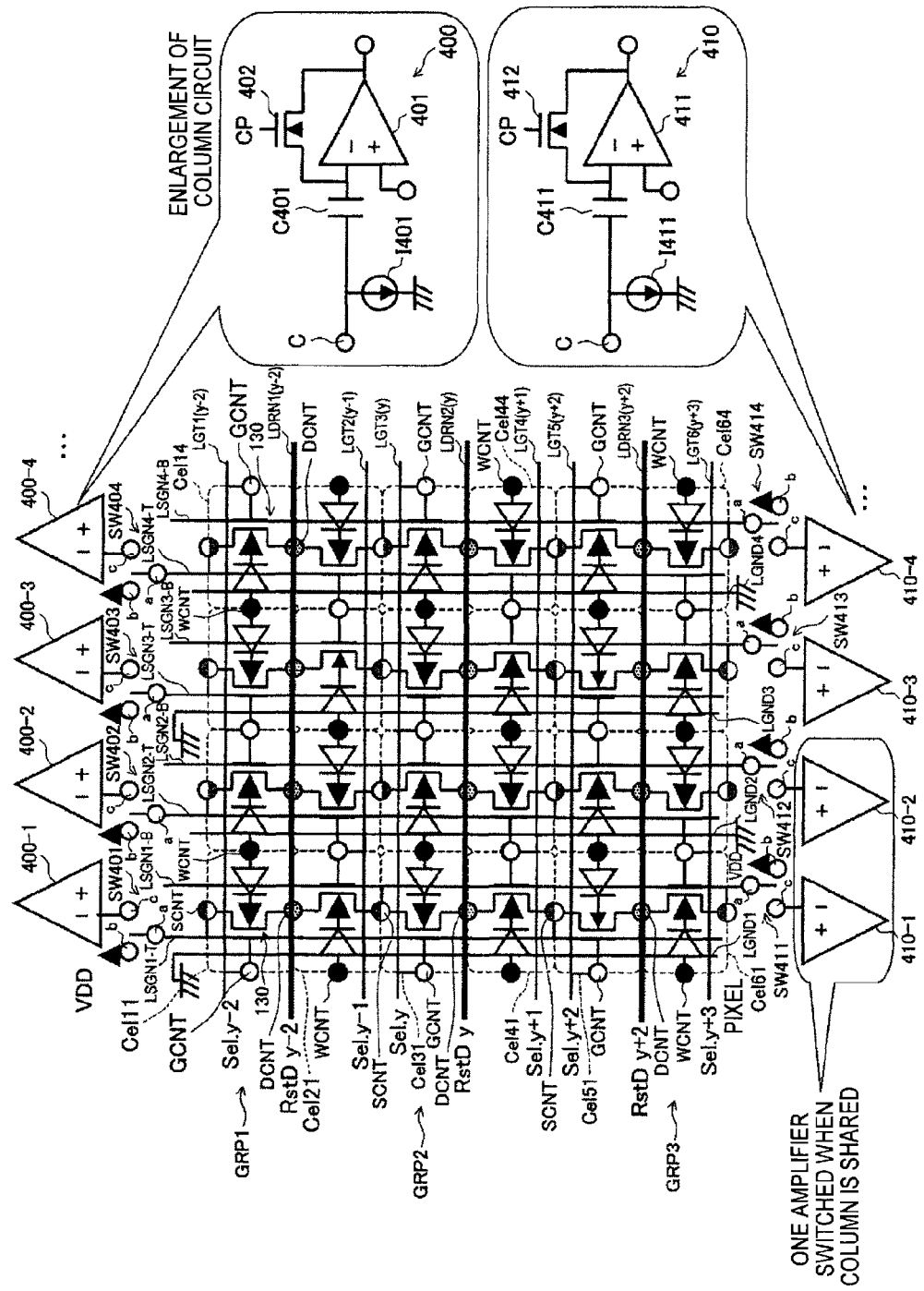
FIG. 16 is a diagram showing an equivalent circuit adapted to the layout in FIG. 15 and in which the signal processing system in which column circuits are shared and the pixel unit are simplified.

FIG. 16 is a diagram showing an equivalent circuit adapted to the layout in FIG. 15 and in which the signal processing system in which column circuits are shared and the pixel unit are simplified.

Note that in the following description, it is assumed that a signal Sel is supplied to the gate of a selected transistor.

Also although the following description describes an example pixel cell array of a shared contact pixel unit, it is also possible to produce a configuration where the sources and/or drains are connected using wires and shared.

As one example, even if the sources and drains are separate for each pixel cell as shown in FIG. 1, it is possible to produce a configuration where the drains and/or sources of pixel cells that are adjacent in the row direction are connected by wires and shared.

In this example, drains are shared by two lines in the perpendicular direction (Y direction).

In the example in FIG. 15(A), sixteen cells Cel that are selectively illustrated are laid out in a matrix.

As a basic rule, a Bayer array is used.

A G (green, Gr) pixel Cel 11 is disposed in the first row and first column, a B (blue) pixel Cel 12 is disposed in the first row and second column, an R (red) pixel Cel 21 is disposed in the second row and first column, and a G (Gb) pixel Cel 22 is disposed in the second row and second column.

In the same way, a G (Gr) pixel Cel 13 is disposed in the first row and third column, a B pixel Cel 14 is disposed in the first row and fourth column, an R pixel Cel 23 is disposed in the second row and third column, and a G (Gb) pixel Cel 24 is disposed in the second row and fourth column.

A G pixel Cel 31 is disposed in the third row and first column, a B pixel Cel 32 is disposed in the third row and second column, an R pixel Cel 41 is disposed in the fourth row and first column, and a G (Gb) pixel Cel 42 is disposed in the fourth row and second column.

In the same way, a G (Gr) pixel Cel 33 is disposed in the third row and third column, a B pixel Cel 34 is disposed in the third row and fourth column, an R pixel Cel 43 is disposed in the fourth row and third column, and a G (Gb) pixel Cel 44 is disposed in the fourth row and fourth column.

In the respective columns in the pixel cell arrangement, pixel cells in an odd-numbered row and even-numbered row that are adjacent share a drain contact DCNT.

In the example in FIG. 15, the pixel cells Cel 11 and Cel 21 share a drain contact DCNT and the pixel cells Cel 31 and Cel 41 share a drain contact DCNT.

In the same way, the pixel cells Cel 12 and Cel 22 share a drain contact DCNT and the pixel cells Cel 32 and Cel 42 share a drain contact DCNT.

The pixel cells Cel 13 and Cel 23 share a drain contact DCNT and the pixel cells Cel 33 and Cel 43 share a drain contact DCNT.

The pixel cells Cel 14 and Cel 24 share a drain contact DCNT and the pixel cells Cel 34 and Cel 44 share a drain contact DCNT.

In the example in FIG. 15, a group GRP1 is formed by the pixel cells Cel 11 to Cel 14 on the first row and the pixel cells Cel 21 to Cel 24 on the second row that share drain contacts DCNT.

In the same way, a group GRP2 is formed by the pixel cells Cel 31 to Cel 34 on the third row and the pixel cells Cel 41 to Cel 44 on the fourth row that share drain contacts DCNT.

Pixel cells that are adjacent in the respective columns between the adjacent groups also share a source contact SCNT.

In the example in FIG. 15, the pixel cell Cel 21 in group GRP1 and the pixel cell Cel 31 in group GRP2 share a source contact SCNT.

The pixel cell Cel 22 in group GRP1 and the pixel cell Cel 32 in group GRP2 share a source contact SCNT.

The pixel cell Cel 23 in group GRP1 and the pixel cell Cel 33 in group GRP2 share a source contact SCNT.

The pixel cell Cel 24 in group GRP1 and the pixel cell Cel 34 in group GRP2 share a source contact SCNT.

Also, in FIG. 15(B), LGND1 to 5, . . . show ground lines connected to the well contacts WCNT, and LSGN1 to 4, . . . show signal lines connected to the source contacts SNCT, respectively.

In FIG. 15(B), LGT1 to 3 show gate lines connected to the gate contacts and LDRN1 to 4 show drain lines connected to the drain contacts, respectively.

In the present embodiment, the gate lines correspond to first driving lines and the drain lines correspond to second driving lines.

The ground lines LGND and the signal lines LSGN are disposed in each column in the Y direction (row direction).

Also, the gate lines LGT are disposed in each row in the X direction (column direction).

Also, one drain line LDRN is laid out for each group in the X direction (column direction).

These ground lines LGND, signal lines LSGN, gate lines LGT, and drain lines LDRN are formed by a multilayer wiring construction.

For example, the ground lines LGND are formed by first metal wires (1MT) on the lowest layer.

The signal lines LSGN are formed by second metal wires (2MT) on the second lowest layer.

The gate lines LGT and the drain lines LDRN are kept insulated from one another by an insulating film between the two and are formed by third metal wires (3MT) on the uppermost layer.

In the present embodiment, in the respective groups GRP1 to GRP3, the pixel cells that share a drain contact are formed so that the gate contacts GCNT and the well (substrate) contacts WCNT have opposite orientations in the X direction (column direction).

The cells are also formed so that the orientations are opposite in the odd-numbered columns and even-numbered columns.

More specifically, in group GRP1, the gate contact GCNT of the pixel cell 11 in the first column is formed on the left side (in the drawing) in the X direction and the well contact WCNT is formed on the right side (in the drawing) in the X direction.

The gate contact GCNT of the pixel cell 21 in the first column is formed on the right side (in the drawing) in the X direction and the well contact WCNT is formed on the left side (in the drawing) in the X direction.

The gate of the transistor 130 of the pixel cell Cel 11 is connected via the gate contact GCNT to the gate line LGT1 (y-2) and the well contact WCNT is connected to the ground line LGND2 disposed in the second column.

The gate of the transistor 130 of the pixel cell Cel 21 is connected via the gate contact GCNT to the gate line LGT2 (y-1) and the well contact WCNT is connected to the ground line LGND1 disposed in the first column.

The gate contact GCNT of the pixel cell 12 in the second column is formed on the right side (in the drawing) in the X direction and the well contact WCNT is formed on the left side (in the drawing) in the X direction.

The gate contact GCNT of the pixel cell 22 in the second column is formed on the left side (in the drawing) in the X direction and the well contact WCNT is formed on the right side (in the drawing) in the X direction.

The gate of the transistor 130 of the pixel cell Cel 12 is connected via the gate contact GCNT to the gate line LGT1 (y-2) and the well contact WCNT is connected to the ground line LGND2 disposed in the second column.

The gate of the transistor 130 of the pixel cell Cel 22 is connected via the gate contact GCNT to the gate line LGT2 (y-1) and the well contact WCNT is connected to the ground line LGND3 disposed in the third column.

The gate contact GCNT of the pixel cell 13 in the third column is formed on the left side (in the drawing) in the X direction and the well contact WCNT is formed on the right side (in the drawing) in the X direction.

The gate contact GCNT of the pixel cell 23 in the first column is formed on the right side (in the drawing) in the X direction and the well contact WCNT is formed on the left side (in the drawing) in the X direction.

The gate of the transistor 130 of the pixel cell Cel 13 is connected via the gate contact GCNT to the gate line LGT1 (y-2) and the well contact WCNT is connected to the ground line LGND4 disposed in the fourth column.

The gate of the transistor 130 of the pixel cell Cel 23 is connected via the gate contact GCNT to the gate line LGT2 (y-1) and the well contact WCNT is connected to the ground line LGND3 disposed in the third column.

The gate contact GCNT of the pixel cell 14 in the fourth column is formed on the right side (in the drawing) in the X direction and the well contact WCNT is formed on the left side (in the drawing) in the X direction.

The gate contact GCNT of the pixel cell 24 in the second column is formed on the left side (in the drawing) in the X direction and the well contact WCNT is formed on the right side (in the drawing) in the X direction.

The gate of the transistor 130 of the pixel cell Cel 14 is connected via the gate contact GCNT to the gate line LGT1 (y-2) and the well contact WCNT is connected to the ground line LGND4 disposed in the fourth column.

The gate of the transistor 130 of the pixel cell Cel 24 is connected via the gate contact GCNT to the gate line LGT2 (y-1) and the well contact WCNT is connected to the ground line LGND5 (not shown) disposed in the fifth column.

In the group GRP1, the drains of the respective transistors 130 in the first row and the drains of the respective adjacent transistors 130 in the second row are commonly connected via the drain contacts DCNT to the drain line LDRN(y-2).

That is, the drains of every transistor 130 of every cell in the first row of the group GRP1 and every transistor of every cell in the second row are commonly connected to a single drain line LDRN1(y-2) disposed in the x direction.

In the group GRP2, the gate contact GCNT of the pixel cell 31 in the first column is formed on the left side (in the drawing) in the X direction and the well contact WCNT is formed on the right side (in the drawing) in the X direction.

The gate contact GCNT of the pixel cell 41 in the first column is formed on the right side (in the drawing) in the X direction and the well contact WCNT is formed on the left side (in the drawing) in the X direction.

The gate of the transistor 130 of the pixel cell Cel 31 is connected via the gate contact GCNT to the gate line LGT3($y$) and the well contact WCNT is connected to the ground line LGND2 disposed in the second column.

The gate of the transistor 130 of the pixel cell Cel 41 is connected via the gate contact GCNT to the gate line LGT5 ($y$+1) and the well contact WCNT is connected to the ground line LGND1 disposed in the first column.

The gate contact GCNT of the pixel cell 32 in the second column is formed on the right side (in the drawing) in the X direction and the well contact WCNT is formed on the left side (in the drawing) in the X direction.

The gate contact GCNT of the pixel cell 42 in the second column is formed on the left side (in the drawing) in the X direction and the well contact WCNT is formed on the right side (in the drawing) in the X direction.

The gate of the transistor 130 of the pixel cell Cel 32 is connected via the gate contact GCNT to the gate line LGT3($y$) and the well contact WCNT is connected to the ground line LGND2 disposed in the second column.

The gate of the transistor 130 of the pixel cell Cel 42 is connected via the gate contact GCNT to the gate line LGT4 ($y$+1) and the well contact WCNT is connected to the ground line LGND3 disposed in the third column.

The gate contact GCNT of the pixel cell 33 in the third column is formed on the left side (in the drawing) in the X direction and the well contact WCNT is formed on the right side (in the drawing) in the X direction.

The gate contact GCNT of the pixel cell 43 in the first column is formed on the right side (in the drawing) in the X direction and the well contact WCNT is formed on the left side (in the drawing) in the X direction.

The gate of the transistor 130 of the pixel cell Cel 33 is connected via the gate contact GCNT to the gate line LGT3($y$) and the well contact WCNT is connected to the ground line LGND4 disposed in the fourth column.

The gate of the transistor 130 of the pixel cell Cel 43 is connected via the gate contact GCNT to the gate line LGT4 ($y$+1) and the well contact WCNT is connected to the ground line LGND3 disposed in the third column.

The gate contact GCNT of the pixel cell 34 in the fourth column is formed on the right side (in the drawing) in the X direction and the well contact WCNT is formed on the left side (in the drawing) in the X direction.

The gate contact GCNT of the pixel cell 44 in the second column is formed on the left side (in the drawing) in the X direction and the well contact WCNT is formed on the right side (in the drawing) in the X direction.

The gate of the transistor 130 of the pixel cell Cel 34 is connected via the gate contact GCNT to the gate line LGT3($y$) and the well contact WCNT is connected to the ground line LGND4 disposed in the fourth column.

The gate of the transistor 130 of the pixel cell Cel 44 is connected via the gate contact GCNT to the gate line LGT4 ($y$+1) and the well contact WCNT is connected to the ground line LGND5 (not shown) disposed in the fifth column.

In the group GRP2, the drains of the respective transistors 130 in the third row and the drains of the respective adjacent transistors 130 in the second row are commonly connected via the drain contacts DCNT to the drain line LDRN2($y$2).

That is, the drains of every transistor 130 of every cell in the third row of the group GRP2 and every transistor of every cell in the fourth row are commonly connected to a single drain line LDRN2($y$) disposed in the x direction.

In the group GRP3, the gate contact GCNT of the pixel cell 51 in the first column is formed on the left side (in the drawing) in the X direction and the well contact WCNT is formed on the right side (in the drawing) in the X direction.

The gate contact GCNT of the pixel cell 61 in the first column is formed on the right side (in the drawing) in the X direction and the well contact WCNT is formed on the left side (in the drawing) in the X direction.

The gate of the transistor 130 of the pixel cell Cel 51 is connected via the gate contact GCNT to the gate line LGT5 ($y$+2) and the well contact WCNT is connected to the ground line LGND2 disposed in the second column.

The gate of the transistor 130 of the pixel cell Cel 61 is connected via the gate contact GCNT to the gate line LGT6 ($y$+3) and the well contact WCNT is connected to the ground line LGND1 disposed in the first column.

The gate contact GCNT of the pixel cell 52 in the second column is formed on the right side (in the drawing) in the X direction and the well contact WCNT is formed on the left side (in the drawing) in the X direction.

The gate contact GCNT of the pixel cell 62 in the second column is formed on the left side (in the drawing) in the X direction and the well contact WCNT is formed on the right side (in the drawing) in the X direction.

Also, the gate of the transistor 130 of the pixel cell Cel 52 is connected via the gate contact GCNT to the gate line LGT5($y$+2) and the well contact WCNT is connected to the ground line LGND2 disposed in the second column.

The gate of the transistor 130 of the pixel cell Cel 62 is connected via the gate contact GCNT to the gate line LGT6 ($y$+3) and the well contact WCNT is connected to the ground line LGND3 disposed in the third column.

The gate contact GCNT of the pixel cell 53 in the third column is formed on the left side (in the drawing) in the X direction and the well contact WCNT is formed on the right side (in the drawing) in the X direction.

The gate contact GCNT of the pixel cell 63 in the first column is formed on the right side (in the drawing) in the X direction and the well contact WCNT is formed on the left side (in the drawing) in the X direction.

Also, the gate of the transistor 130 of the pixel cell Cel 53 is connected via the gate contact GCNT to the gate line LGT5($y$+2) and the well contact WCNT is connected to the ground line LGND4 disposed in the fourth column.

The gate of the transistor 130 of the pixel cell Cel 63 is connected via the gate contact GCNT to the gate line LGT6 ($y$+3) and the well contact WCNT is connected to the ground line LGND3 disposed in the third column.

The gate contact GCNT of the pixel cell 54 in the fourth column is formed on the right side (in the drawing) in the X direction and the well contact WCNT is formed on the left side (in the drawing) in the X direction.

The gate contact GCNT of the pixel cell 64 in the second column is formed on the left side (in the drawing) in the X direction and the well contact WCNT is formed on the right side (in the drawing) in the X direction.

Also, the gate of the transistor 130 of the pixel cell Cel 54 is connected via the gate contact GCNT to the gate line LGT5($y$+2) and the well contact WCNT is connected to the ground line LGND4 disposed in the fourth column.

The gate of the transistor 130 of the pixel cell Cel 64 is connected via the gate contact GCNT to the gate line LGT6

(y+3) and the well contact WCNT is connected to the ground line LGND5 (not shown) disposed in the fifth column.

In the group GRP3, the drains of the respective transistors 130 in the fifth row and the drains of the respective adjacent transistors 130 in the sixth row are commonly connected via the drain contacts DCNT to the drain line LDRN3(y+2).

That is, the drains of every transistor 130 of every cell in the fifth row of the group GRP3 and every transistor of every cell in the sixth row are commonly connected to a single drain line LDRN3(y+2) disposed in the x direction.

Also, as described earlier, the source contacts SCNT are shared between the pixel cells that are adjacent in the respective columns between adjacent groups.

In the example in FIG. 15 and FIG. 16, the pixel cell Cel21 of the group GRP1 and the pixel cell Cel31 of the group GRP2 share the source contact SCNT.

The pixel cell Cel22 of the group GRP1 and the pixel cell Cel32 of the group GRP2 share the source contact SCNT.

The pixel cell Cel23 of the group GRP1 and the pixel cell Cel33 of the group GRP2 share the source contact SCNT.

The pixel cell Cel24 of the group GRP1 and the pixel cell Cel34 of the group GRP2 share the source contact SCNT.

The pixel cell Cel41 of the group GRP2 and the pixel cell Cel51 of the group GRP3 share the source contact SCNT.

The pixel cell Cel42 of the group GRP2 and the pixel cell Cel52 of the group GRP3 share the source contact SCNT.

The pixel cell Cel43 of the group GRP2 and the pixel cell Cel53 of the group GRP3 share the source contact SCNT.

The pixel cell Cel44 of the group GRP2 and the pixel cell Cel54 of the group GRP3 share the source contact SCNT.

Next, the signal lines and the read signal processing system will be described with reference to FIG. 16.

As shown in FIG. 16, the signal lines LSGN 1 to 4 are disposed in the Y direction in the respective columns as two signal lines for a top read and a bottom read.

In the first column, the signal line LSGN1 is disposed having been divided into the first signal line LSGN1-T and the second signal line LSGN1-B.

In the second column, the signal line LSGN2 is disposed having been divided into the first signal line LSGN2-T and the second signal line LSGN2-B.

In the third column, the signal line LSGN3 is disposed having been divided into the first signal line LSGN3-T and the second signal line LSGN3-B.

In the fourth column, the signal line LSGN4 is disposed having been divided into the first signal line LSGN4-T and the second signal line LSGN4-B.

Corresponding to the column arrays, top switches TSW401, TSW402, TSW403, TSW404, . . . are disposed as first switches and bottom switches BSW411, BSW412, BSW413, BSW414, . . . are disposed as second switches.

In addition, corresponding to the column arrays, top-side column circuits 400-1, 400-2, 400-3, 4004, . . . are disposed as first column circuits and bottom-side column circuits 410-1, 41-2, 41-3, 41-4, . . . are disposed as second column circuits.

A switching unit is formed by the top switches TSW401, TSW402, TSW403, TSW404, . . . as the first switches and the bottom switches BSW411, BSW412, BSW413, BSW414, . . . as the second switches.

The source contacts SCNT to which the sources of the transistors 130 of two pixel cells Cel that are adjacent in the Y (vertical) direction and share a drain contact are connected are alternately (separately) connected to the signal lines LSGN1-T, LSGN1-B in the first column.

In the example in FIG. 16, the source contact SCNT to which the source of the transistor 130 on the first row and the first column is connected and the source contact SCNT to which the source of the transistor 130 on the fifth row and the first column is connected are connected to the signal line LSGN 1-T.

The source contact SCNT to which the source of the transistor 130 on the second row and the first column is connected and the source contact SCNT to which the source of the transistor 130 on the sixth row and the first column is connected are connected to the signal line LSGN 1-B.

The source contact SCNT to which the source of the transistor 130 on the first row and the second column is connected and the source contact SCNT to which the source of the transistor 130 on the fifth row and the second column is connected are connected to the signal line LSGN 2-T.

The source contact SCNT to which the source of the transistor 130 on the second row and the second column is connected and the source contact SCNT to which the source of the transistor 130 on the sixth row and the second column is connected are connected to the signal line LSGN 2-B.

The source contact SCNT to which the source of the transistor 130 on the first row and the third column is connected and the source contact SCNT to which the source of the transistor 130 on the fifth row and the third column is connected are connected to the signal line LSGN 3-T.

The source contact SCNT to which the source of the transistor 130 on the second row and the third column is connected and the source contact SCNT to which the source of the transistor 130 on the sixth row and the third column is connected are connected to the signal line LSGN 3-B.

The source contact SCNT to which the source of the transistor 130 on the first row and the fourth column is connected and the source contact SCNT to which the source of the transistor 130 on the fifth row and the fourth column is connected are connected to the signal line LSGN 4-T.

The source contact SCNT to which the source of the transistor 130 on the second row and the fourth column is connected and the source contact SCNT to which the source of the transistor 130 on the sixth row and the fourth column is connected are connected to the signal line LSGN 3-B.

The switch SW401 has a terminal a connected to one end portion of the signal line LSGN1-T in the first column, a terminal b connected to a power source SVDD of a power source voltage VDD, and a terminal c connected to an inverting input terminal (−) of the column circuit 400-1.

The switch SW411 has a terminal a connected to one end portion of the signal line LSGN1-B in the first column, a terminal b connected to the power source SVDD of the power source voltage VDD, and a terminal c connected to an inverting input terminal (−) of the column circuit 410-1.

The switch SW402 has a terminal a connected to one end portion of the signal line LSGN2-T in the second column, a terminal b connected to a power source SVDD of a power source voltage VDD, and a terminal c connected to an inverting input terminal (−) of the column circuit 400-2.

The switch SW412 has a terminal a connected to one end portion of the signal line LSGN2-B in the second column, a terminal b connected to the power source SVDD of the power source voltage VDD, and a terminal c connected to an inverting input terminal (−) of the column circuit 410-2.

The switch SW403 has a terminal a connected to one end portion of the signal line LSGN3-T in the third column, a terminal b connected to a power source SVDD of a power source voltage VDD, and a terminal c connected to an inverting input terminal (−) of the column circuit 400-3.

The switch SW413 has a terminal a connected to one end portion of the signal line LSGN3-B in the third column, a terminal b connected to the power source SVDD of the power source voltage VDD, and a terminal c connected to an inverting input terminal (−) of the column circuit 410-3.

The switch SW404 has a terminal a connected to one end portion of the signal line LSGN4-T in the fourth column, a terminal b connected to a power source SVDD of a power source voltage VDD, and a terminal c connected to an inverting input terminal (−) of the column circuit 400-4.

The switch SW414 has a terminal a connected to one end portion of the signal line LSGN4-B in the fourth column, a terminal b connected to the power source SVDD of the power source voltage VDD, and a terminal c connected to an inverting input terminal (−) of the column circuit 410-4.

The column circuits 400-1 to 400-4 are formed as capacitance-coupled column differential amplifiers and each include a comparator 401, a switch 402, a capacitor C401, and a constant current load circuit 1401.

The terminal c of each switch SW401 to SW404, . . . is connected to the constant current load circuit 1401 and such connecting point is connected via the capacitor C401 to the comparator 401.

The inverting input terminal (−) of the comparator 401 is connected to the capacitor C401 and the non-inverting input (+) is supplied with a reference potential. As one example, a ramp (PAMP) waveform is supplied as the reference potential.

The switch 402 used for resetting is connected between the inverting input terminal (−) and the output of the comparator 401. As one example, the switch 402 is formed of a MOS transistor.

The column circuits 410-1 to 410-4, . . . are formed as capacitance-coupled column differential amplifiers and each include a comparator 411, a switch 412, a capacitor C411, and a constant current load circuit 1411.

The terminal c of each switch SW411 to SW414, . . . is connected to the constant current load circuit 1411 and such connecting point is connected via the capacitor C411 to the comparator 411.

The inverting input terminal (−) of the comparator 411 is connected to the capacitor C411 and the non-inverting input (+) is supplied with a reference potential. As one example, a ramp (PAMP) waveform is supplied as the reference potential.

The switch 412 used for resetting is connected between the inverting input terminal (−) and the output of the comparator 411. As one example, the switch 412 is formed of a MOS transistor.

In the present embodiment, in the pixel array construction described above, instead of driving single pixels, the characteristic of the construction wherein the drain and source are shared between two pixels that are adjacent in the Y direction (row direction) is utilized and supplying is carried out via adjacent pixel cell transistors in the Y (vertical, row) direction that share a drain.

To reset, driving pulses are supplied by a single drain line LDRN connected in the X (horizontal, column) direction.

Putting this another way, in an image pickup element where supplying of the power source voltage and resetting are carried out using the same drain terminal, the supplying of the power during driving for a signal read is carried out via a pixel transistor that is adjacent in the vertical direction and for a reset, driving pulses are supplied using the drain wire connected in the horizontal direction.

Figure 17:
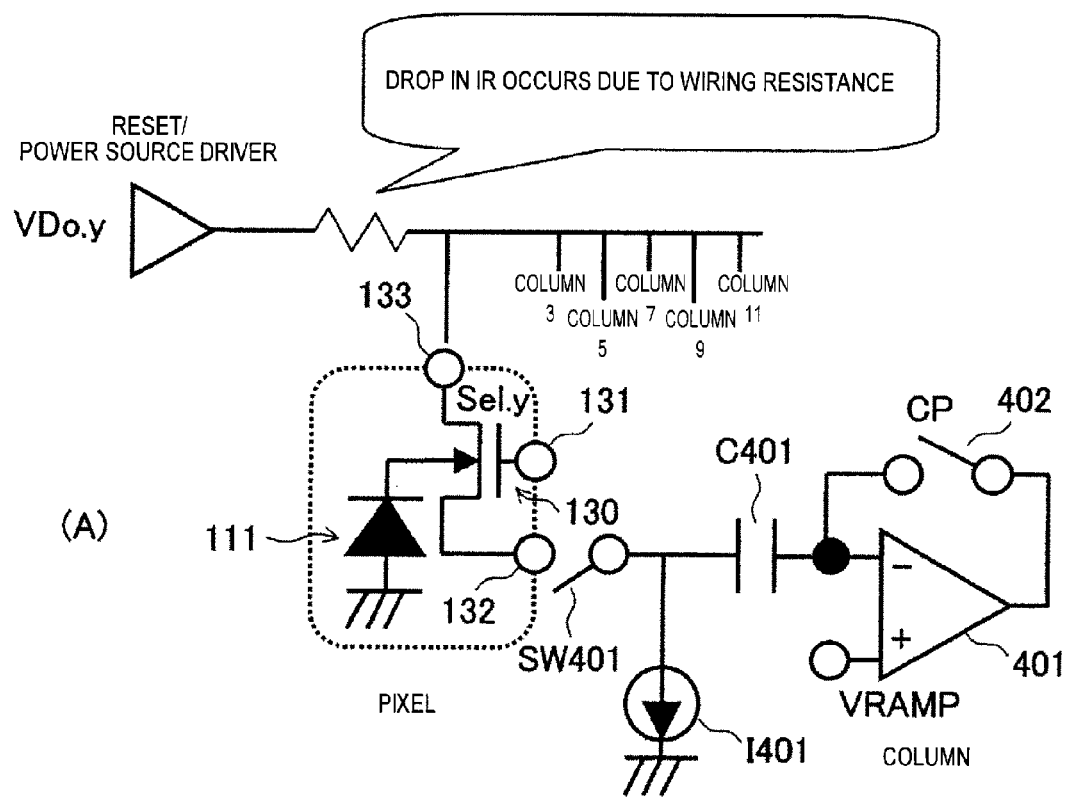
FIG. 17 is a diagram showing a case where single pixel driving is carried out on where power and reset lines are laid out in the X (horizontal) direction as shared lines as a comparative example.

FIG. 17 is a diagram showing a case where single pixel driving is carried out on where power and reset lines are laid out in the X (horizontal) direction as shared lines as a comparative example.

In FIG. 17, for ease of understanding, parts of the circuit configuration that are the same as the circuit in FIG. 16 are indicated using the same reference numerals.

For this comparative example, since the driving for a signal read is carried out using a shared line where power and reset lines are laid out in the X (horizontal) direction, when the pixel density is increased, an IR drop will occur due to the wiring resistance, resulting in the risk of insufficient driving performance.

On the other hand, with the solid-state image pickup apparatus according to the present embodiment, the supplying of power during driving for a signal read is carried out via a pixel transistor that is adjacent in the Y (vertical) direction. Also, with this solid-state image pickup apparatus, since drive pulses are supplied for a reset using a drain wire connected in the horizontal direction, the occurrence of an IR drop is suppressed and it is possible to maintain a sufficient driving performance without the driving performance becoming insufficient.

Figure 18:
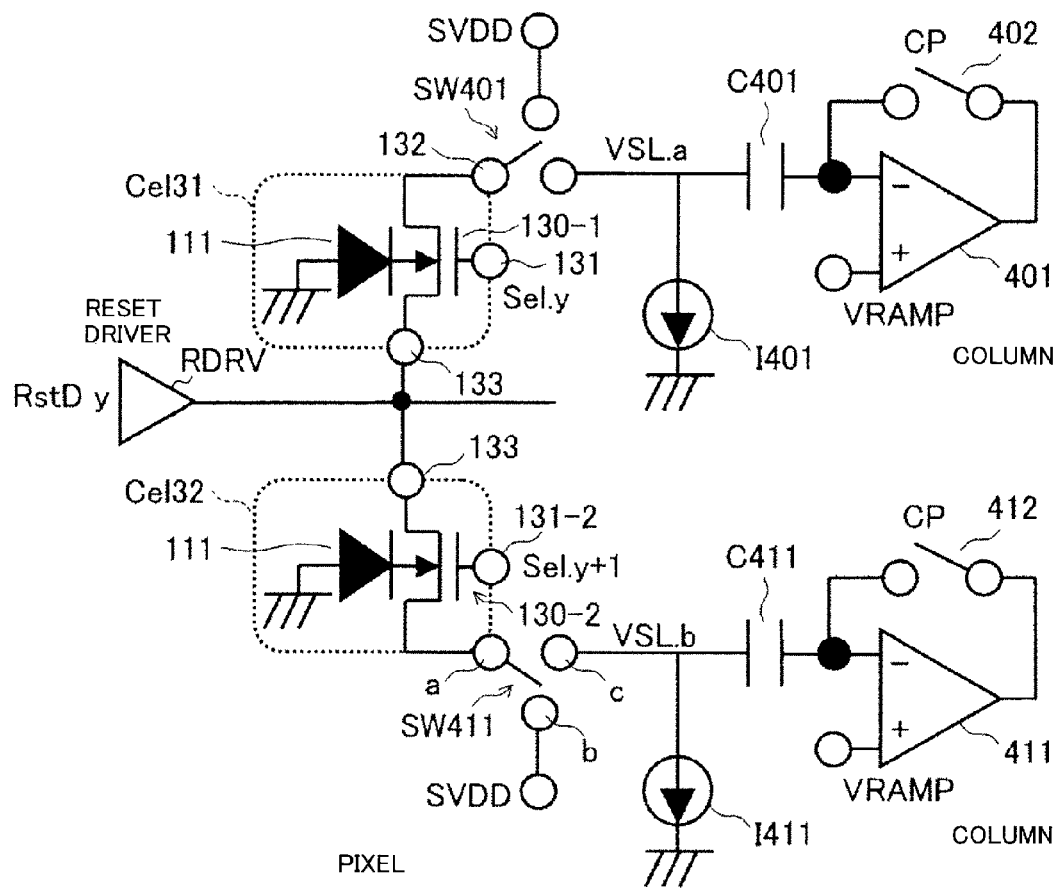
FIG. 18 is a diagram where the characteristic parts of adjacent pixel cells and a signal read system for a drain-grounded configuration of the solid-state image pickup apparatus according to the present embodiment are extracted and shown.

FIG. 18 is a diagram where the characteristic parts of adjacent pixel cells and a signal read system for a drain-grounded configuration of the solid-state image pickup apparatus according to the present embodiment are extracted and shown.

As one example, the solid-state image pickup apparatus in FIG. 18 shows the cell Cel31 and the Cel41 of group GRP2 in FIG. 16 and the signal read system thereof as an extraction.

In the present embodiment, to take advantage of the characteristics of a construction where the drain and source are shared in the layout between pixel cells that are adjacent above and below, a signal read is carried out as described below.

Out of the two cells that share a drain, when the cell Cel41 that is the adjacent pixel in the Y (vertical, column) direction to the Cel31 is set as the read pixel, the power source SVDD is connected via the switch SW401 to the source output of the adjacent pixel cell Cel31.

An overdrive voltage is then applied to the gate 131 (Sel.y) of the adjacent pixel cell Cel31 in the Y (vertical) direction so as to set the drain-source connection at on.

By doing so, since the power source SVDD becomes connected to the read pixel cell Cel41 through the adjacent pixel cell Cel31, the power source voltage VDD is supplied to every pixel from the Y (vertical) direction.

This means that it is possible to eliminate the voltage drop that occurs when power is supplied from a reset driver RDRV in the horizontal direction.

Out of the two cells that share a drain, when the cell Cel31 that is the adjacent pixel in the Y (vertical, column) direction to the Cel41 is set as the read pixel, the power source SVDD is connected via the switch SW501 to the source output of the adjacent pixel cell Cel41.

An overdrive voltage is then applied to the gate 131 (Sel.y+1) of the pixel cell Cel41 that is adjacent in the Y (vertical) direction so as to set the drain/source connection at on.

By doing so, since the power source SVDD becomes connected to the read pixel cell Cel31 through the adjacent pixel cell Cel41, the power source voltage VDD is supplied to every pixel from the Y (vertical) direction.

This means that it is possible to eliminate the voltage drop that occurs when power is supplied from a reset driver RDRV in the horizontal direction.

In this way, by supplying power source power from the adjacent pixel cell in the Y direction, supplying from the reset driver RDRV may be cut off or may be connected at the same potential.

However, the amount of overdriving changes due to fluctuations in the threshold Vth of the respective pixels, and there is the possibility of fluctuations in the drain voltage of each read pixel, which can affect the output image.

Regarding this point, by connecting the drains using a wire in the horizontal direction for a reset, there is an effect whereby the drain voltages on the horizontal line become constant, thereby producing a mechanism for absorbing fluctuations.

In particular, when photographing a subject with high luminance in certain spots, there is the risk that the overdriven state will be lost. However, by integrally connecting the drains in the horizontal (width) direction, it is possible to compensate using the driving performance of surrounding pixels via the current averaging effect, which makes it possible to maintain durability against high-luminance subjects.

In addition to the reset function, the reset wiring plays a role in averaging current.

Signal charge is held during overdriving as follows. When an overdrive voltage is applied, the channel potential becomes the drain voltage, and with the channel potential in such state, the accumulated charge increases, resulting in the signal charge being held.

Figure 19:
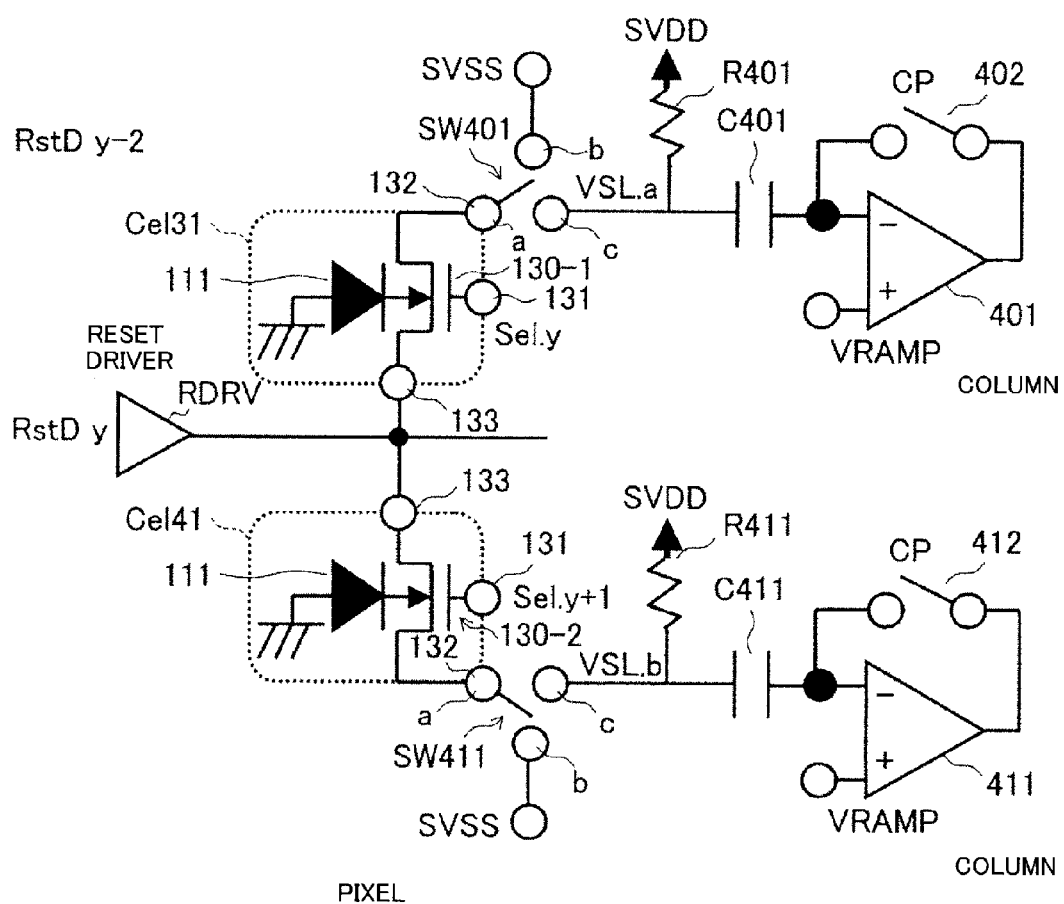
FIG. 19 is a diagram where the characteristic parts of adjacent pixel cells and a signal read system for a source-grounded configuration of the solid-state image pickup apparatus according to the present embodiment are extracted and shown.

The above description applies to a drain-grounded configuration, but it is also possible to apply the present invention to a source-grounded configuration such as that shown in FIG. 19.

FIG. 19 is a diagram where the characteristic parts of adjacent pixel cells and a signal read system for a source-grounded configuration of the solid-state image pickup apparatus according to the present embodiment are extracted and shown.

A source-grounded configuration can be realized by setting the drains in the above description as sources, the sources as drains, VDD as VSS, and changing the load circuits from constant current load circuits to constant resistance load circuits R401, R411 or the like.

As described above, according to the present embodiment, by supplying power source power from the same direction in which signals are read, it is possible to avoid the effects of an IR drop, which is suited to increasing pixel density.

By using the transistor 130 of an adjacent pixel cell in the Y (vertical) direction as a power switching transistor, it becomes unnecessary to separately provide a switching transistor, which removes one obstacle to pixel miniaturization.

By sharing horizontal reset wires, it is possible to absorb on voltage fluctuations between pixels.

In this configuration, it is possible to carry out resetting separately for odd numbers and even numbers and sample in the order odd-numbered D phase Do, odd-numbered P phase Po, even-numbered D phase De, and even-numbered P phase Pe, and by carrying out digital addition both vertically and horizontally (vertically is counter addition), addition of an arbitrary same color is possible.

Figure 20:
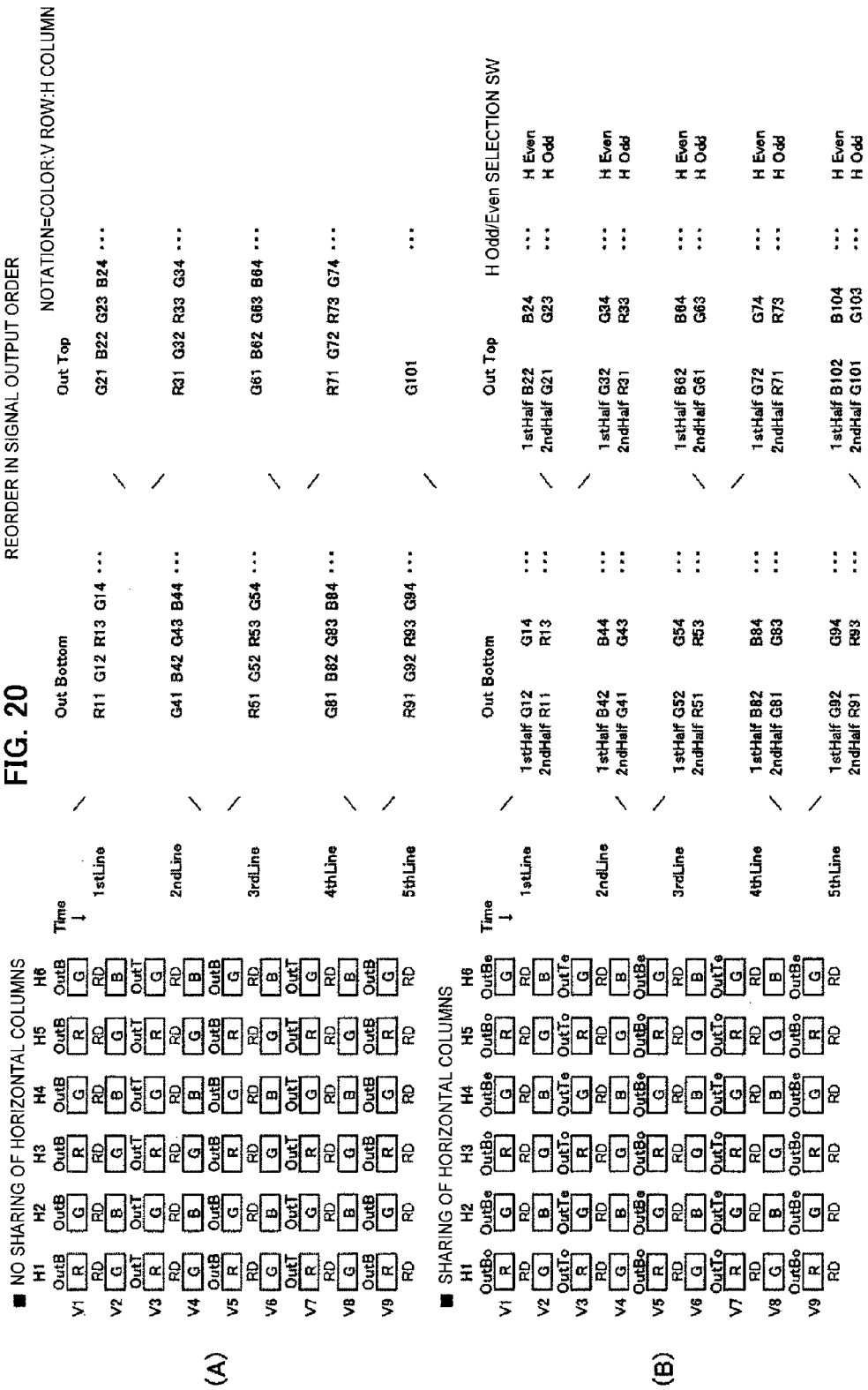
FIG. 20 is a diagram showing the signal output order for a square array like that in FIG. 15.

FIGS. 20(A) and (B) are diagrams showing the signal output order for a square array like that in FIG. 15. FIG. 20(A) shows the case where horizontal columns are not shared and FIG. 20(B) shows the case where horizontal columns are shared as shown in FIG. 16.

Note that in FIGS. 20(A), (B), the up-down direction is reversed compared to the layout diagrams to reorder in signal output order.

Also, in this example, numbers have been assigned to each row and each column as V row, H column and the output signals have been assigned numbers in keeping with the matrix array in addition to the RGB of the pixel cells. For example, the signal is given as R11 for the first row and first column and as G12 for the first row and second column.

In the case of the example in FIG. 20(A), signals are outputted in order in keeping with the pixel cell array at both the bottom side and the top side.

In the case of the example in FIG. 20(B), outputting proceeds according to time division.

For example, first the signals of the pixel cells G12, G14, ... are read out at the bottom side and the pixel cells B22, B24 are read out at the top side, and second the signals of the pixel cells R11, R13, ... are read out at the bottom side and the pixel cells G21, G23 are read out at the top side.

In this way, it is possible to carry out same-color signal reads for each color, thereby enabling same color addition for an arbitrary color.

As described above, with the example shown in FIG. 15 and FIG. 16, Gb, Gr are alternately read out at intervals of two lines, with reads being split into an odd-numbered column and an even-numbered column.

In the present embodiment, since drains are shared between two lines, parallel processing (double speed) in accordance with the up/down column array is required. Additionally, since Gr/Gb lines are alternately outputted from above and below every two lines, digital addition or 2/4 thinning out is used in the vertical direction.

By separating the horizontal reset drain (for example, into odd-numbered columns and even-numbered columns), it is possible to share two or more columns horizontally (1/n speed reduction).

Column shrinking is also possible.

In addition, by carrying out digital addition for signals in the same column in synchronization with the color coding, same color addition of an arbitrary color is possible.

FIGS. 21(A) and (B) are diagrams showing a zigzag array where a square array like that in FIG. 15 has been rotated by 45 degrees. FIG. 21(A) is a diagram showing an example of a layout of pixel cells and FIG. 21(B) is a diagram showing a pattern layout corresponding to FIG. 21(A).

Figure 21:
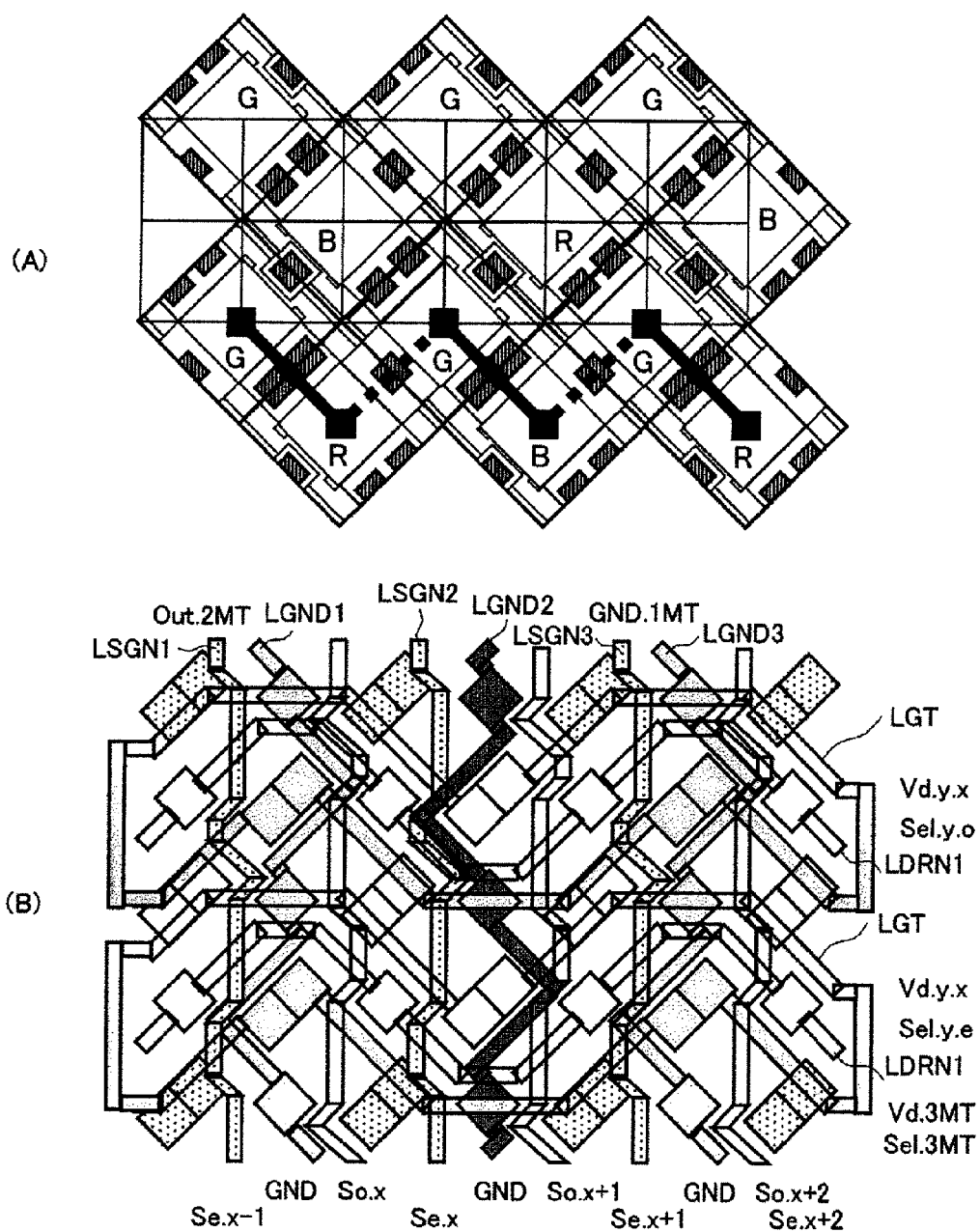
FIG. 21 is a diagram showing a zigzag array where a square array like that in FIG. 15 has been rotated by 45 degrees
Figure 22:
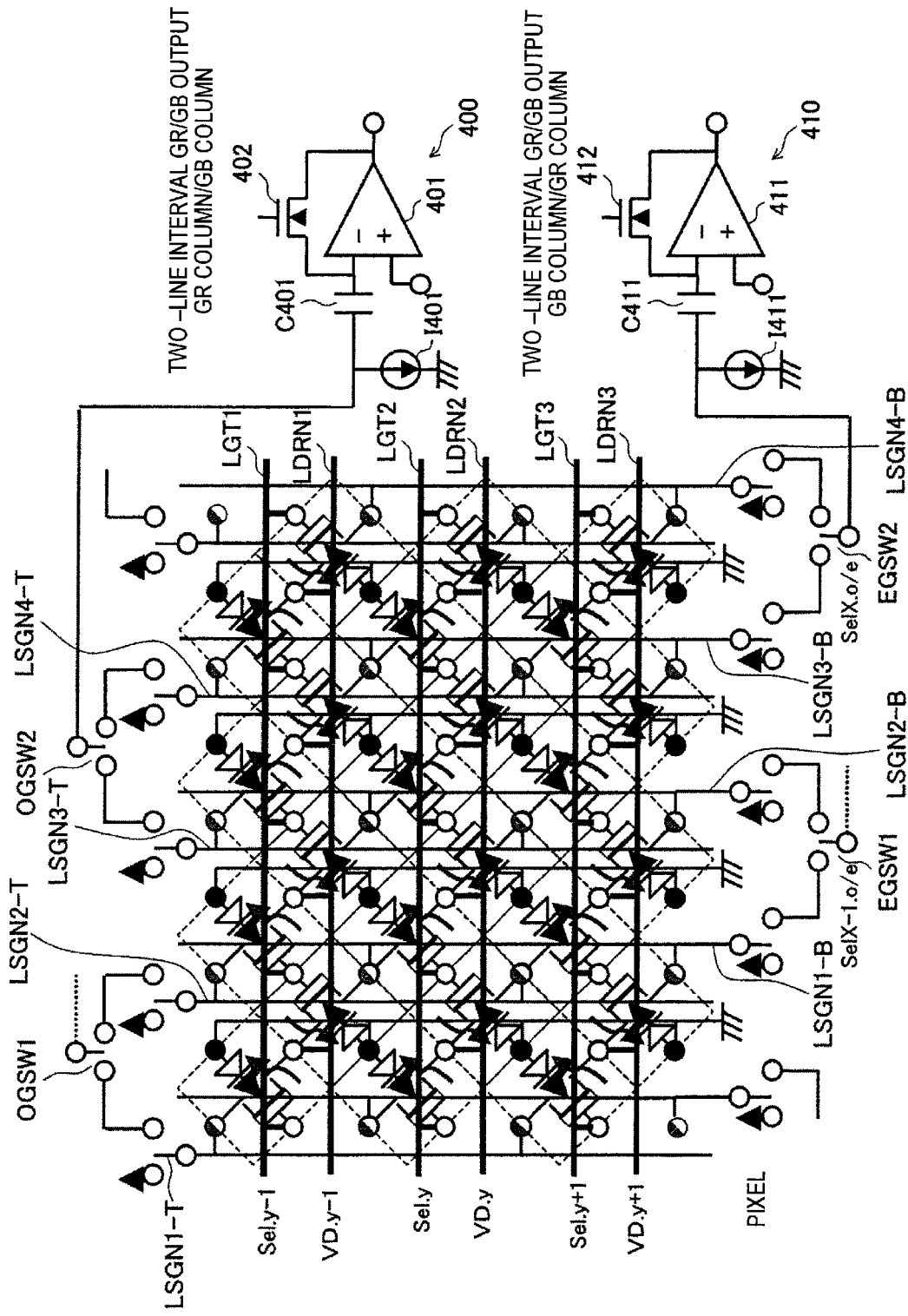
FIG. 22 is a diagram showing an equivalent circuit adapted to the layout in FIG. 21 and in which the signal processing system in which column circuits are shared and the pixel unit are simplified.

FIG. 22 is a diagram showing an equivalent circuit adapted to the layout in FIG. 21 and in which the signal processing system in which column circuits are shared and the pixel unit are simplified.

The zigzag array can be realized by simply rotating the electrodes and the construction below by 45 degrees and manipulating the wiring for the zigzag array.

In this case, the fundamental operation is the same as for the square array in FIG. 15 and FIG. 16, with it being possible to carry out resetting separately for odd numbers and even numbers and sample in the order odd-numbered D phase Do, odd-numbered P phase Po, even-numbered D phase De, even-numbered P phase Pe. By carrying out digital addition both vertically and horizontally (vertically is counter addition), addition of an arbitrary same color is possible.

FIGS. 23(A) and (B) are diagrams showing another zigzag array where a square array like that in FIG. 15 has been rotated by 45 degrees.

FIG. 23(A) is a diagram showing an example of a layout of pixel cells and FIG. 23(B) is a diagram showing a pattern layout corresponding to FIG. 23(A).

Figure 23:
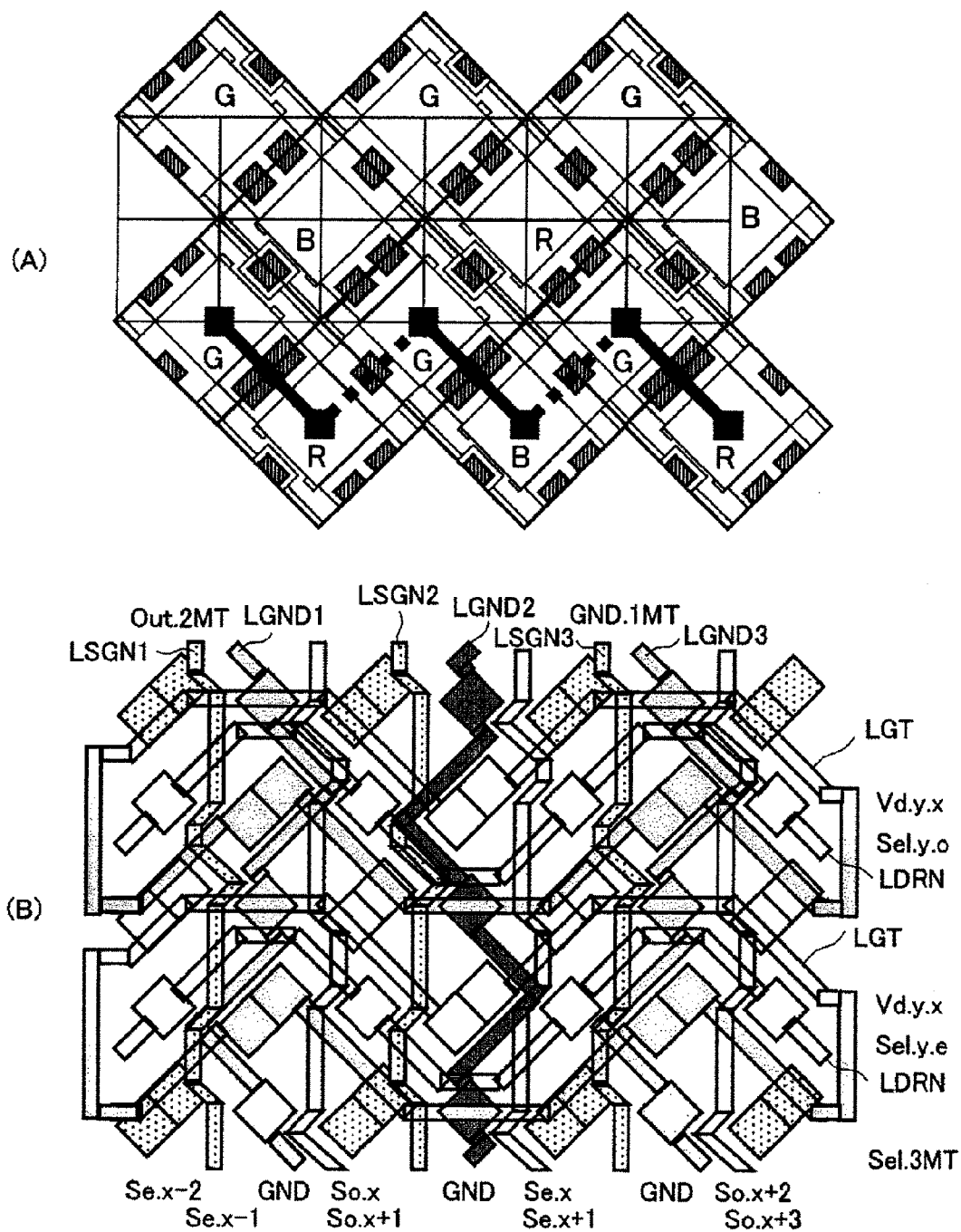
FIG. 23 is a diagram showing another zigzag array where a square array like that in FIG. 15 has been rotated by 45 degrees.
Figure 24:
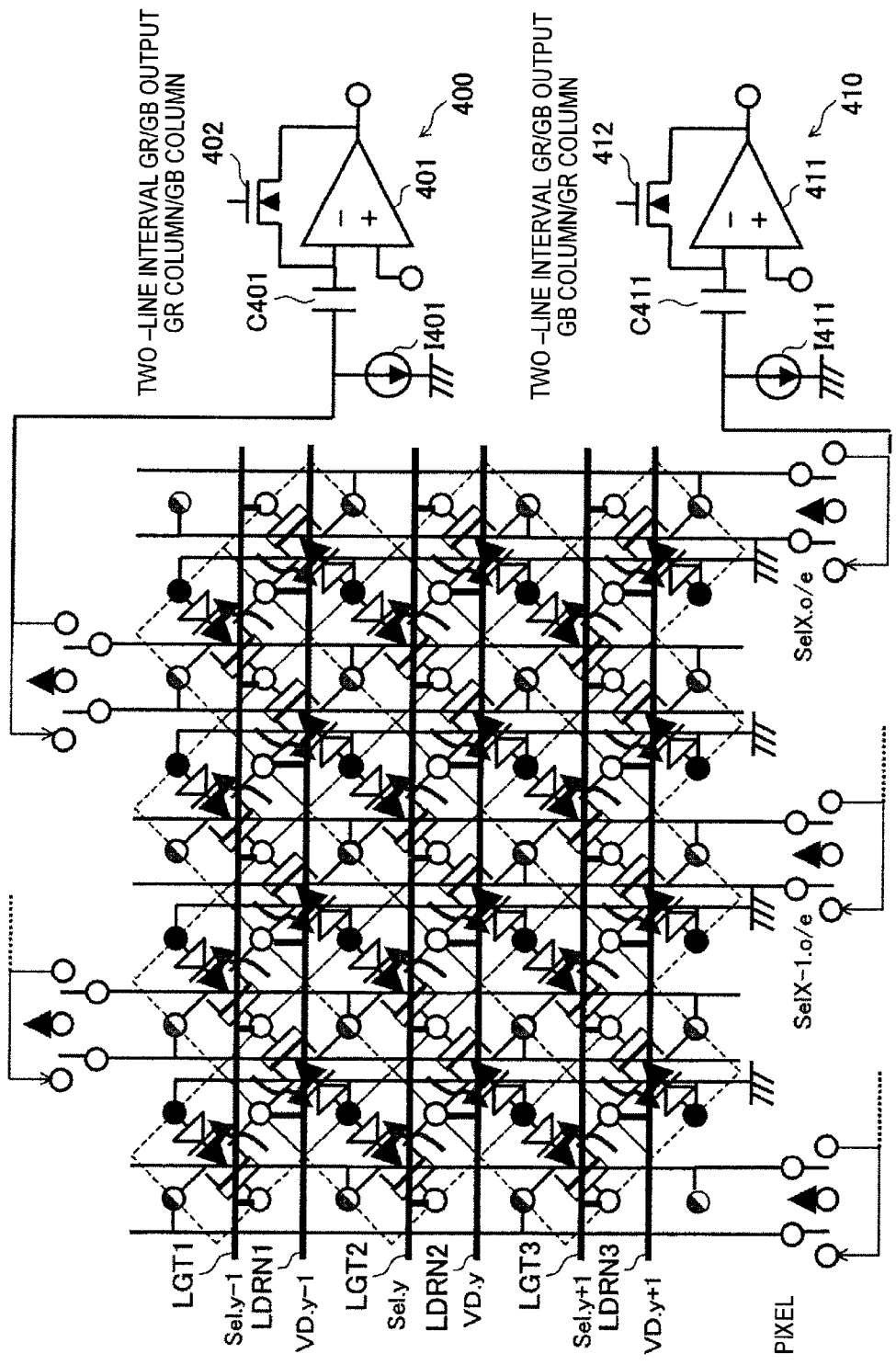
FIG. 24 is a diagram showing an equivalent circuit adapted to the layout in FIG. 23 and in which the signal processing system in which column circuits are shared and the pixel unit are simplified.

Also, FIG. 24 is a diagram showing an equivalent circuit adapted to the layout in FIG. 23 and in which the signal processing system in which column circuits are shared and the pixel unit are simplified.

Although the signal read arrangement in the example in FIG. 21 and FIG. 22 is the same as the case in FIG. 15 and FIG. 16, in the example in FIG. 23 and FIG. 24 an arrangement is used where bottom columns and top columns alternate.

In this case also, the fundamental operation is the same as the case of the square array in FIG. 15 and FIG. 16, with it being possible to carry out resetting separately for odd numbers and even numbers and sample in the order odd-numbered D phase Do, odd-numbered P phase Po, even-numbered D phase De, and even-numbered P phase Pe. In this case also, by carrying out digital addition both vertically and horizontally (vertically is counter addition), addition of an arbitrary same color is possible.

Figure 25:
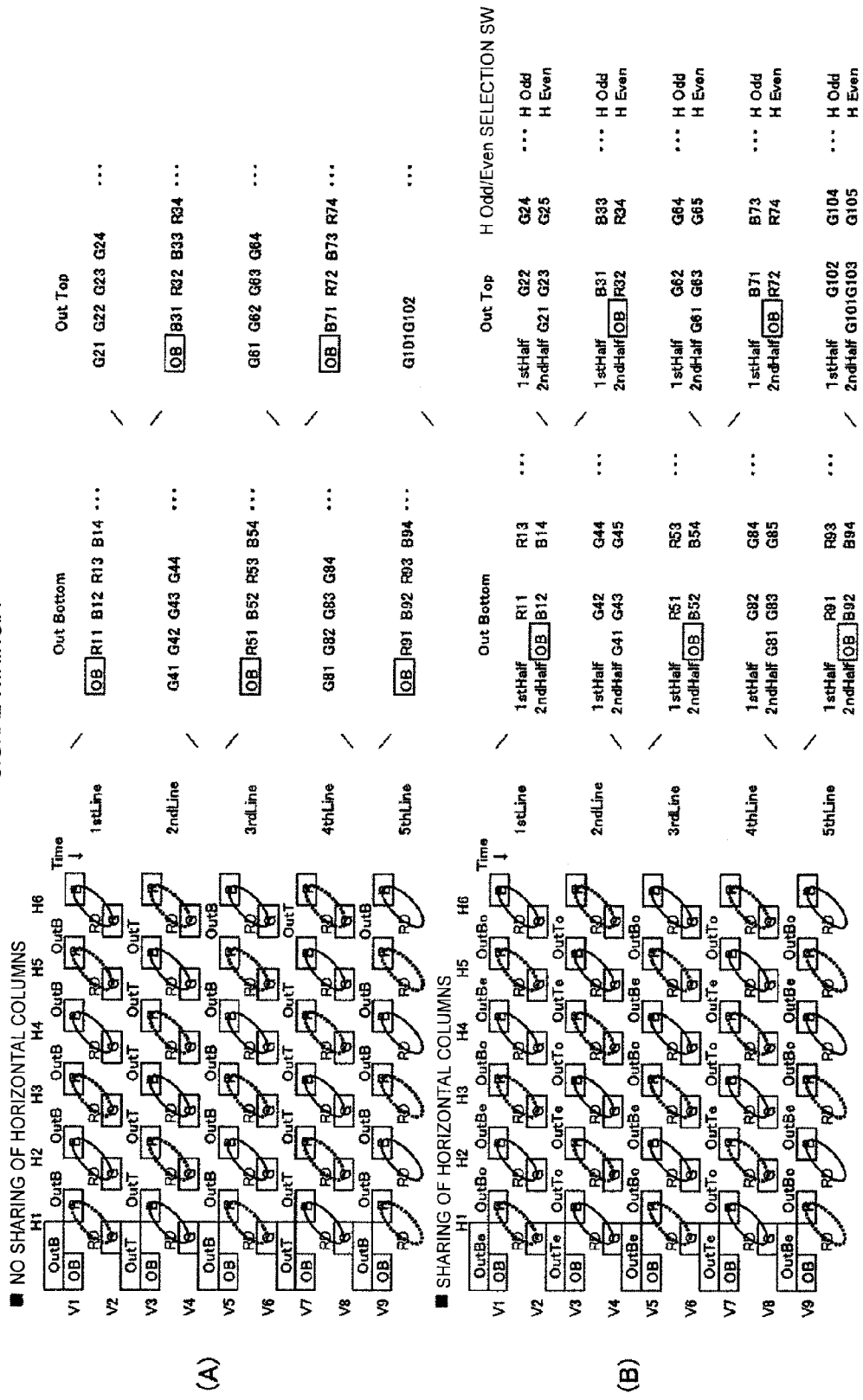
FIG. 25 is a diagram showing the signal output order for a zigzag array like that in FIG. 21.

FIGS. 25(A) and (B) are diagrams showing the signal output order for a zigzag array like that in FIG. 21. FIG. 25(A) shows the case where horizontal columns are not shared and FIG. 25(B) shows the case where horizontal columns are shared as shown in FIG. 22.

Also, in this example, numbers have been assigned to each row and each column as V row H column and the output signals have been assigned numbers in keeping with the matrix array in addition to the RGB of the pixel cells.

In the case of the example in FIG. 25(A), signals are outputted in order in keeping with the pixel cell array at both the bottom side and the top side.

In the case of the example in FIG. 25(B), outputting proceeds according to time division.

For example, first the signals of the pixel cells R11, R13, . . . are read out at the bottom side, the pixel cells G22, G24 are read out at the top side, and second the signals of the pixel cells B11, B14, . . . are read out at the bottom side, and the pixel cells G23, G25 are read out at the top side.

In this way, it is possible to carry out same-color signal reads for each color, thereby enabling same color addition for an arbitrary color.

Figure 26:
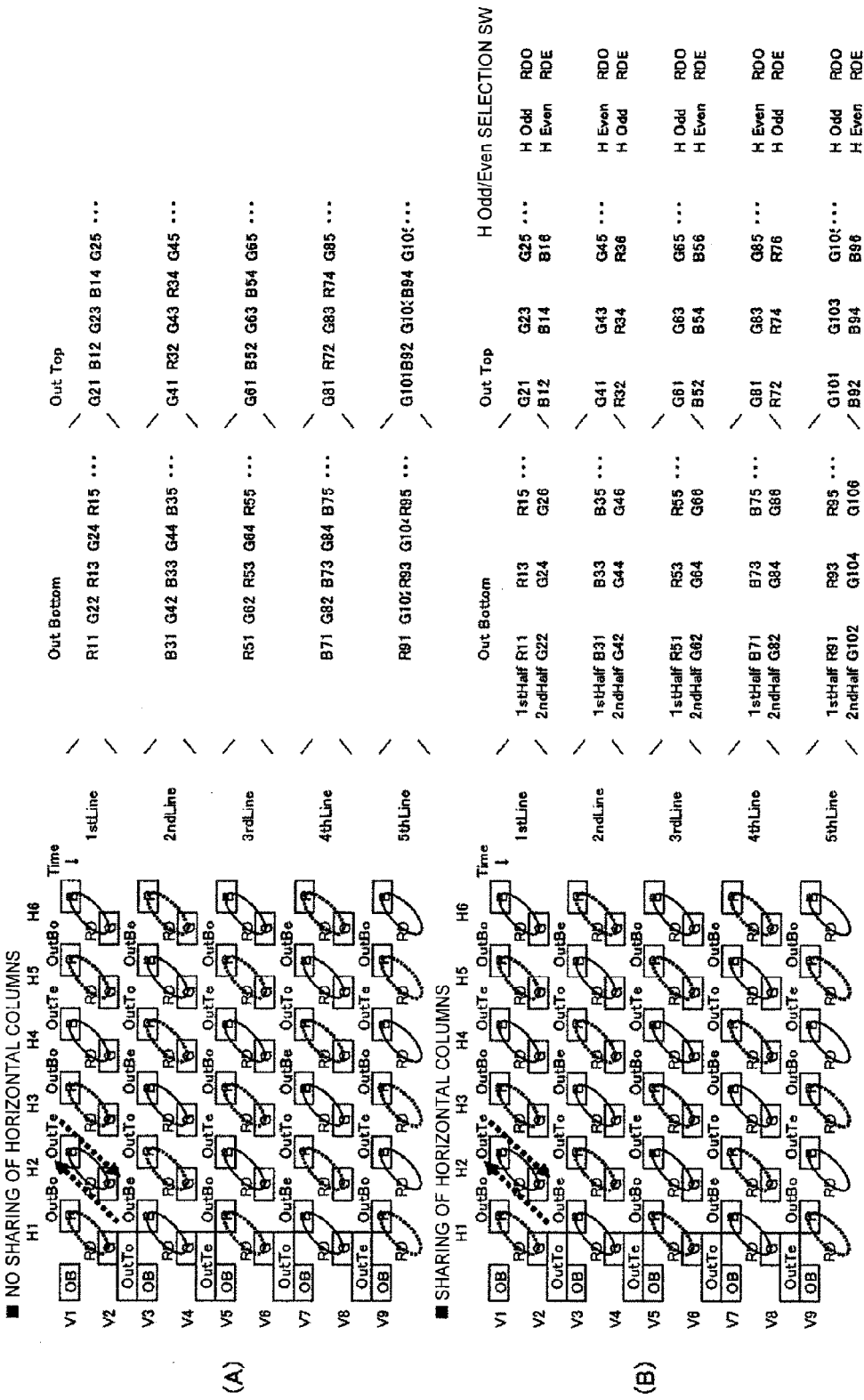
FIG. 26 is a diagram showing the signal output order for a zigzag array like that in FIG. 23.

FIGS. 26(A) and (B) are diagrams showing the signal output order for a zigzag array like that in FIG. 23. FIG. 26(A) shows the case where horizontal columns are not shared and FIG. 26(B) shows the case where horizontal columns are shared as shown in FIG. 24.

Also, in this example, numbers have been assigned to each row and each column as V row H column and the output signals are assigned numbers in keeping with the matrix layout in addition to the RGB of the pixel cells.

In the case of the example in FIG. 26(A), signals are outputted in order in keeping with the pixel cell array at both the bottom side and the top side.

In the case of the example in FIG. 26(B), output proceeds according to time division.

For example, first the signals of the pixel cells R11, R13, R15 . . . are read out at the bottom side and the pixel cells G21, G23, G25 are read out at the top side. Second, the signals of the pixel cells G22, G24, G26, . . . are read out at the bottom side and the pixel cells B12, B14, B16 are read out at the top side.

In this way, it is possible to carry out same-color signal reads for each color, thereby enabling same color addition for an arbitrary color.

This completes the description of specific examples of the pixel cell array.

Here, an example of the formation of a reflector in the case where the square array in FIGS. 15(A), (B) described above is used is described.

In the pixel cell array according to the present embodiment, it is possible to dispose the drain contact DCNT, the source contact SCNT, the gate contact GCNT, and the well (substrate) contact WCNT in four directions relative to the gate. Accordingly, as shown in FIG. 27(A), the entire light receiving region is the gate region.

Figure 27:
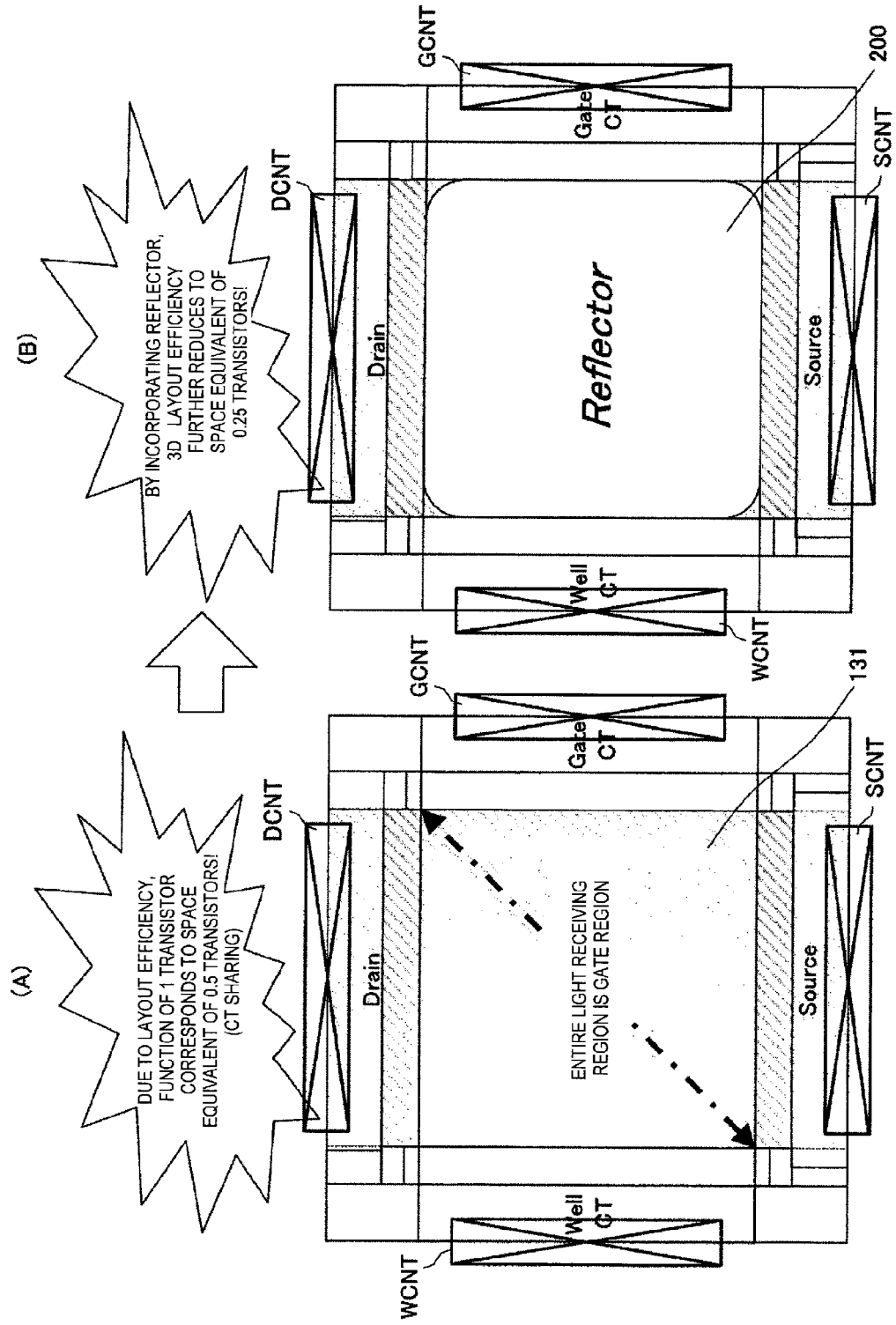
FIG. 27 is a diagram useful in explaining an example formation of a reflector that is adapted to a square array.

Accordingly, as shown in FIG. 27(B), it is fundamentally possible to form the reflector 200 so as to coincide with the entire gate region.

Meanwhile, when the square array in FIGS. 15(A), (B) is used, it is possible to form the reflector using any of the wiring in the multilayer construction.

First to third examples of this are described below.

Figure 28:
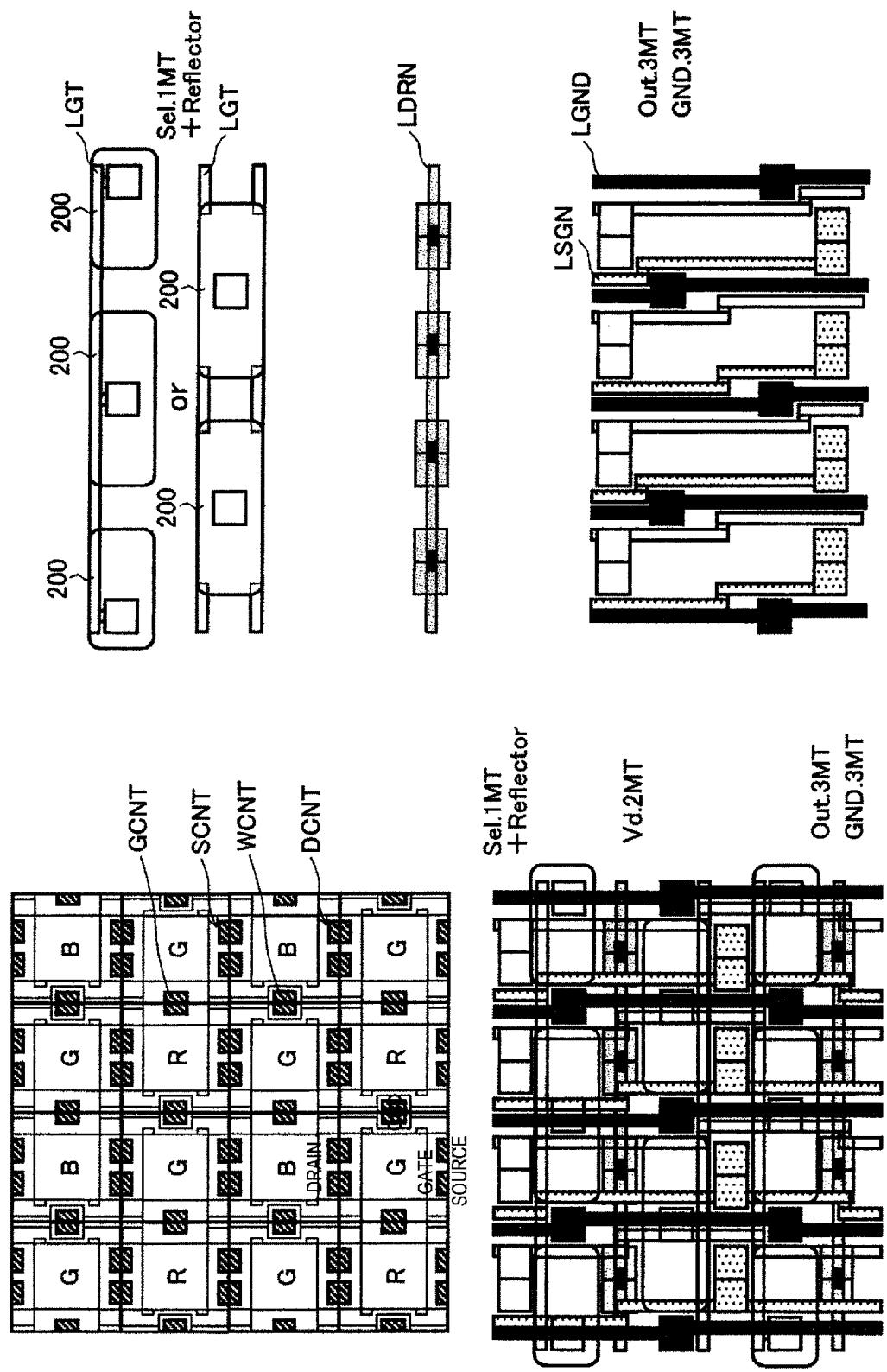
FIG. 28 is a diagram showing a first example of a reflector and a shared wiring layout.

FIG. 28 is a diagram showing a first example of a reflector and a shared wiring layout.

Figure 29:
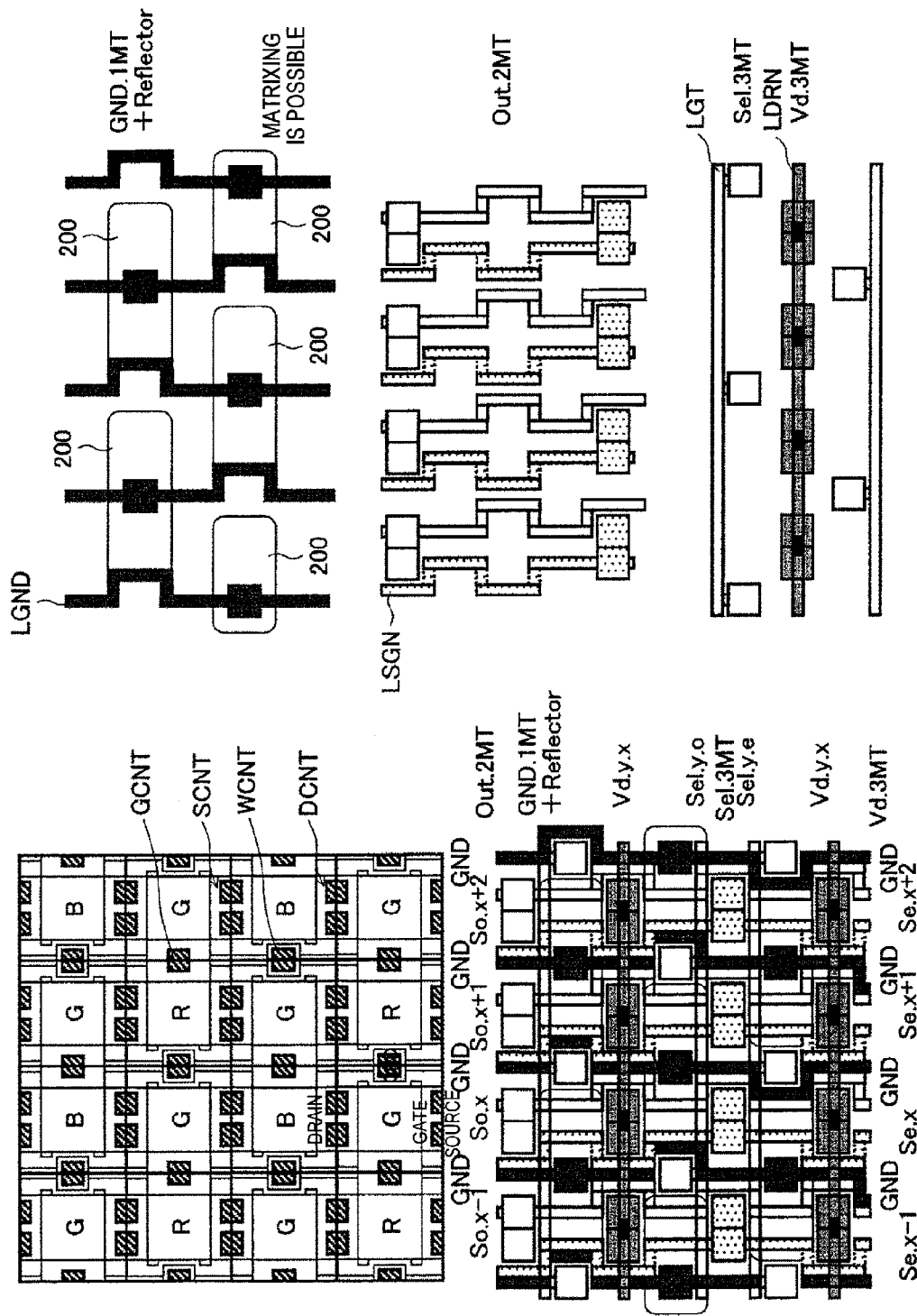
FIG. 29 is a diagram showing a second example of a reflector and a shared wiring layout.

FIG. 29 is a diagram showing a second example of a reflector and a shared wiring layout.

Figure 30:
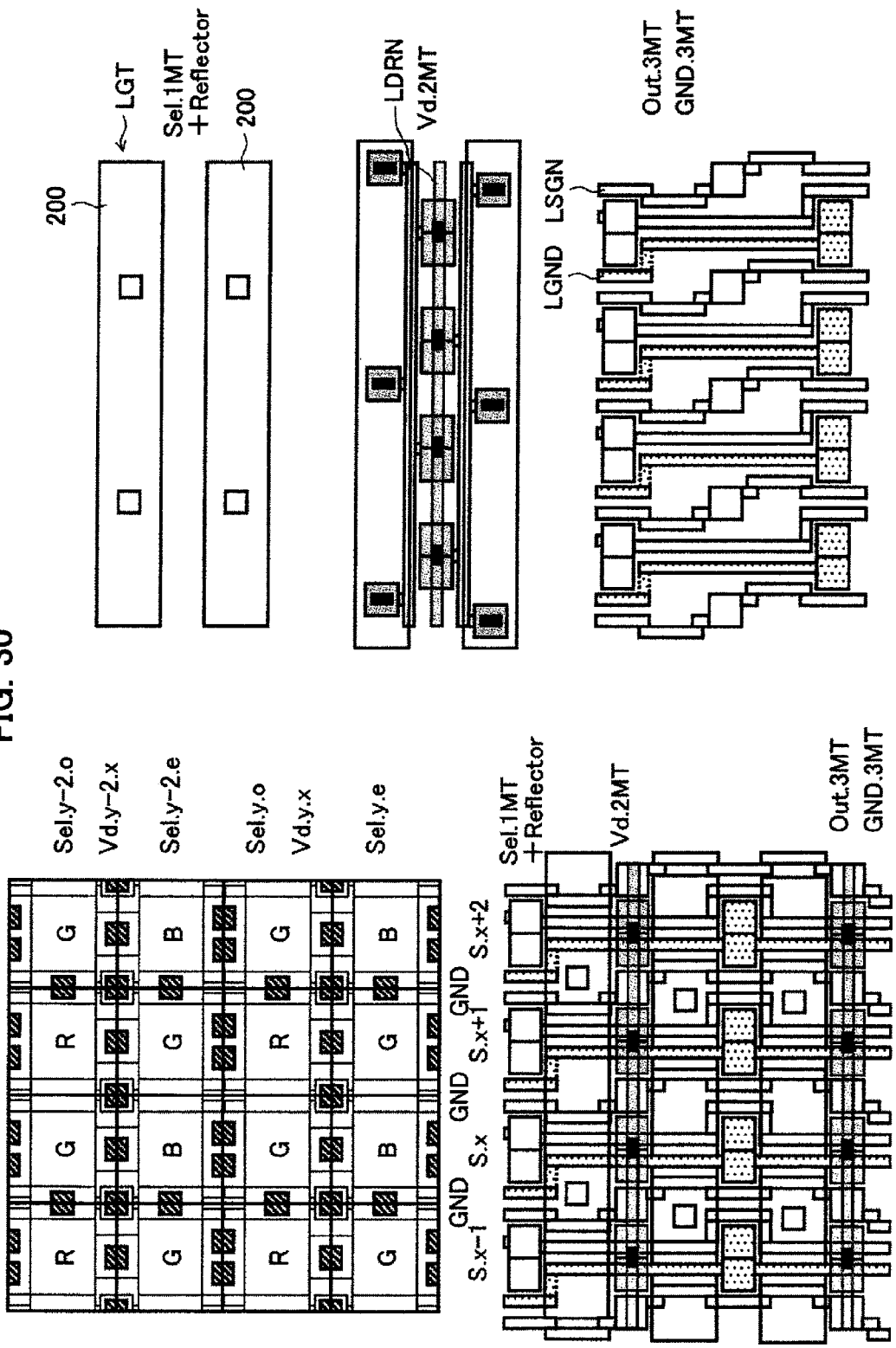
FIG. 30 is a diagram showing a third example of a reflector and a shared wiring layout.

FIG. 30 is a diagram showing a third example of a reflector and a shared wiring layout.

The first example in FIG. 28 differs to the example in FIG. 15 and is a case where the gate line LGT is first metal wiring and the drain line LDRN is second metal wiring, and the signal line LSGN and the ground line LGND are third metal wiring.

In this case, the first metal wiring of the gate line LGT is used as the reflector 200.

The reflector 200 is selectively formed corresponding to the gate regions.

In the same way as FIG. 15, the second example in FIG. 29 is a case where the ground line LGND is first metal wiring, the signal line LSGN is second metal wiring, and the gate line LGT and the drain line LDRN are third metal wiring.

In this case, the first metal wiring of the ground line LGND is used as the reflector 200.

In the same way as the example in FIG. 28, the third example in FIG. 30 is a case where the gate line LGT is first metal wiring, the drain line LDRN is second metal wiring, and the signal line LSGN and the ground line LGND are third metal wiring.

In this case, the first metal wiring of the gate line LGT is used as the reflector 200, with the reflector 200 being formed in stripes.

This completes the description of examples of the pixel cell construction, array, and formation of the reflector.

The characteristic configuration and functions of the signal processing system including the column circuit side will now be described.

First, in the present embodiment, the solid-state image pickup apparatus 1 includes a pre-line set function that uses a reset level of the previous line as a reference level of a comparator 401 (411) of a column circuit 400 (410) to improve durability against high light levels.

Figure 31:
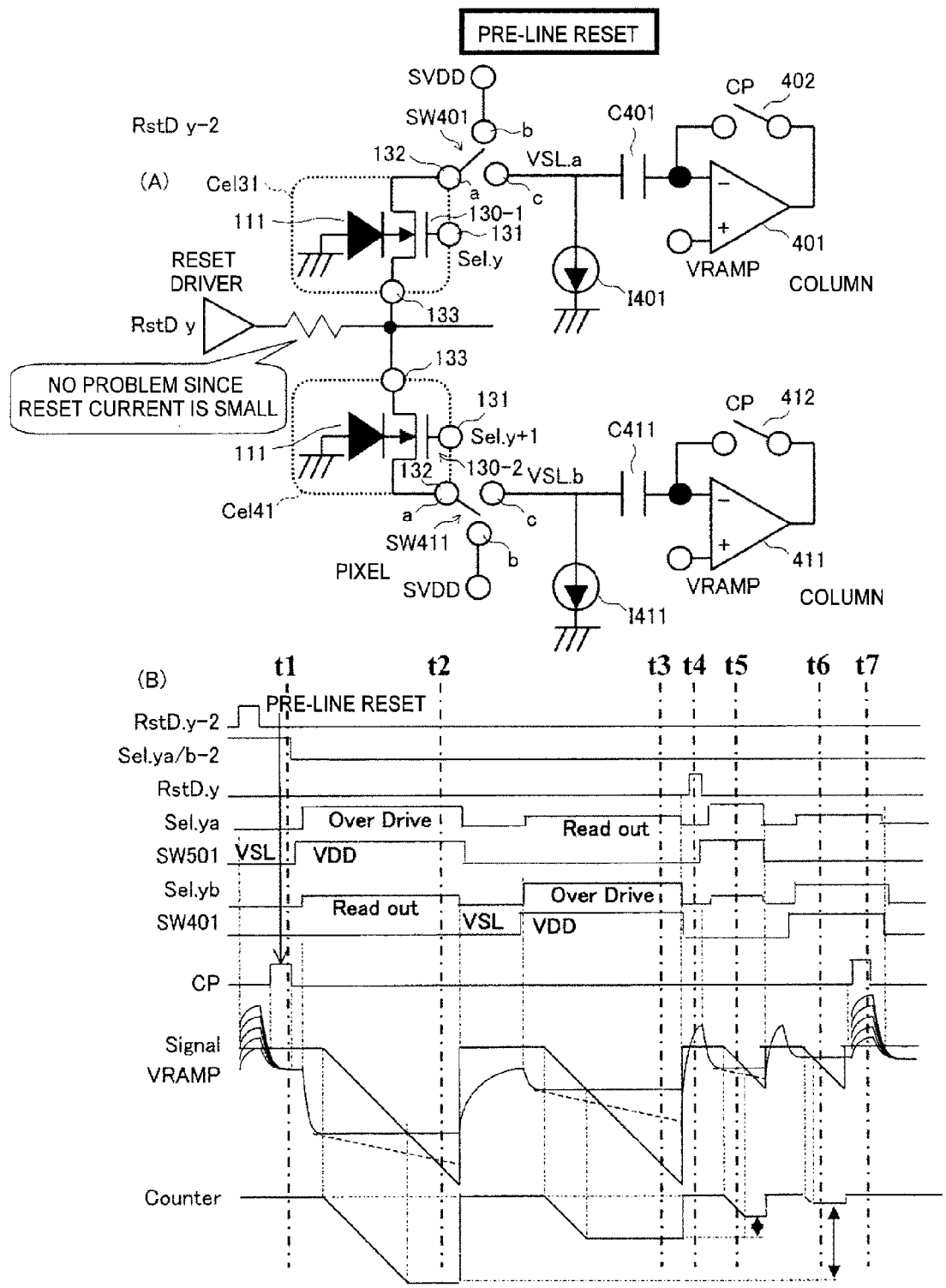
FIG. 31 is a diagram showing the fundamental concept of a pre-line set in the case of a drain-grounded configuration.

FIGS. 31(A) and (B) are diagrams showing the fundamental concept of a pre-line set in the case of a drain-grounded configuration. FIG. 31(A) shows an equivalent circuit for a drain-grounded configuration and FIG. 31(B) a timing chart, respectively.

FIGS. 32(A) and (B) are diagrams showing the fundamental concept of a pre-line set in the case of a source-grounded configuration. FIG. 32(A) shows an equivalent circuit for a source-grounded configuration and FIG. 32(B) a timing chart, respectively.

The drain-grounded equivalent circuit in FIG. 31(A) is equivalent to the circuit in FIG. 18 and the source-grounded equivalent circuit in FIG. 32(A) is equivalent to the circuit in FIG. 19.

In this case, before commencing a comparison operation with a ramp waveform VRAMP by the comparator 401 (411) (before a D phase read), the switch (SW) 402 (412) of the column circuit 400 (410) is turned on to connect the input and output of the comparator and reset the circuit.

By doing so, the reset level of the previous line is used as the reference level of the comparator 401 (411) of the column circuit 400 (410), thereby improving durability against high light levels.

Fundamentally, the operation of the drain-grounded configuration and the source-grounded configuration are the same.

Such operation will be described in time sequence order.

Time t1

In the case of a capacitance-coupled column differential amplifier using the capacitors C401, C411, it is necessary to reset the reference level, and as one example, the reference level is reset using a signal on the previous line ("pre-line reset").

Time t2

For the pixel cells Cel 31 and Cel 41 being processed, first when reading the signal of the pixel cell CeL 41, the source line of the pixel cell Cel31 of the overdrain portion is connected via the switch SW401 to the power source SVDD side.

An overdrive high voltage is then applied to the gate 131 (Sel.y) of the transistor 130-1 of the pixel cell Cel31.

As a result, the power source voltage VDD is applied to the drain line and the power source voltage is supplied to the drain of the read pixel cell Cel41.

A read voltage VreadOut that is suited to a signal read is applied to the gate 131 (Sel.y+1) of the read pixel cell Cel41, the source is connected to the VSL line via the switch SW411, and a signal voltage is generated by the constant current load circuit I411. This is received via the capacitor C411 by the comparator 411 that is a column differential amplifier.

Time t3

Next, when reading the signal of the pixel cell Cel31, the functions of the pixel cells Cel41 and Cel31 are interchanged and the source line of the overdrain unit pixel cell Cel41 is connected via the switch SW411 to the power source SVDD side.

The overdrive high voltage is then applied to the gate 131 (Sel.y+1) of the pixel cell Cel41.

As a result, the power source voltage VDD is applied to the drain line and the power source voltage is supplied to the drain of the read pixel cell Cel31.

The read voltage VreadOut that is suited to a signal read is applied to the gate 131 (Sel.y) of the read pixel cell Cel31, the source is connected to the VSL line via the switch SW401, and the signal voltage is generated by the constant current load circuit I401. This is received via the capacitor C401 by the comparator 401 that is a column differential amplifier.

Time t4

In this way, after the signal voltages have been alternately read, to find a CDS difference with an empty signal, a reset pulse is applied on the shared drain wire from the horizontal direction by the reset driver RDRV.

Such reset pulse is supplied by way of a signal RstDy.

At this time, a low voltage is applied in advance to the gates 131 (Sel.y/Sel.y+1) of the pixel cells Cel31, Cel41 to turn the source off.

Time t5

By reading the empty signal of the pixel cell Cel41 using the same sequence as time t2 and calculating the difference with the video signal by way of signal processing or the like at a later stage, digital CDS is possible.

Time t6

By reading the empty signal of the pixel cell Cel31 using the same sequence as time t3 and calculating the difference with a video signal by way of signal processing or the like at a later stage, digital CDS is possible.

Time t7

Finally, to carry out a signal scan on the next line, immediately after the empty signal read in time t6, to reset the coupled capacitance of the capacitor C401, the switch 412 is turned on by a CP pulse to have the same operation as time t1 carried out.

After this, signal read driving alternately on two lines at a time proceeds with the same cycle.

Also, in the present embodiment, a function is used to reduce residual images by carrying out a reset operation after first injecting charge into a pixel from the drain to produce a saturated state (a hard reset) immediately before a pixel reset.

FIGS. 33(A) and (B) are diagrams schematically showing a signal processing system compatible with the hard reset function according to the present embodiment. FIG. 33(A) shows an equivalent circuit and FIG. 33(B) a timing chart, respectively.

In this case, the transistor Q411, the capacitor C411, and current sources 1412, 1413, are disposed between the switch SW411 (SW401) and the capacitor C411 (C4019 disposed between the signal transfer line and the column circuit 410 (400).

For the transistor Q411, the drain is connected to the power source potential, the source is connected to the capacitor C411 (C401) and a capacitor C412 is connected via a switch SW412 between such connecting point and a ground line.

The current source 1411 is connected via a switch SW413 to the source of the transistor Q411 and the current source 1413 is connected to the gate of the transistor Q411. The gate of the transistor Q411 is connected to the switch SW411.

A hard reset is a state where the source voltage VS is a high impedance Hi-Z or LD and the accumulated electrons overflow (OF) when the gate voltage VG of the transistor 130 is set at 0V to –1.0V and the drain voltage VD at 1.8V. That is, the pixel cell Cel is saturated. The signal at such time is held.

After this, during a reset operation, the gate voltage VG of the transistor 130 is set at 0V to –1.0V and the drain voltage VD at 3.0V or above, for example 3.7V. In such case, the source voltage VS is a high impedance Hi-Z or LD and the electrons present in the accumulation well are discharged to the outside through the drain electrode.

In this case, by carrying out analog sampling on the signal side only to avoid a leak to the signal side which would extend the sampling time, carrying out the CDS digitally, and the like, a large improvement is obtained by adding one capacitor.

For example, with a combination of analog sampling of D phase and digital sampling of P phase, it is possible to improve the durability against high light levels with a small size.

Note that a circuit configuration corresponding to analog SHD and digital CDS can also be applied to a pixel cell with a so-called floating diffusion (FD) configuration.

Also, in the present embodiment, pixel cells are actively provided with a γ characteristic. Corresponding to this, a transistor with a back gate terminal of the same construction as the transistor 130 of a pixel cell is used to configure an inverse γ correction circuit.

Figure 34:
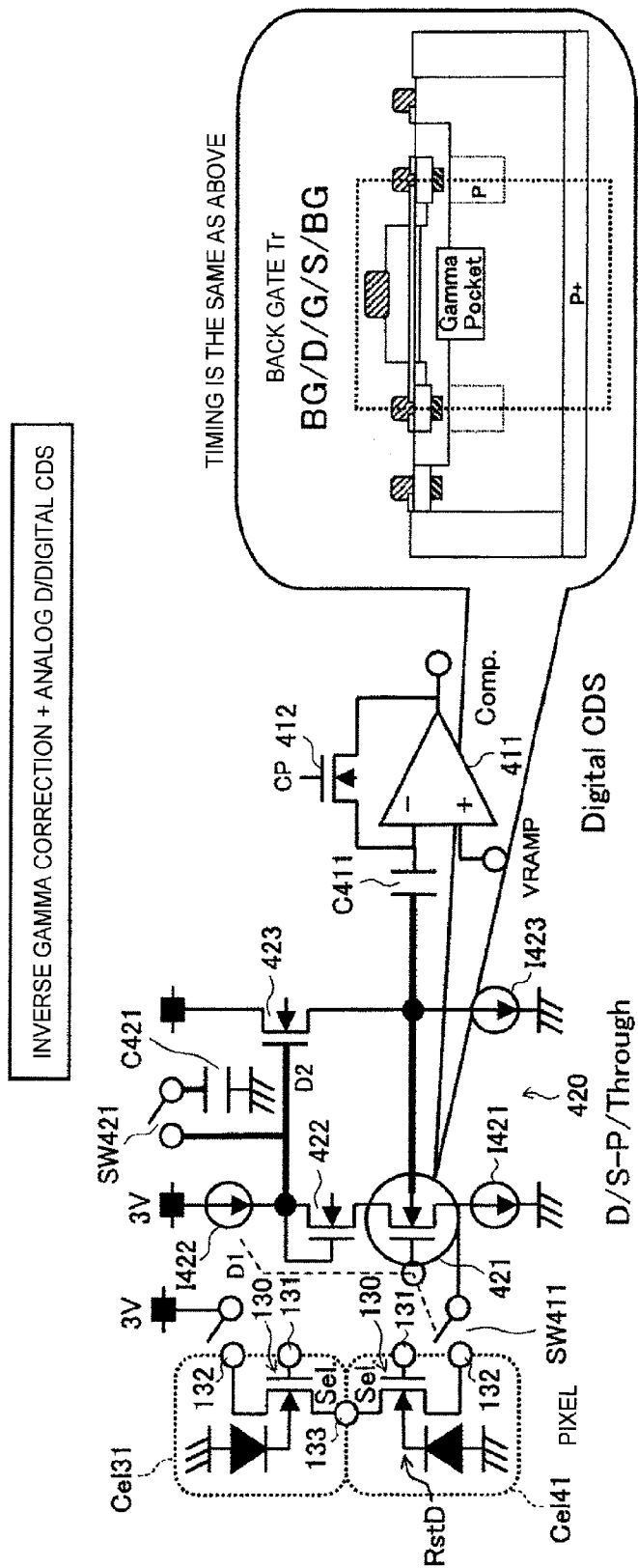
FIG. 34 is an equivalent circuit diagram showing the fundamental concept of a signal processing system including an inverse γ correction circuit.

FIG. 34 is an equivalent circuit diagram showing the fundamental concept of a signal processing system including an inverse γ correction circuit.

The inverse γ correction circuit 420 includes a transistor 421 that has a back gate terminal, transistors 422, 423 that configure a current mirror, a switch SW421, a capacitor C421, and current sources I421, I422, and I423.

The source of the transistor 421 and the current source 1421 are connected and the connecting point is connected to the switch SW401. The drain of the transistor 421 is connected to the source of the transistor 422. The gate and the drain of the transistor 422 are connected to one another and such connecting point is connected to the current source 1422, the gate of the transistor 423, and the switch SW421.

The drain of the transistor 423 is connected to the power source potential, the source is connected to the current source 1423, and the substrate of the transistor 421 and the capacitor C401 are connected to such connecting point. The capacitor C421 is also connected to the switch SW421.

Since the timing chart is the same as FIG. 33(B), no illustration is given here.

The γ characteristic is dropped using the inverse γ correction circuit 420, that is, analog/digital conversion is carried out to make the nonlinearity of the γ characteristic linear.

In this way, the signal processing system according to the present embodiment has the characteristics described above.

With a typical column digital CDS/ADC, CDS/ADC is carried out slowly using one H (horizontal) period, a signal memory memorized in an FD is assumed.

However, with a threshold modulation technique, since signal changes occur due to the received light even during a CDS/ADC, when a high speed electronic shutter is used in high light conditions, there is the risk of signal errors and floating blacks.

Typically, such phenomena are avoided with a high-speed analog CDS, but with the present technique, since correction of the black level taking into account the shutter speed and the signal magnitude is also conceivable, such phenomena are not thought to be especially problematic with electronic shutter speeds in a practical range.

As described earlier, by carrying out analog sampling on the signal side only and the like to avoid a leak to the signal side which would extend the sampling time, a large improvement is obtained by adding one capacitor.

It is also possible to achieve compatibility with a column digital CDS reset using a pre-line reset technique that uses the reset level of the previous line.

Figure 35:
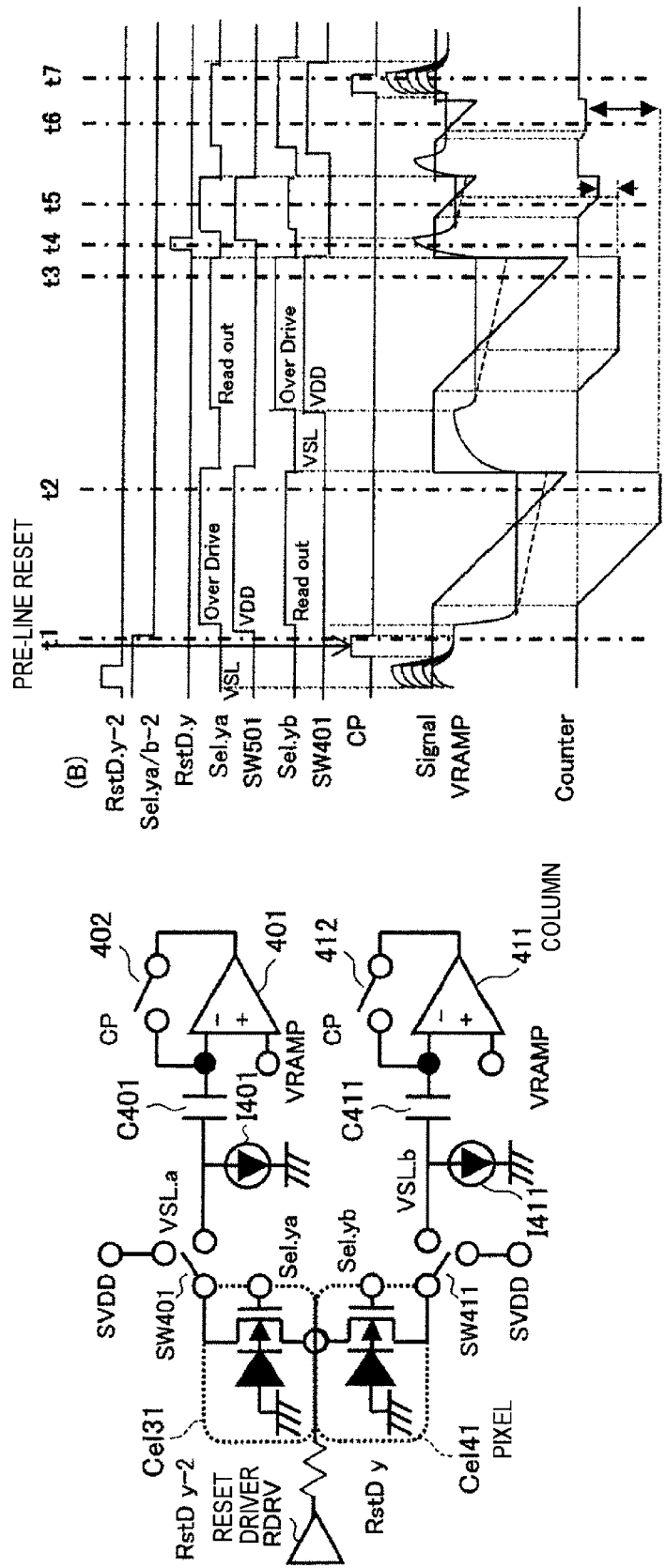
FIG. 35 is a diagram collectively showing a level diagram, 2-column sharing, and 2×2 pixel timing for the pre-line reset technique.

FIGS. 35(A) and (B) are drawings collectively showing a level diagram, 2-column sharing, and 2×2 pixel timing for the pre-line reset technique.

FIG. 35(A) shows the operational voltage and FIG. 35(B) shows an example of a still image sequence for two column sharing.

Figure 36:
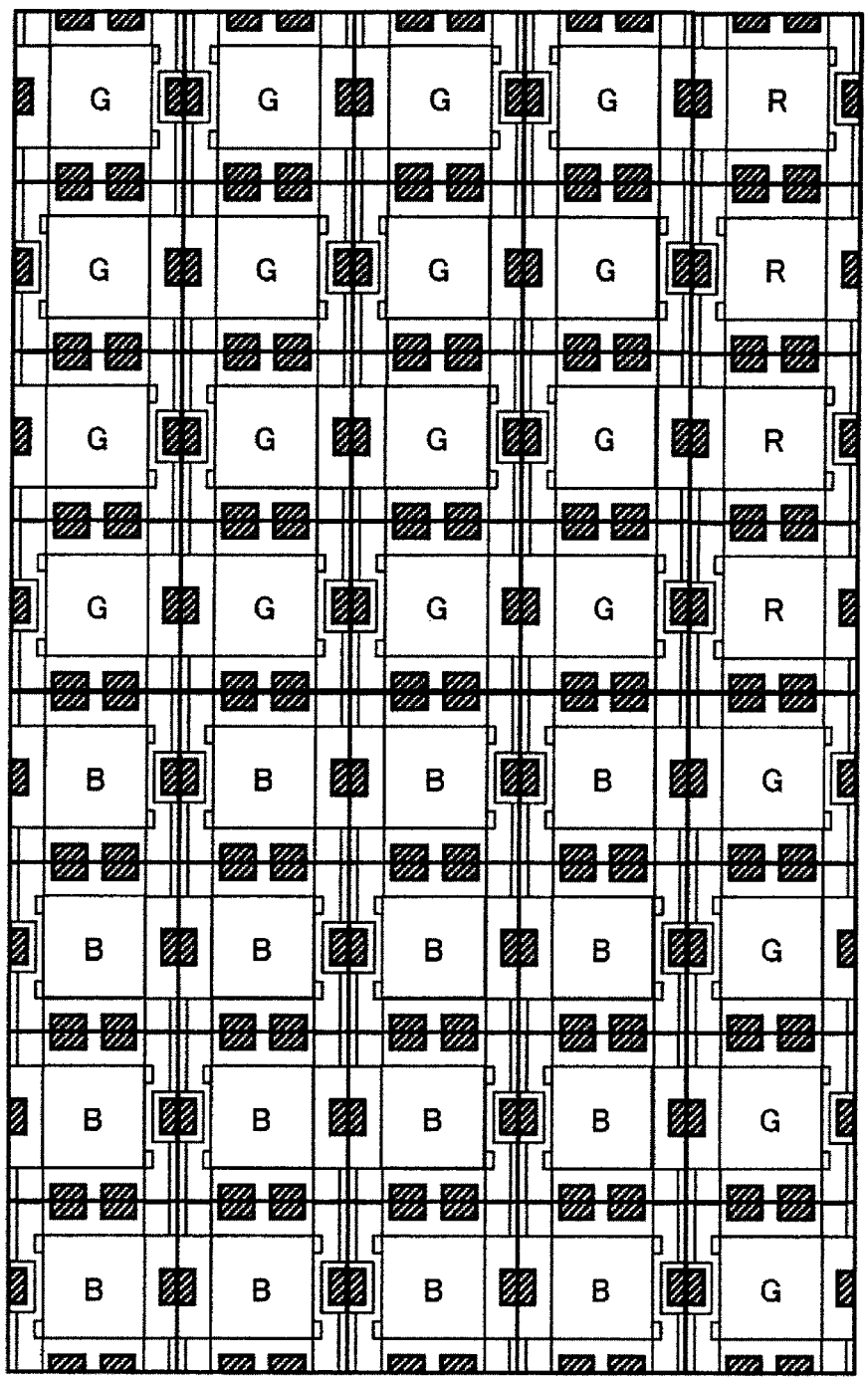
FIG. 36 is a plan view showing an example configuration where a plurality of pixels are disposed in an array and one output signal is produced by the plurality of pixels.

Also, with the present embodiment, as shown in FIG. 36 for example, by arranging the pixel cells (transistors) in an array and producing one output signal using a plurality of pixels, it is possible to achieve a high Qs/low noise dynamic range (D-Range).

The method of producing one output signal may be implemented inside the solid-state image pickup element or by a signal processing IC outside the element. When implemented by a signal processing IC outside the element, there are advantages such as the ability to correct defective pixels.

Figure 37:
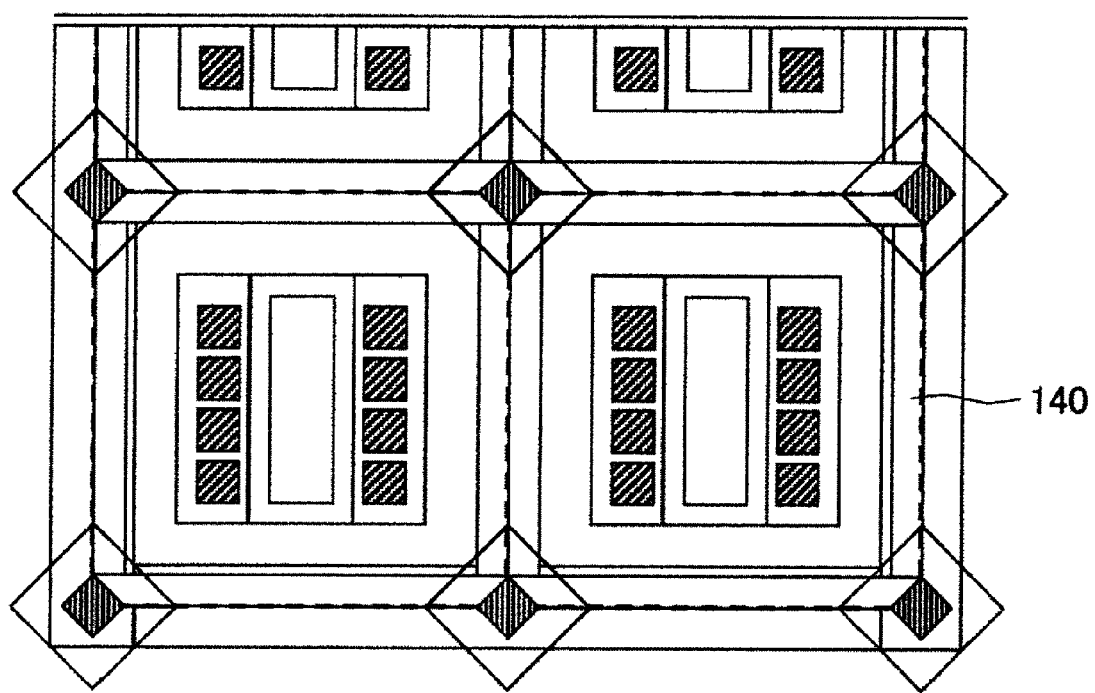
FIG. 37 is a plan view showing an example configuration where a plurality of pixels are disposed in an array and the element is separated in units of a plurality of pixels to produce one output signal.

Also, with the present embodiment, as shown by the plan view in FIG. 37 and the simplified cross-sectional view in FIG. 38(A) for example, with the premise of ultimately producing one output, the element is separated into units of a plurality of pixels so that signals may be mixed within the plurality of pixels laid out in an array. By doing so, it is possible to further expand the sensor accumulation region and achieve a high dynamic range (D-Range).

Also, according to the present embodiment, as shown in the simplified cross-sectional view in FIG. 38(B) for example, the color filter coding inside a plurality of pixels disposed in an array is not the same colors but a complementary color, for example, magenta for the primary colors B (Blue) and R (Red).

As a result, it becomes possible to use complementary color signal processing that was used in a camcorder or the like, which gives the same color reproduction performance as when primary colors are used and is beneficial for mass production since the color filter materials can be shared.

Figure 39:
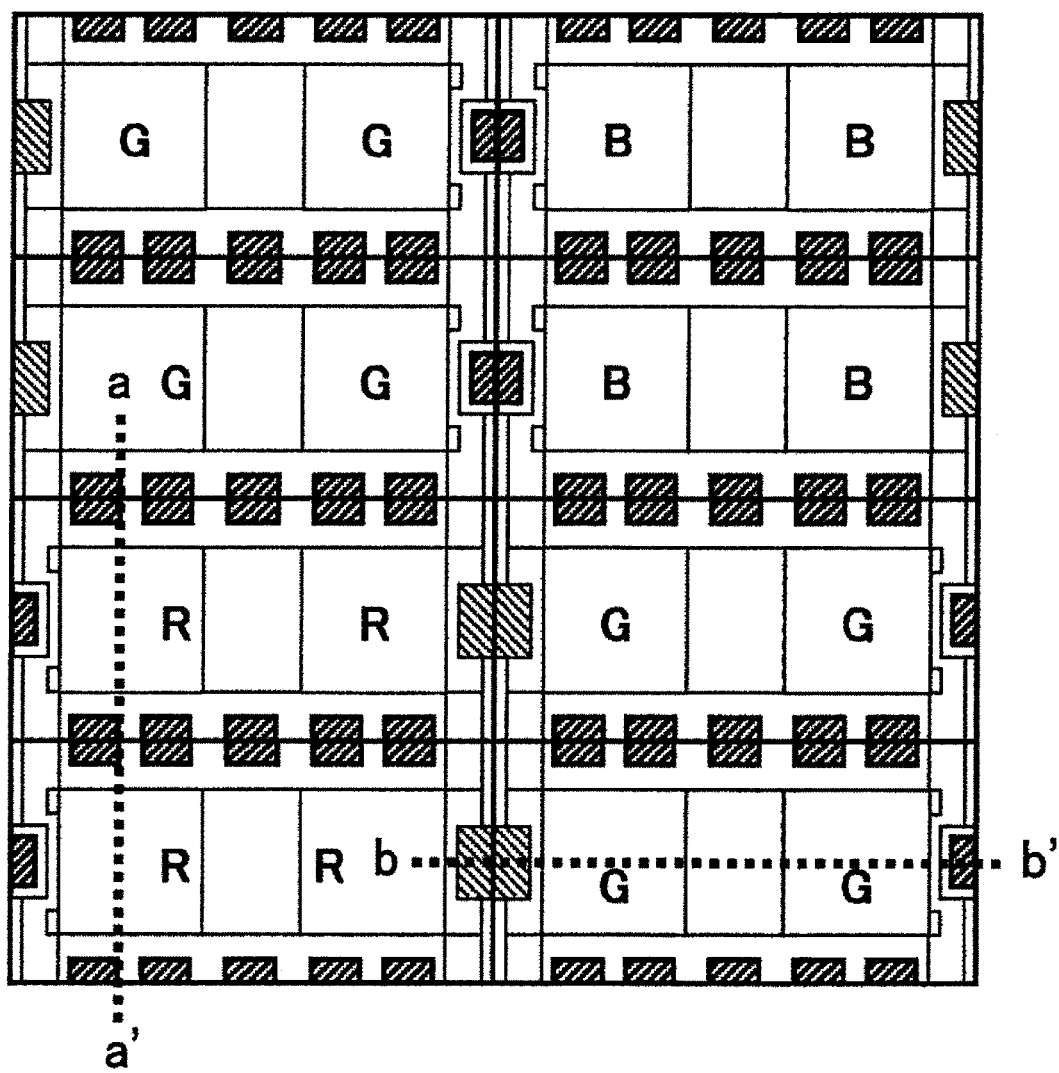
FIG. 39 is a plan view showing another example configuration where a plurality of pixels are disposed in an array and the element is separated in units of a plurality of pixels to produce one output signal.

In addition, with the present embodiment, as shown in FIG. 39 and FIG. 40(A), (B) for example, pixel cells that share one or a plurality of the drain, source, substrate (well), and/or gate contacts with adjacent pixel cells can use the configuration described below.

That is, with a construction where the element is separated in units of a plurality of pixels, since the element separation p-well below the reset drain is omitted, there is the effect that it is possible to lower the reset voltage.

Also, the solid-state image pickup apparatus 1 according to the present embodiment has a configuration that is capable of a nondestructive read without deterioration in dark current by continuing the photoelectric conversion without performing a pixel reset during a signal read from a pixel.

By carrying out a nondestructive read, as examples it is possible to realize a wide dynamic range (Wide D-Range) with a high S/N and a live view function during low speed exposure or bulb exposure.

Also, by carrying out a nondestructive read, a variety of implementations are possible, such as still image low speed exposure carried out simultaneously and asynchronously or synchronously with video, simultaneous use of AE and AF, and real-time AE/AF at random across the entire area through a high-speed partial scan.

Figure 41:
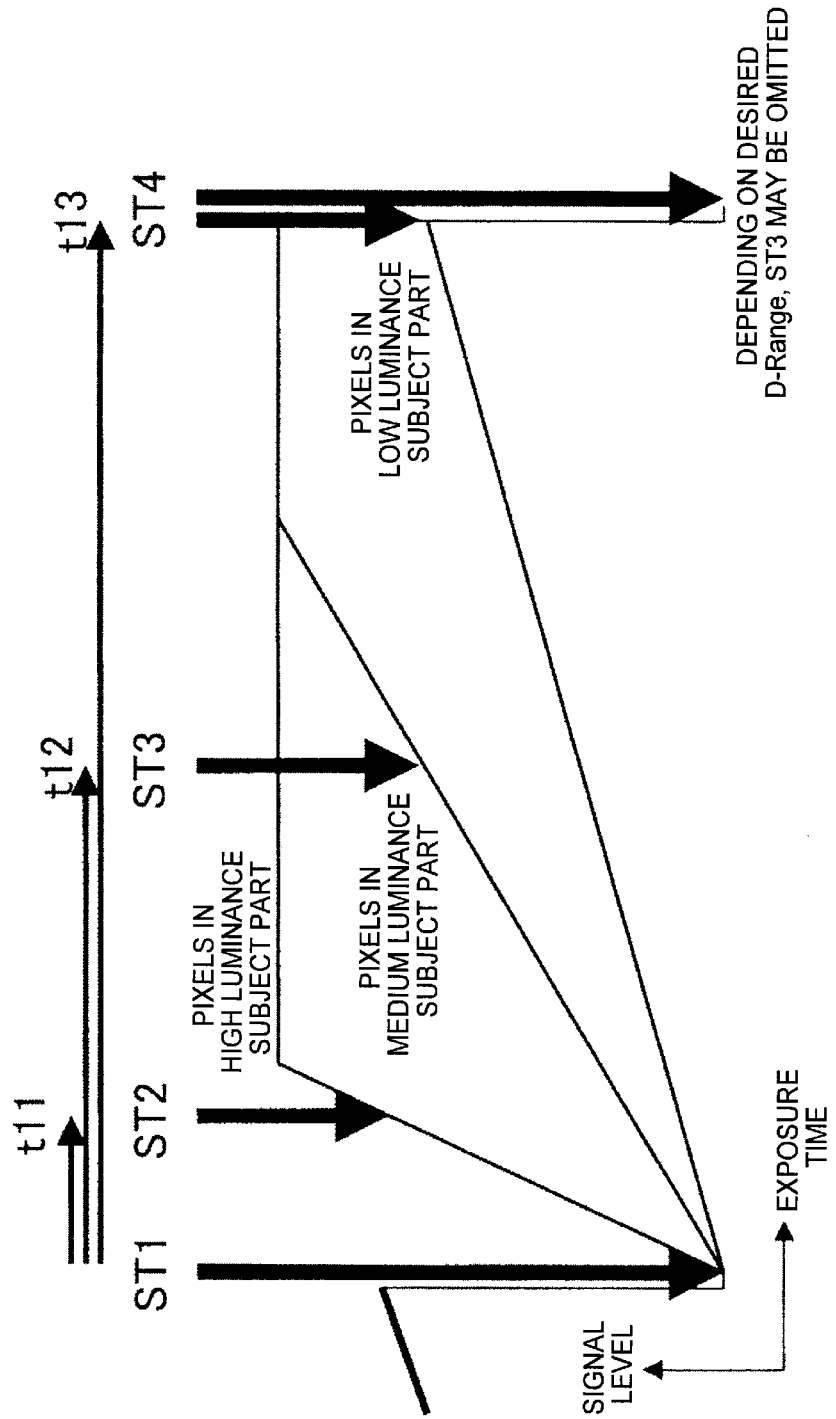
FIG. 41 is a diagram showing an example of a wide dynamic range (Wide D-Range) sequence using a nondestructive read.
Figure 42:
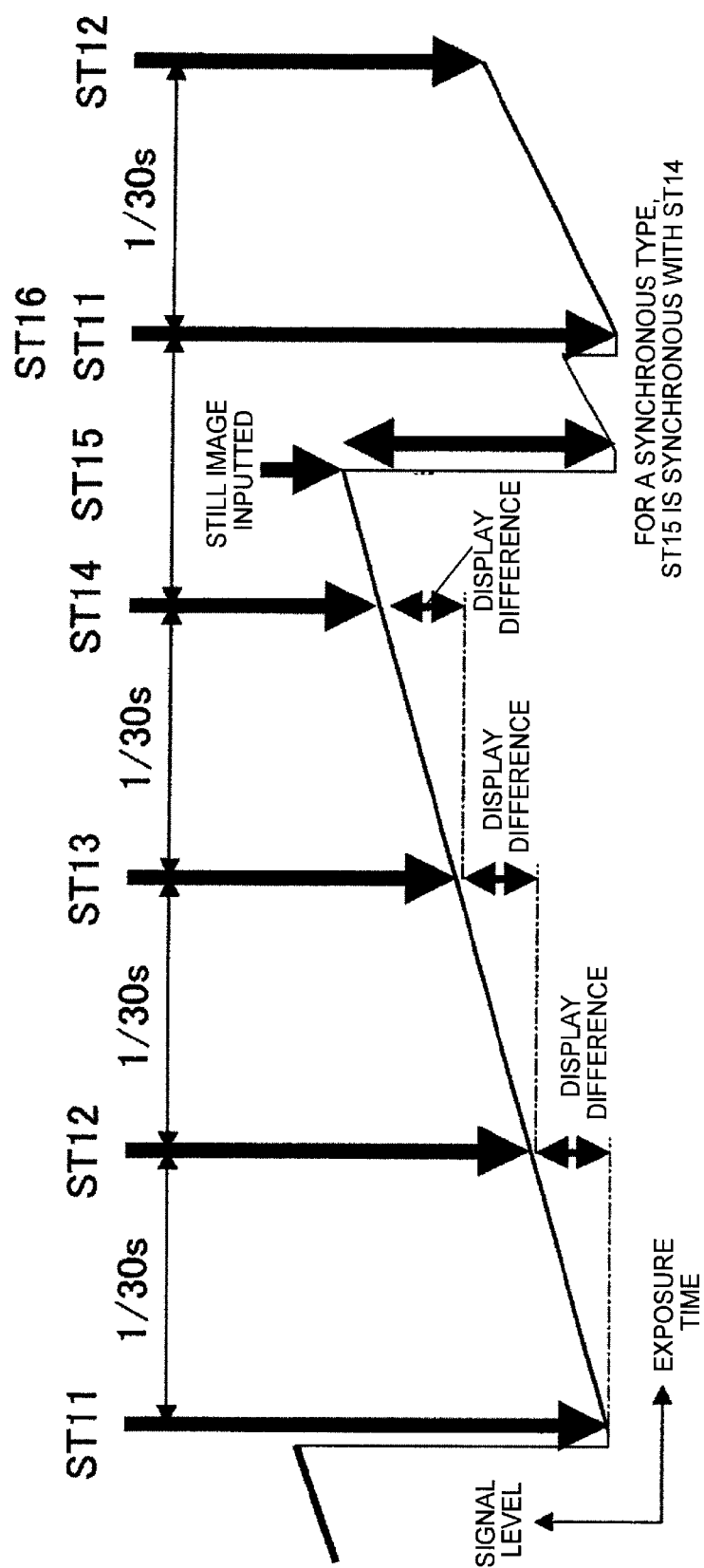
FIG. 42 is a diagram showing an example of a low-speed live view sequence using a nondestructive read.

FIG. 41 is a diagram showing an example of a wide dynamic range (Wide D-Range) sequence according to a nondestructive read.

In FIG. 41, the vertical axis shows the signal level and the horizontal axis shows the exposure time.

Step ST1

Resetting and a black scan are carried out. Here, a threshold Vth fluctuation image is captured.

Step ST2

At time t11, a first intermediate scan (SCAN#1) is carried out. Here, a high luminance image is captured and the Vth difference is obtained.

Step ST3

At time t12, a second intermediate scan (SCAN#2) is carried out. Here, a medium luminance image is captured and the Vth difference is obtained.

Step ST4

At time t13, a final scan (Final SCAN) is carried out and a reset is carried out. Here, a low luminance image is captured (CDS).

Although not shown, as step ST5, by combining the high luminance image, the medium luminance image, and the low luminance image, a wide dynamic range is achieved.

(Each image is multiplied by a time ratio and image combining is carried out for each level to produce a high DR image)

Figure 43:
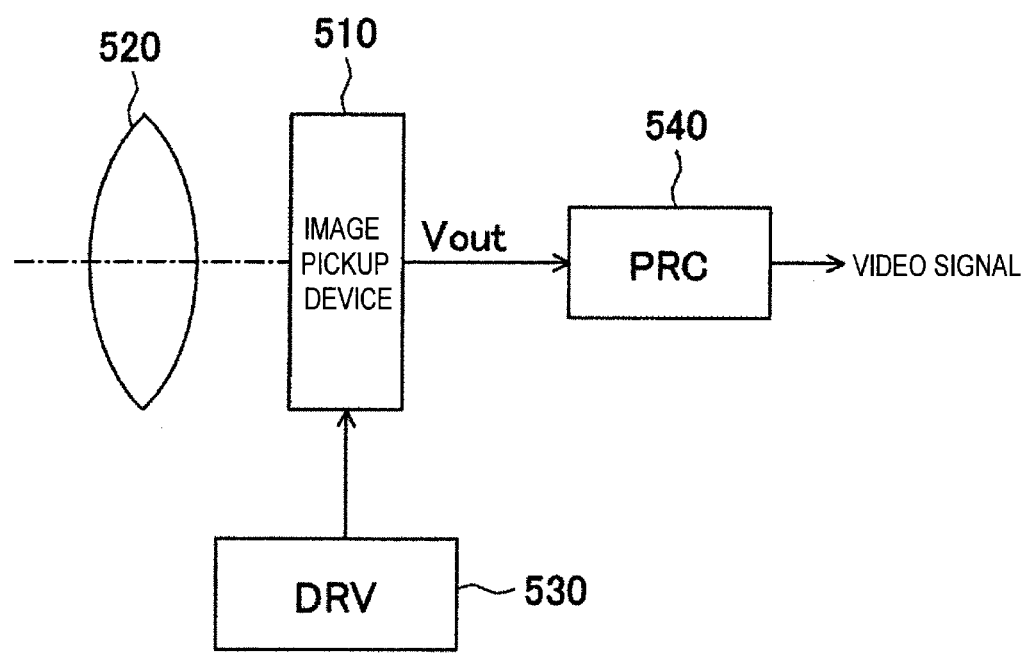
FIG. 43 is a diagram showing an example configuration of a camera system to which the solid-state image pickup apparatus according to the embodiment of the present invention is applied.

FIG. 43 is a diagram showing an example of a low speed live view sequence using a nondestructive read.

In FIG. 43, the vertical axis shows the signal level and the horizontal axis shows the exposure time.

Step ST11

Resetting and a black scan are carried out. Here, a threshold Vth fluctuation image is captured.

Step ST12

A first intermediate scan (SCAN#1) is carried out. Here, #1 image capture and #0Vth difference are obtained, and as one example are displayed for monitoring.

Step ST13

A second intermediate scan (SCAN#2) is carried out. Here, #2 image capture and #1Vth difference are obtained, and as one example are displayed for monitoring.

Step ST14

A final scan (Final SCAN) is carried out. Here, #n image capture and #nVth difference are obtained, and as one example are displayed for monitoring.

Step ST15

A capture scan is carried out and then a reset is carried out. Here, the final image capture CDS and recording in the memory are carried out.

Step ST16

For an asynchronous case, step ST15 (still image) is subjected to 1/30s conversion and displayed.

In this way, by carrying out a nondestructive read, as examples it is possible to realize a wide dynamic range (Wide D-Range) with a high S/N, and live view or the like during low speed exposure or bulb exposure.

As described above, according to the present embodiment, the substrate 100 has a first substrate surface 101 side on which light is incident and a second substrate surface 102 side on which elements are formed, with a plurality of pixel cells Cel (2A) that are separated from adjacent cells by an element separation layer also being formed.

Each pixel cell Cel includes a first conductivity type (in the present embodiment, n type) well (first well) 110 formed on the first substrate surface 101 side and a second conductivity type (p type) well (first well) 110 formed on the first substrate surface 102 side of the first well 110.

The n type first well 110 functions as a light receiving unit that receives light from the first substrate surface 101 side and has a photoelectric conversion function and a charge accumulating function for the received light.

In the second well 120, a MOS type transistor 130 that detects the accumulated charge in the light receiving unit of the first well 110 and has a threshold modulation function is formed.

Since a p type element separation layer (conductive layer) 140 that is the second conductivity type that is the opposite conductivity type to the first conductivity type (in the present embodiment, n type) is formed on the side walls of the first well 110 (and the second well 120 so as to surround the wells, the following effects are obtained.

A pixel can be configured by one transistor with a drain (D)/gate (G)/source (S) construction, and due to the favorable compatibility with a logic process, the increase in the number of manufacturing steps is minimized.

Since it is possible to share the drain, source, gate and well contacts, the layout efficiency is high, which makes pixel miniaturization possible.

Since the gate area is large, transistor noise is extremely low.

Also, since the entire pixel becomes the accumulation region, the saturation signal level is high and a high dynamic range (DR) can be realized.

Also, since the dark current that is generated from the interfaces is discharged to the drain, dark current image defects do not occur at interfaces.

In addition, nondestructive reads with no dark current deterioration are possible regardless of whether the gate is ON/OFF.

Also, the entire light receiving unit forms the gate and by installing a reflector, it is possible to realize high sensitivity for near infrared and extremely small pixels.

Also, it is possible to achieve low noise by an inverse γ correction function.

When single pixels are driven, since driving for a signal read is carried out using shared lines where power and reset lines are disposed in the X (horizontal) direction, there is the risk of an IR drop occurring due to the wiring resistance when the number of pixels is increased, resulting in insufficient driving performance.

On the other hand, the solid-state image pickup apparatus 1 according to the present embodiment supplies power when driving for a signal read via a pixel transistor that is adjacent in the Y (vertical) direction. Also, since the present solid-state image pickup apparatus supplies a drive pulse for a reset using a drain wire connected in the horizontal direction, the occurrence of an IR drop is suppressed and it is possible to maintain a sufficient driving performance without the driving performance becoming insufficient.

As described above, according to the present embodiment, by supplying power source power from the same direction as the direction in which a signal is read, it is possible to prevent a drop in IR from having an effect, which is suited to increasing the number of pixels.

By using the light blocking electrode 130 of a pixel cell that is adjacent in the Y (vertical) direction as a power switching transistor, it becomes unnecessary to separately provide a switching transistor, which removes one obstacle to pixel miniaturization.

By sharing horizontal reset wires, it is possible to absorb on voltage fluctuation between pixels.

The solid-state image pickup apparatus with the above characteristics can be applied to an image pickup device of a digital camera or a video camera.

FIG. 43 is a diagram showing one example configuration of a camera system to which a solid-state image pickup element according to an embodiment of the present disclosure has been applied.

5. Camera

As shown in FIG. 43, the present camera system 500 includes an image pickup device 510 to which the solid-state image pickup apparatus 1 according to the present embodiment can be applied.

The solid-state image pickup apparatus 1 includes an optical system that guides incident light to the pixel region of the image pickup device 510 (i.e., that focuses an image of the subject), for example, a lens 520 that focuses the incident light (image light) on an image pickup surface.

The solid-state image pickup apparatus 1 includes a driving circuit (DRV) 530 that drives the image pickup device 510 and a signal processing circuit (PRC) 540 that processes the output signal of the image pickup device 510.

The driving circuit 530 includes a timing generator (not shown) that generates various types of timing signal including a start pulse and a clock pulse that drive circuits inside the image pickup device 510 and drives the image pickup device 510 using specified timing signals.

Also, the signal processing circuit 540 carries out signal processing such as CDS (Correlated Double Sampling) on output signals of the image pickup device 510.

The image signal processed by the signal processing circuit 540 is recorded on a recording medium such as a memory, for example. The image information recorded on the recording medium is hard copied by a printer or the like. Also, the image signal processed by the signal processing circuit 540 is displayed as video on a monitor composed of a liquid crystal display or the like.

As described above, in an image pickup apparatus such as a digital still camera, by using the solid-state image pickup apparatus 1 described earlier as the image pickup device 510, it is possible to realize a high-precision camera.

The present invention is not limited to the description of the embodiment given above.

For example, the numerical values and materials in the present embodiment are mere examples and the present disclosure is not limited to such.

In addition, a variety of changes are possible without departing from the scope of the invention.

REFERENCE SIGNS LIST 1 solid-state image pickup apparatus
2 pixel unit
2A, Cel11 to Cel64 pixel cells
3 row direction (Y direction) control circuit
4 column direction (X direction) control circuit
5 timing control circuit
100 substrate
101 first substrate surface
102 second substrate surface
110 first conductivity-type well (first well)
120 second conductivity-type well (second well)
130 transistor
131 gate electrode
132 source electrode
133 drain electrode
140, 140A second conductivity-type element separation layer
150 $p^+$ layer
152 color filter
153 microlens
160 insulating film
170 well (substrate) contact electrode
180 gamma pocket
190 gamma contact electrode
200 reflector
DCNT drain contact
SCNT source contact
GCNT gate contact
WCNT well (substrate) contact
400, 410 column circuit
401, 411 comparator
402, 412 switch
C401, C411 capacitor
I401, I411 constant current load circuit

The invention claimed is:

1. A solid-state image pickup apparatus comprising:
a pixel unit which is formed on a substrate having a first substrate surface side on which light is incident and a second substrate surface side on which elements are formed and in which a plurality of pixel cells, which are separated by an element separation layer from adjacent pixel groups that have one pixel cell or a plurality of pixel cells as units, are disposed in a matrix;
a plurality of first driving lines disposed corresponding to row arrays of the pixel cells;
a second driving line that is shared between pixel cells on two adjacent rows;
a signal line disposed corresponding to a column array of the pixel cells and divided into a first signal line and a second signal line;
a signal read processing system processing a read signal of the pixel cells that have been read on the signal line; and
a switching unit connecting the first signal line and the second signal line to a power source or the signal read processing system,
wherein the pixel cells receive light from the first substrate surface side, include a photoelectric conversion function for the received light and a charge accumulation function, and have a transistor that detects accumulated charge by way of the charge accumulation function and has a threshold modulation function formed therein,
the transistor includes a function as a read transistor, a function as a reset transistor, and a function as a select transistor, and has a source, a drain, and a gate electrode formed on a channel forming region between the source and the drain,
the drain or the source is shared between two pixel cells that are adjacent in the row direction of the pixel cells,
the source or the drain of one of the pixel cells is connected to the first signal line, and the source or the drain of another of the pixel cells is connected to the second signal line,
the gate electrodes of the transistors of the pixel cells are connected to the corresponding first driving lines, and
the shared drain or source of two pixel cells that are adjacent in the row direction is connected to a corresponding second driving line.

2. The solid-state image pickup apparatus according to claim 1,
wherein the switching unit is operable when the one of the pixel cells connected to the first signal line out of two pixel cells adjacent in the row direction is a read pixel cell, to connect the first signal line to the signal read processing unit and to connect the second signal line to a power source side,
an overdrive voltage is applied to a gate electrode of the transistor of the other of the adjacent pixel cells to turn on a drain-source connection, and
a read voltage is applied to a gate electrode of the transistor of the one of the pixel cells and a read process for a signal voltage of the one of the pixel cells is carried out.

3. The solid-state image pickup apparatus according to claim 2,
further comprising a driver applying a reset signal to the second driving line after a read of the signal voltage,
wherein a voltage for turning off is applied to gate electrodes of the transistors of the two pixel cells that are adjacent in the row direction during a reset period by the driver.

4. The solid-state image pickup apparatus according to claim 1,
wherein the switching unit is operable when the other of the pixel cells connected to the second signal line out of two pixel cells adjacent in the row direction is a read pixel cell, to connect the second signal line to the signal read processing unit and to connect the first signal line to a power source side,
an overdrive voltage is applied to a gate electrode of the transistor of the one of the adjacent pixel cells to turn on a drain-source connection, and
a read voltage is applied to a gate electrode of the transistor of the other of the pixel cells and a read process for a signal voltage of the other of the pixel cells is carried out.

5. The solid-state image pickup apparatus according to claim 1,
wherein when the one of the pixel cells connected to the first signal line or the other of the pixel cells connected to the second signal line out of two pixel cells that are adjacent in the row direction is set as a read pixel cell, the switching unit connects the first signal line or the second signal line to the signal read processing unit and connects the second signal line or the first signal line to a power source side, for the transistor of the other or the one adjacent pixel cell, an overdrive voltage is applied to a gate electrode to turn on a drain-source connection, a read voltage is applied to the gate electrode of the transistor of the one or the other of the pixel cells, and a first read process for a signal voltage of the one of the pixel cells or the other of the pixel cells is carried out, and wherein when the other of the pixel cells connected to the second signal line or the one of the pixel cells connected to the first signal line out of two pixel cells that are adjacent in the row direction is set as a read pixel cell, the switching unit connects the second signal line or the first signal line to the signal read processing unit and connects the first signal line or the second signal line to the power source side, for the transistor of the one or the other adjacent pixel cell, an overdrive voltage is applied to the gate electrode to turn on a drain-source connection, a read voltage is applied to the gate electrode of the transistor of the other or the one of the pixel cells, and a second read process for a signal voltage of the other of the pixel cells or the one of the pixel cells is carried out.

6. The solid-state image pickup apparatus according to claim 1,
wherein the signal read processing system includes:
a plurality of first column circuits disposed corresponding to column arrays in the pixel cell array and processing signals read out to the first signal lines; and
a plurality of second column circuits disposed corresponding to column arrays in the pixel cell array and processing signals read out to the second signal line, and
the switching unit includes:
a plurality of first switches connecting the first signal line to the power source or a corresponding first column circuit; and
a plurality of second switches connecting the second signal line to a corresponding first column circuit or the power source.

7. The solid-state image pickup apparatus according to claim 1,
wherein the pixel cells include a first conductivity-type well formed on the first substrate surface side and a second conductivity-type well formed on the second substrate surface side,
the first conductivity-type well receives light from the first substrate surface side and has a photoelectric conversion function for the received light and a charge accumulation function, and
a transistor detecting accumulated charge in the first conductivity-type well and including a threshold modulation function is formed in the second conductivity-type well.

8. The solid-state image pickup apparatus according to claim 7,
wherein accumulated charge and signal charge are the same carriers.

9. The solid-state image pickup apparatus according to claim 7,
wherein a second conductivity-type separation layer is formed on a side portion of at least the first conductivity-type well out of the first conductivity-type well and the second conductivity-type well.

10. The solid-state image pickup apparatus according to claim 9,
wherein a first conductivity-type source region and a first conductivity-type drain region are formed on the second conductivity-type well or the second conductivity-type separation layer, and
the gate electrode is formed on a channel forming region in the second conductivity-type well above an area between the source region and the drain on the second substrate surface side of the substrate.

11. The solid-state image pickup apparatus according to claim 7,
further comprising a reflector reflecting light that has passed through the substrate at the gate electrode of the transistor on the second substrate surface side or at a position closer to a front surface than the gate electrode to make the light incident on the second conductivity-type well of the substrate and the first conductivity-type well.

12. The solid-state image pickup apparatus according to claim 1,
wherein the pixel cells include a gamma characteristic whereby a degree of modulation increases when incident light is low.

13. The solid-state image pickup apparatus according to claim 12,
wherein the pixel cells are constructed so that a capacitance thereof increases when a signal level is high, and include a function for producing a high dynamic range according to a gamma characteristic.

14. The solid-state image pickup apparatus according to claim 1,
wherein a reset operation is carried out after injecting charge into a pixel from the drain immediately before a pixel reset.

15. The solid-state image pickup apparatus according to claim 14,
wherein the signal read processing system includes a comparator and uses a reset level of a previous line as a reference level of the comparator.

16. The solid-state image pickup apparatus according to claim 14,
wherein the signal read processing system includes a function that carries out analog sampling during a D phase read and digital sampling during a P phase read.

17. The solid-state image pickup apparatus according to claim 1,
further comprising an inverse γ correction circuit carrying out inverse gamma correction using a transistor with a back gate terminal of a same construction as the transistors of the pixel cells.

18. The solid-state image pickup apparatus according to claim 1,
wherein the signal read processing system includes a function carrying out a nondestructive read where photoelectric conversion continues without a pixel reset during a signal read from a pixel.

19. A camera comprising:
a solid-state image pickup apparatus receiving light from a first substrate surface side of a substrate;
an optical system guiding incident light onto the first substrate surface side of the solid-state image pickup apparatus; and
a signal processing circuit processing an output signal of the solid-state image pickup apparatus, wherein the solid-state image pickup apparatus includes:

a pixel unit which is formed on the substrate having the first substrate surface side on which light is incident and a second substrate surface side on which elements are formed and in which a plurality of pixel cells, which are separated by an element separation layer from adjacent pixel groups that have one pixel cell or a plurality of pixel cells as units, are disposed in a matrix;

a plurality of first driving lines disposed corresponding to row arrays of the pixel cells;

a second driving line that is shared between pixel cells on two adjacent rows;

a signal line disposed corresponding to a column array of the pixel cells and divided into a first signal line and a second signal line;

a signal read processing system processing a read signal of the pixel cells that have been read on the signal line; and a switching unit connecting the first signal line and the second signal line to a power source or the signal read processing system, wherein the pixel cells receive light from the first substrate surface side, include a photoelectric conversion function for the received light and a charge accumulation function, and have a transistor that detects accumulated charge by way of the charge accumulation function and has a threshold modulation function formed therein, the transistor includes a function as a read transistor, a function as a reset transistor, and a function as a select transistor, and has a source, a drain, and a gate electrode formed on a channel forming region between the source and the drain, the drain or the source is shared between two pixel cells that are adjacent in the row direction of the pixel cells, the source or the drain of one of the pixel cells is connected to the first signal line, and the source or the drain of another of the pixel cells is connected to the second signal line, the gate electrodes of the transistors of the pixel cells connected to the corresponding first driving lines, and the shared drain or source of two pixel cells that are adjacent in the row direction is connected to a corresponding second driving line.

* * * * *